(12) United States Patent  
Arneson et al.

(10) Patent No.: US 7,102,524 B2
(45) Date of Patent: Sep. 5, 2006

(54) DIE FRAME APPARATUS AND METHOD OF TRANSFERRING DIES THEREWITH

(75) Inventors: Michael R. Arneson, Westminister, MD (US); William R. Bandy, Gambrills, MD (US)

(73) Assignee: Symbol Technologies, Inc., Holtsville, NY (US)

(*) Notice: Subject to any disclaimer, the term of this patent is extended or adjusted under 35 U.S.C. 154(b) by 240 days.

(21) Appl. No.: 10/322,701

(22) Filed: Dec. 19, 2002

(65) Prior Publication Data

US 2004/0020037 A1 Feb. 5, 2004

Related U.S. Application Data

(60) Provisional application No. 60/400,101, filed on Aug. 2, 2002.

(51) Int. Cl.
*G08B 13/14* (2006.01)

(52) U.S. Cl. .................. 340/572.8; 340/572.1; 257/447; 257/787; 29/458; 29/825

(58) Field of Classification Search .............. 340/572.1, 340/572.7, 572.8, 825.54; 257/668, 678, 257/777, 774, 228, 292, 447, 730, 787; 438/460, 438/462, 464; 29/428, 458, 564.6, 709, 743, 29/825, 832
See application file for complete search history.

(56) References Cited

U.S. PATENT DOCUMENTS

| | | | |
|---|---|---|---|
| 4,346,514 A | 8/1982 | Makizawa et al. | |
| 4,925,808 A * | 5/1990 | Richardson | 438/196 |
| 5,618,759 A | 4/1997 | Boysel | 438/464 |
| 5,725,728 A | 3/1998 | Fuke et al. | 156/584 |
| 5,904,546 A * | 5/1999 | Wood et al. | 438/460 |
| 6,169,319 B1 * | 1/2001 | Malinovich et al. | 257/447 |
| 6,189,591 B1 | 2/2001 | Ariye et al. | 156/584 |
| 6,215,194 B1 * | 4/2001 | Nakabayashi | 257/782 |
| 6,303,468 B1 | 10/2001 | Gidon et al. | 438/455 |
| 6,322,903 B1 * | 11/2001 | Siniaguine et al. | 428/617 |
| 6,534,386 B1 | 3/2003 | Irie | 438/464 |
| 6,606,247 B1 * | 8/2003 | Credelle et al. | 361/737 |
| 6,608,370 B1 * | 8/2003 | Chen et al. | 257/678 |
| 6,731,353 B1 | 5/2004 | Credelle et al. | 349/45 |
| 2001/0016400 A1 | 8/2001 | Lee | |
| 2003/0136503 A1 | 7/2003 | Green et al. | |
| 2004/0020040 A1 | 2/2004 | Arneson et al. | |
| 2004/0250949 A1 | 12/2004 | Arneson et al. | |

OTHER PUBLICATIONS

Copy of International Search Report for Application No. PCT/US03/23792, mailed Jan. 12, 2004 (4 pages).

* cited by examiner

*Primary Examiner*—Van T. Trieu
(74) *Attorney, Agent, or Firm*—Sterne, Kessler, Goldstein & Fox P.L.L.C.

(57) ABSTRACT

A method, system, and apparatus for a die frame, and for transferring integrated circuit dies therewith, is described. A ring shaped groove is formed in a first surface of a wafer around a plurality of dies. The wafer is scribed to form a grid of grooves in the first surface of the wafer that separates the plurality of dies. A solidifiable material is applied to the first surface of the wafer to substantially fill the ring shaped groove and the grooves of the grid. The solidifiable material is caused to harden into a ring shaped hardened material in the ring shaped groove and into a grid shaped hardened material in the grooves of the grid. The wafer is thinned so that the grid shaped hardened material removably holds the plurality of dies.

43 Claims, 56 Drawing Sheets

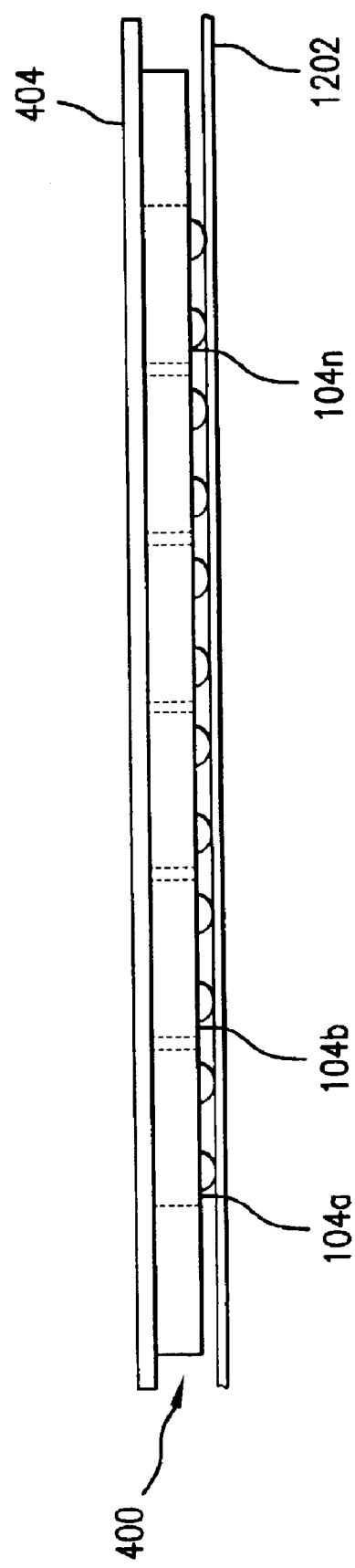

5720

5722
A WAFER ATTACHED TO AN ADHESIVE SURFACE IS SCRIBED SUCH THAT A RESULTING PLURALITY OF DIES ARE SEPARATED BY A GRID OF GROOVES THAT EXTEND THROUGH THE WAFER TO THE ADHESIVE SURFACE

5724
A SOLIDIFIABLE MATERIAL IS APPLIED TO THE SCRIBED WAFER TO SUBSTANTIALLY FILL THE GROOVES OF THE GRID

5726
THE SOLIDIFIABLE MATERIAL IS CAUSED TO HARDEN INTO A GRID SHAPED HARDENED MATERIAL IN THE GROOVES OF THE GRID

5728
THE ADHESIVE SURFACE IS REMOVED SO THAT THE GRID SHAPED HARDENED MATERIAL REMOVABLY HOLDS THE PLURALITY OF DIES

FIG.57B

DIE FRAME APPARATUS AND METHOD OF TRANSFERRING DIES THEREWITH

CROSS-REFERENCE TO RELATED APPLICATIONS

This application claims the benefit of U.S. Provisional Application No. 60/400,101, filed Aug. 2, 2002, which is herein incorporated by reference in its entirety.

The following applications of common assignee are related to the present application, have the same filing date as the present application, and are herein incorporated by reference in their entireties:

"Method and Apparatus for High Volume Assembly of Radio Frequency Identification Tags," Ser. No. 10/322,467;

"Multi-Barrel Die Transfer Apparatus and Method for Transferring Dies Therewith," Ser. No. 10/322,718; and "System and Method of Transferring Dies Using an Adhesive Surface," Ser. No. 10/322,702.

BACKGROUND OF THE INVENTION

1. Field of the Invention

The present invention relates generally to the assembly of electronic devices. More particularly, the present invention relates to the assembly of radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement.

One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is a method and apparatus for high volume assembly of electronic devices, such as RFID tags, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

In a first aspect, a plurality of RFID tags is assembled according to the present invention. A plurality of dies are separated from a scribed wafer and attached to a transfer or support surface (commonly referred to as a "green tape" in the industry). The dies are transferred from the support surface to corresponding tag substrates either directly or via one or more intermediate surfaces.

In a first aspect, dies are transferred between surfaces using an adhesive surface mechanism and process.

In another aspect, dies are transferred between surfaces using a punching mechanism and process.

In another aspect, dies are transferred between surfaces using a multi-barrel die collet mechanism and process.

In another aspect, a die frame is formed. Furthermore, dies are transferred using the die frame.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrates.

In another aspect of the present invention, a system and apparatus enables the assembly of RFID tags. A die transfer module is present to transfer a plurality of dies from the support surface to the tag substrates in either a pads up or down manner In another aspect of the present invention, an alternative system and apparatus enables the assembly of RFID tags. A wafer preparation module is present to transfer the dies from the support surface to a transfer surface. A die transfer module transfers the dies from the transfer surface to the tag substrates in either a pads up or down manner.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 12A and 12B are plan and side views, respectively, of a plurality of dies in contact with a support surface and a transfer surface.

FIGS. 57A and 57B show flowcharts providing steps for making a die frame, according to example embodiments of the present invention.

Figure 1A:
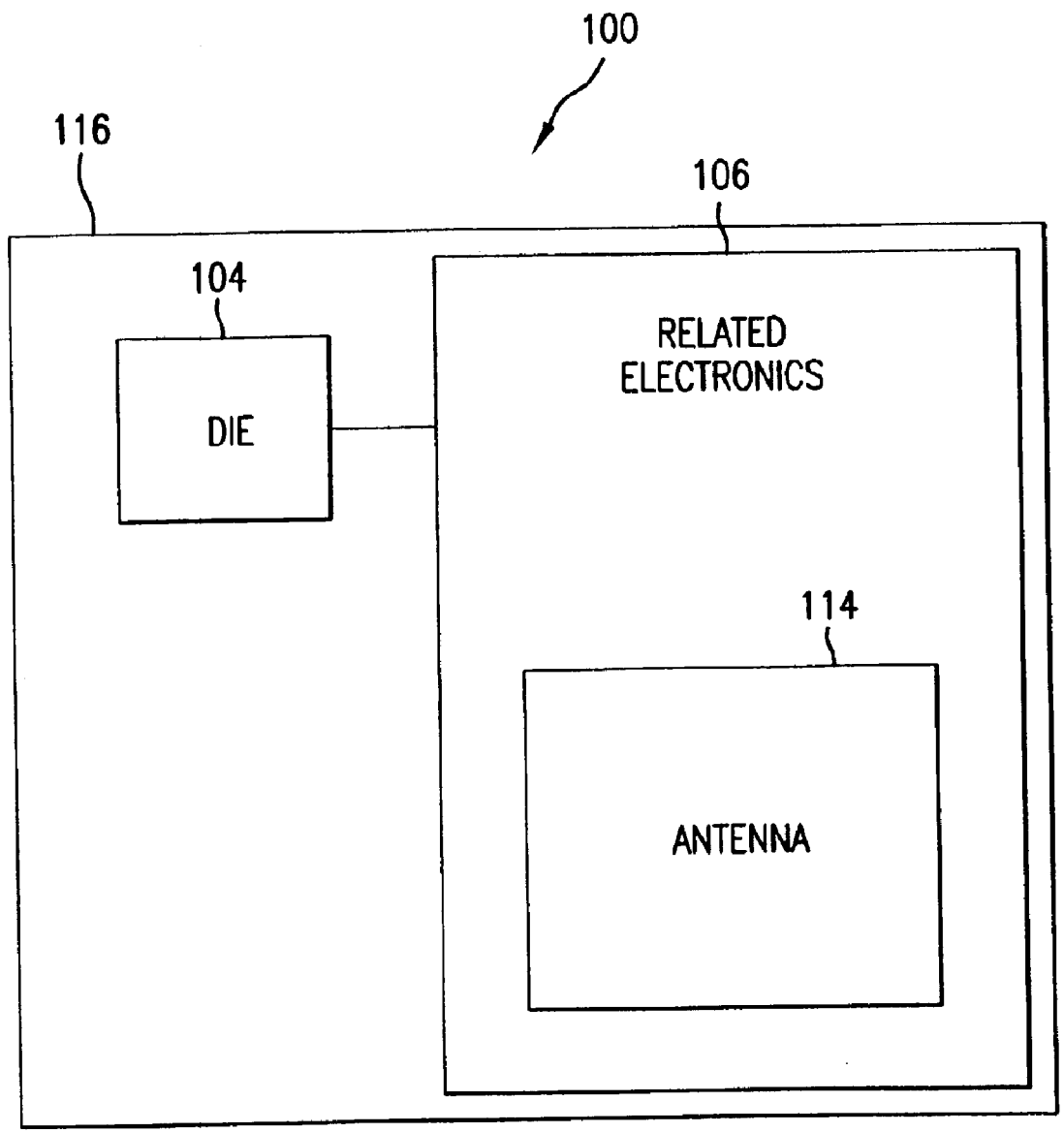
FIG. 1A shows a block diagram of an exemplary RFID tag, according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The present invention provides improved processes and systems for assembling electronic devices, including RFID tags. The present invention provides improvements over current processes. Conventional techniques include vision-based systems that pick and place dies one at a time onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies.

The present invention provides an advantage of simplicity. Conventional die transfer tape mechanisms may be used by the present invention. Furthermore, much higher fabrication rates are possible. Current techniques process 5–8 thousand units per hour. The present invention can provide improvements in these rates by a factor of N. For example, embodiments of the present invention can process dies 5 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in the section below. Assembly embodiments for RFID tags are described in the next section. Further processing processes are then described, followed by a description of tag assembly systems.

1.0 RFID Tag

The present invention is directed to techniques for producing electronic devices, such as RFID tags. For illustrative purposes, the description herein primarily relates to the production of RFID tags. However, the description is also adaptable to the production of further electronic device types, as would be understood by persons skilled in the relevant art(s) from the teachings herein.

Figure 1B:
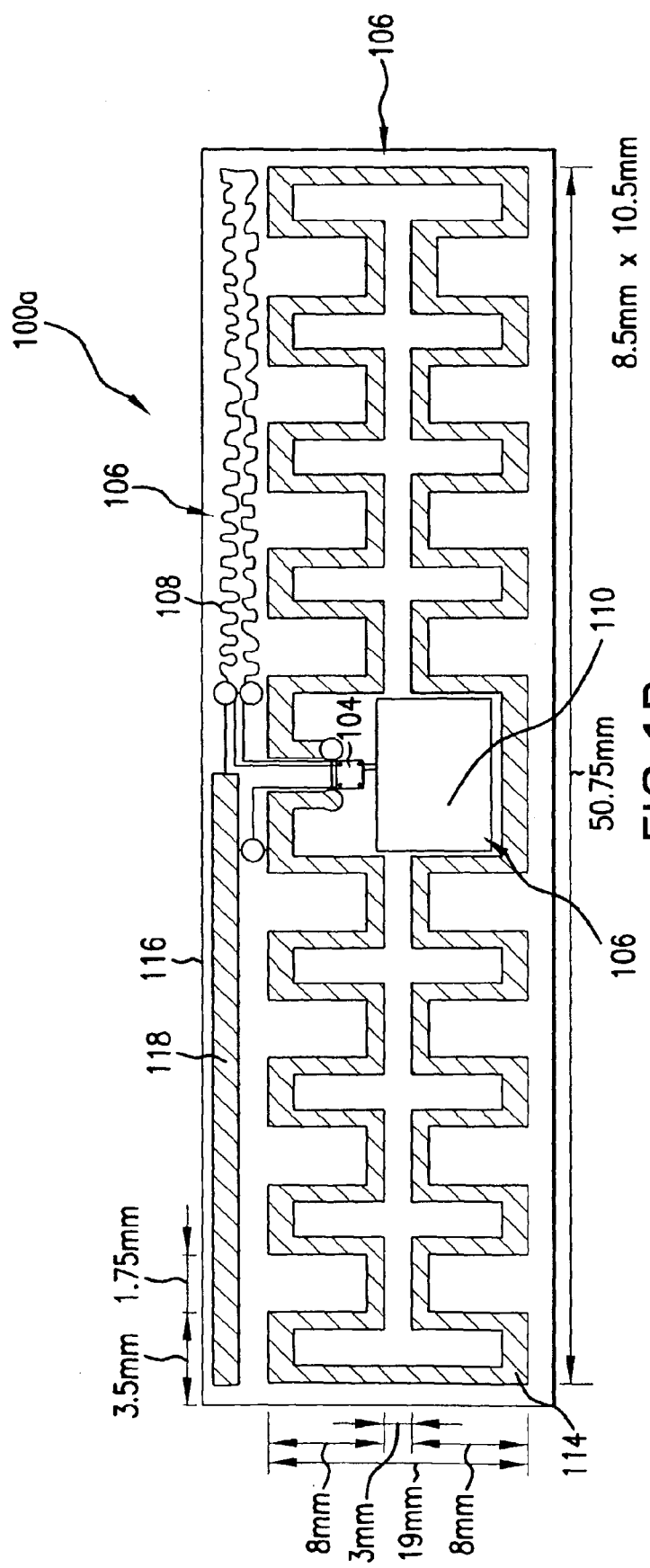
FIGS. 1B and 1C show detailed views of exemplary RFID tags, according to embodiments of the present invention.
Figure 1C:
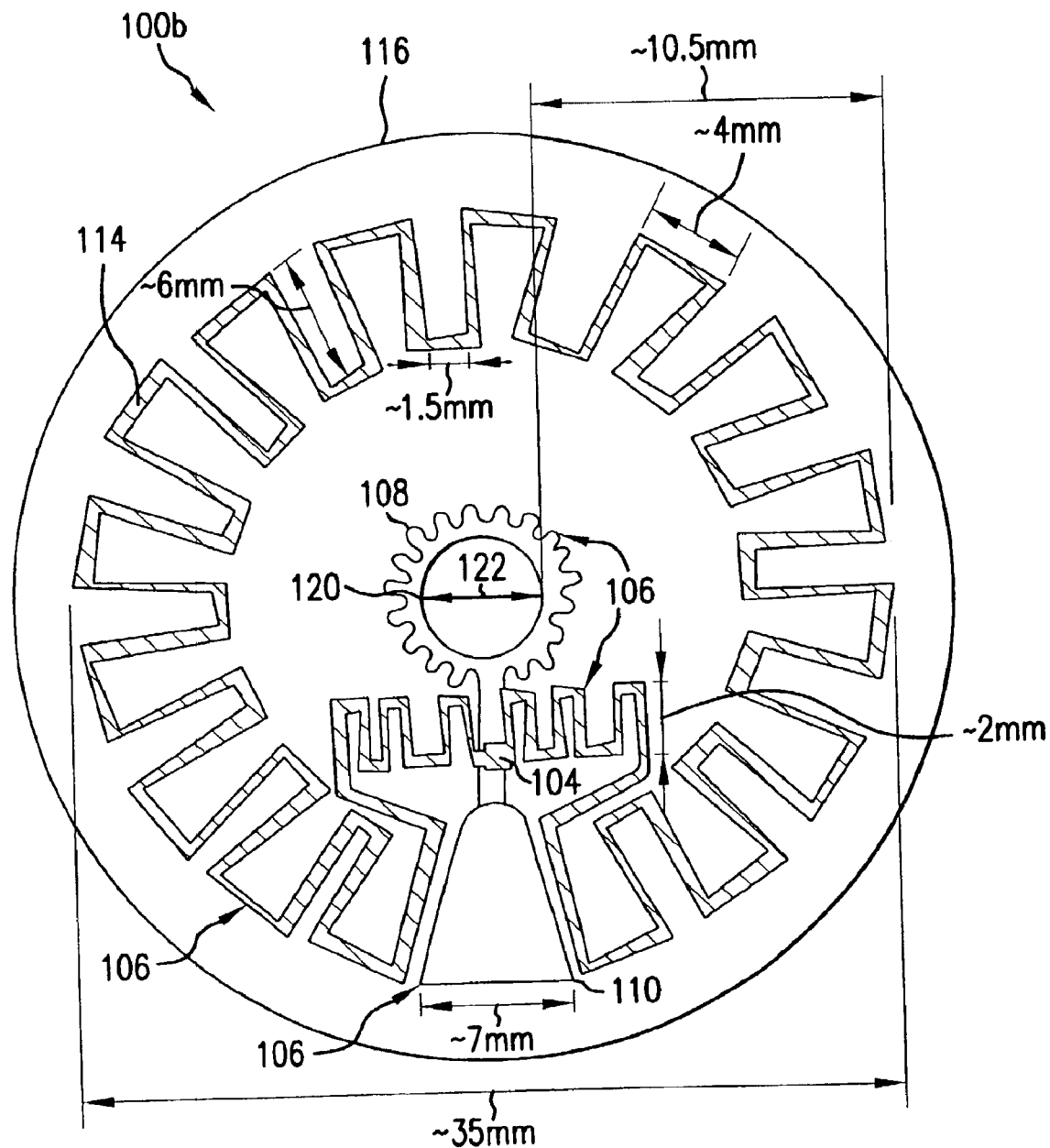

FIG. 1A shows a block diagram of an exemplary RFID tag 100, according to an embodiment of the present invention. As shown in FIG. 1A, RFID tag 100 includes a die 104 and related electronics 106 located on a tag substrate 116. Related electronics 106 includes an antenna 114 in the present example. FIGS. 1B and 1C show detailed views of exemplary RFID tags 100, indicated as RFID tags 100a and 100b. As shown in FIGS. 1B and 1C, die 104 can be mounted onto antenna 114 of related electronics 106. As is further described elsewhere herein, die 104 may be mounted in either a pads up or pads down orientation.

RFID tag 100 may be located in an area having a large number or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video disks (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIGS. 1A–1C, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation or "cell" (not shown in FIGS. 1A–1C) that accommodates die 104. An example of such an implementation is included in a "pads up" orientation of die 104, as is further described elsewhere herein.

Figure 2B:
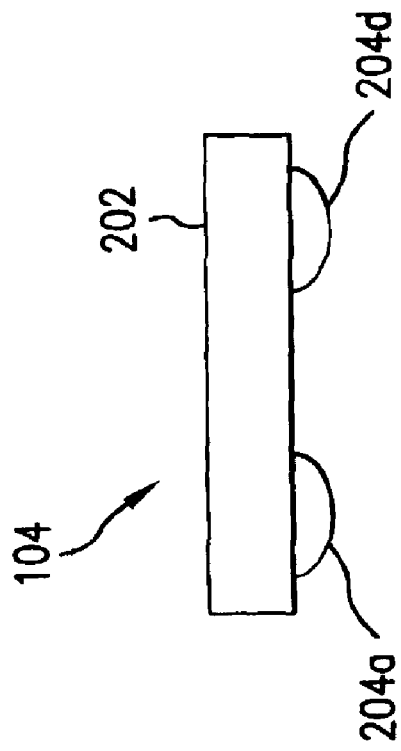
FIGS. 2A and 2B show plan and side views of an exemplary die, respectively.
Figure 2A:
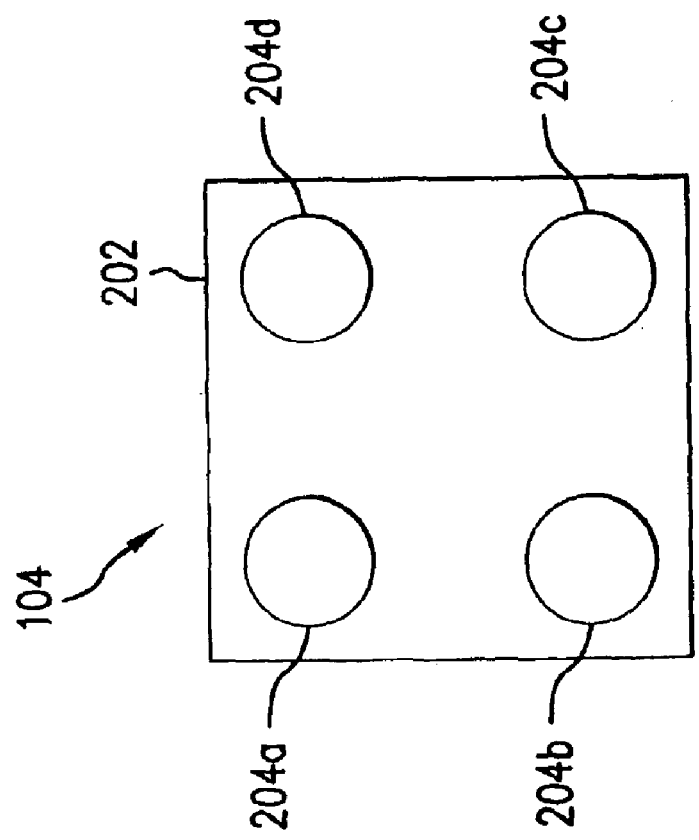

FIGS. 2A and 2B show plan and side views of an example die 104. Die 104 includes four contact pads 204a–d that provide electrical connections between related electronics 106 and internal circuitry of die 104. Note that although four contact pads 204a–d are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant arts.

Figure 2C:
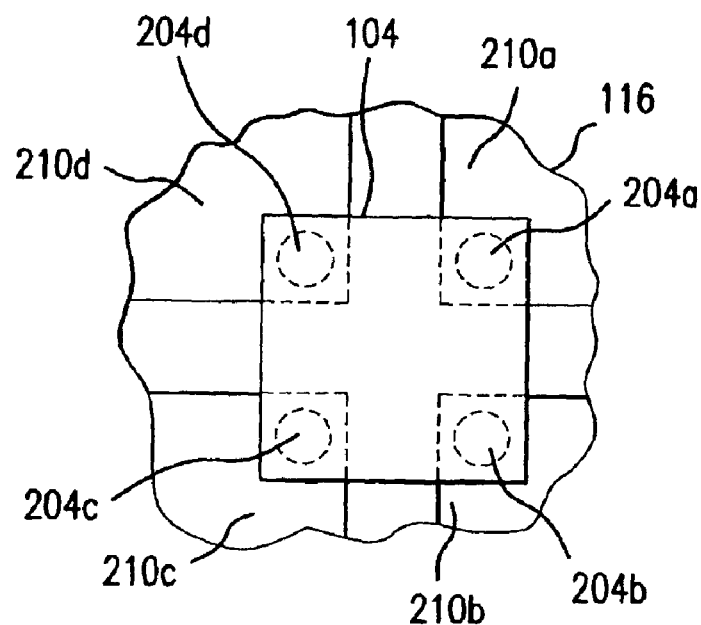
FIGS. 2C and 2D show portions of a substrate with a die attached thereto, according to example embodiments of the present invention.
Figure 2D:
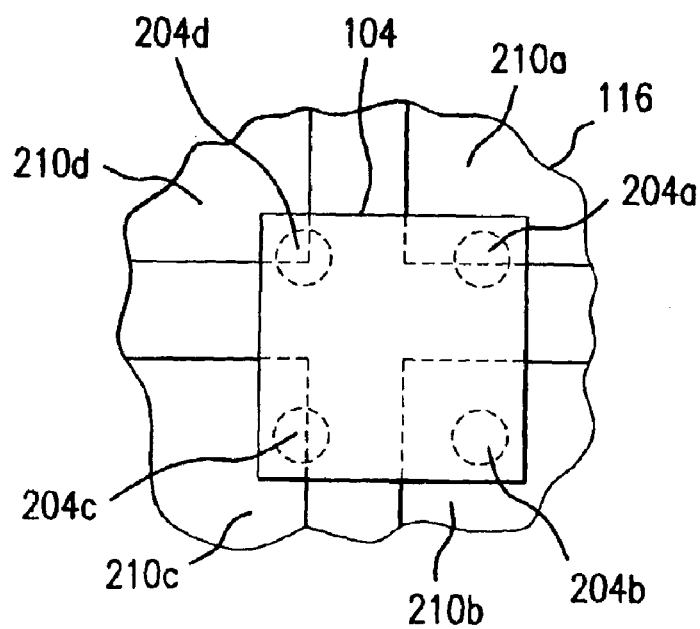

FIG. 2C shows a portion of a substrate 116 with die 104 attached thereto, according to an example embodiment of the present invention. As shown in FIG. 2C, contact pads 204a–d of die 104 are coupled to respective contact areas 210a–d of substrate 116. Contact areas 210a–d provide electrical connections to related electronics 106. The arrangement of contact pads 204a–d in a rectangular shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204a–d and contact areas 210a–d. For example, FIG. 2D shows an imperfect placement of IC die 104 on substrate 116. However, even though IC die 104 has been improperly placed, acceptable electrical coupling is achieved between contact pads 204a–d and contact areas 210a–d.

Note that although FIGS. 2A–2D show the layout of four contact pads 204a–d collectively forming a rectangular shape, greater or lesser numbers of contact pads 204 may be used. Furthermore, contact pads 204a–d may be laid out in other shapes in embodiments of the present invention.

2.0 RFID Tag Assembly

The present invention is directed to continuous-roll assembly techniques and other techniques for assembling tags, such as RFID tag 100. Such techniques involve a continuous web (or roll) of the material of the tag antenna substrate 116 that is capable of being separated into a plurality of tags. As described herein, the manufactured one or more tags can then be post processed for individual use. For illustrative purposes, the techniques described herein are made with reference to assembly of RFID tag 100. However, these techniques can be applied to other tag implementations and other suitable devices, as would be apparent to persons skilled in the relevant art(s) from the teachings herein.

The present invention advantageously eliminates the restriction of assembling electronic devices, such as RFID tags, one at a time, allowing multiple electronic devices to be assembled in parallel. The present invention provides a continuous-roll technique that is scalable and provides much higher throughput assembly rates than conventional pick and place techniques.

Figure 3:
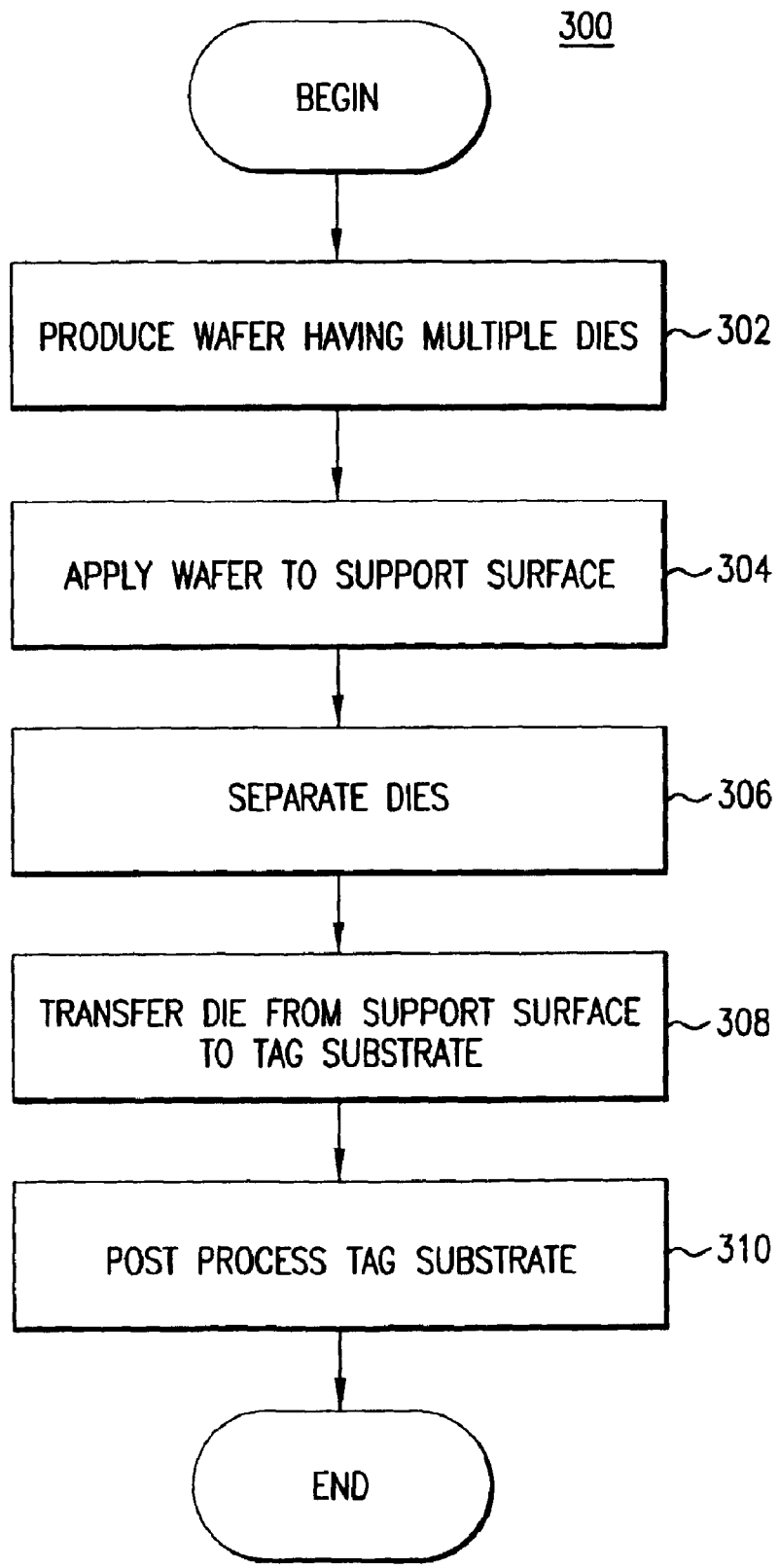
FIG. 3 is a flowchart illustrating a continuous-roll tag assembly operation.
Figure 4A:
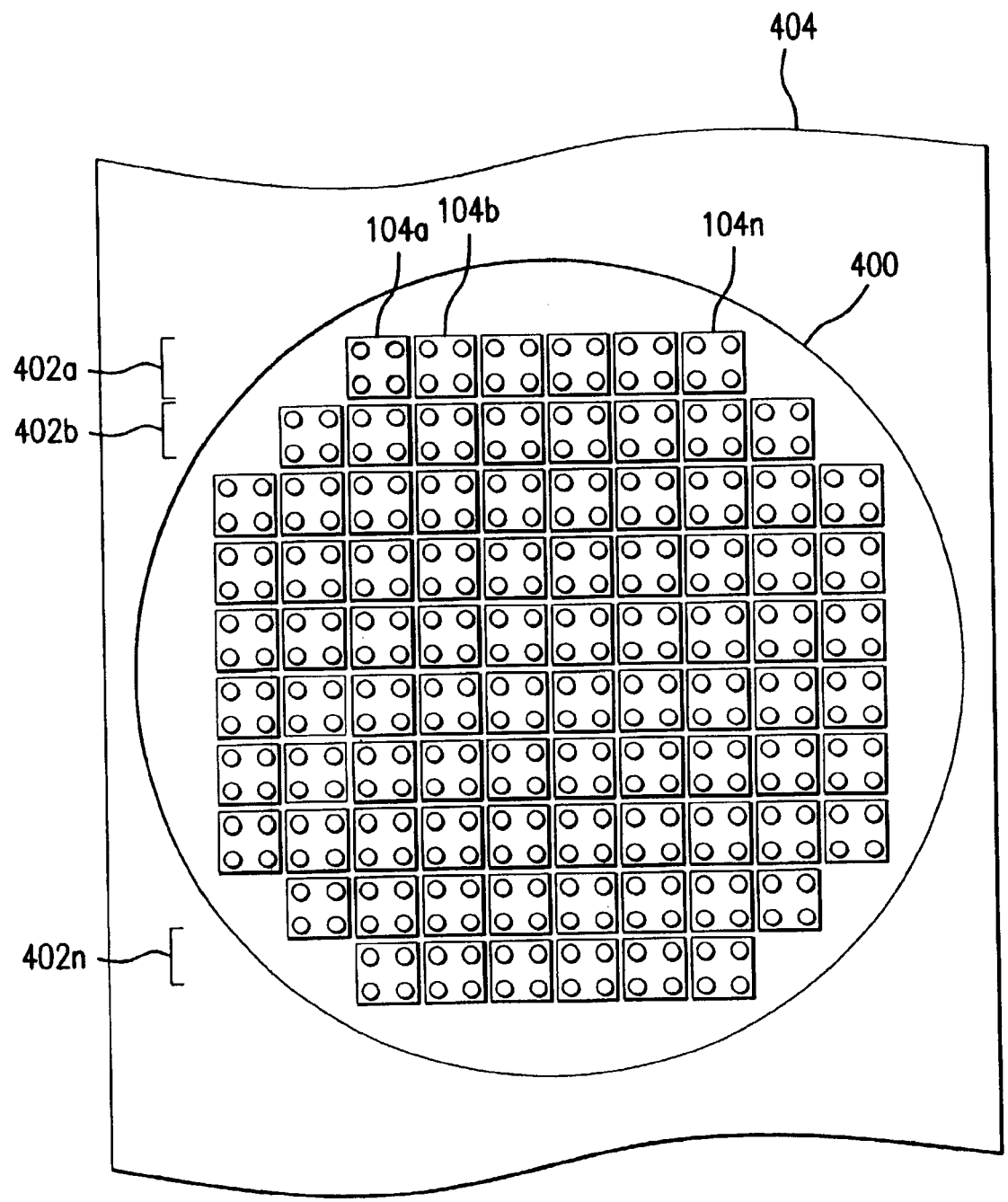
FIGS. 4A and 4B are plan and side views of a wafer having multiple dies affixed to a support surface, respectively.

FIG. 3 shows a flowchart 300 with example steps relating to continuous-roll production of RFID tags 100, according to example embodiments of the present invention. FIG. 3 shows a flowchart illustrating a process 300 for assembling tags 100. Process 300 begins with a step 302. In step 300, a wafer 400 having a plurality of dies 104 is produced. FIG. 4A illustrates a plan view of an exemplary wafer 400. As illustrated in FIG. 4A, a plurality of dies 104 are arranged in a plurality of rows 402a–n.

Figure 4B:
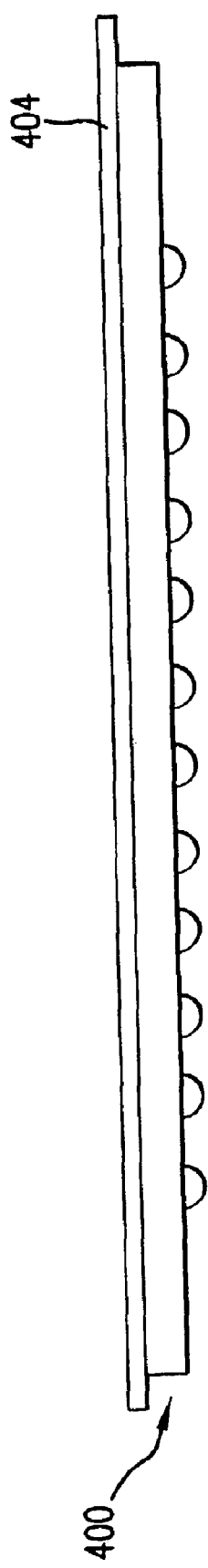

In a step 304, wafer 400 is applied to a support surface 404. Support surface 404 includes an adhesive material to provide adhesiveness. For example support surface 404 may be an adhesive tape that holds wafer 400 in place for subsequent processing. FIG. 4B shows an example view of wafer 400 in contact with an example support surface 404.

Figure 5:
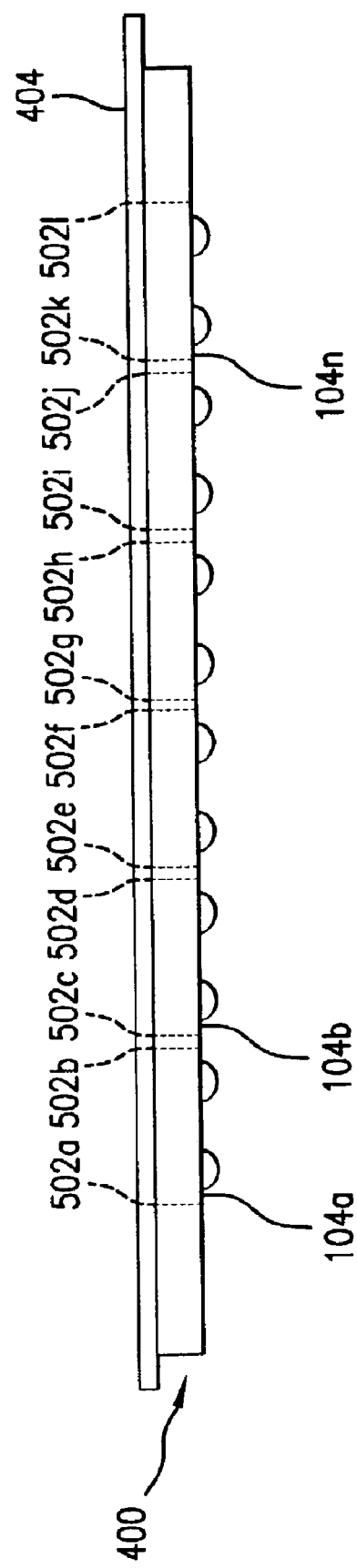
FIG. 5 is a view of a wafer having separated dies affixed to a support surface.

In a step 306, the plurality of dies 104 on wafer 400 are separated. For example, step 306 may include scribing wafer 400 according to a process, such as laser etching. FIG. 5 shows a view of wafer 400 having example separated dies 104 that are in contact with support surface 404. FIG. 5 shows a plurality of scribe lines 502a–l that indicate locations where dies 104 are separated.

In a step 308, the plurality of dies 104 are transferred from support surface 404 to tag substrate 116. In an embodiment, step 308 may allow for "pads down" transfer. Alternatively, step 308 may allow for "pads up" transfer. As used herein the terms "pads up" and "pads down" denote alternative implementations of tags 100. In particular, these terms designate the orientation of connection pads 204 in relation to tag substrate 116. In a "pads up" orientation for tag 100, die 104 is transferred to tag substrate 116 with pads 204a–204d facing away from tag substrate 116. In a "pads down" orientation for tag 100, die 104 is transferred to tag substrate 116 with pads 204a–204d facing towards, and in contact with tag substrate 116. An example of step 308 involving "pads up" transfer is described in greater detail herein with reference to FIG. 11. An example of step 308 involving "pads down" transfer is described in greater detail herein with reference to FIG. 16.

In a step 310, post processing is performed. During step 310, assembly of RFID tag(s) 100 is completed. Step 310 is described in further detail below with reference to FIG. 54.

2.1 Die Transfer Embodiments

Step 308 shown in FIG. 3, and discussed above, relates to transferring separated dies from a support surface to a tag substrate. The separated dies that are attached to the support surface (e.g., as shown in FIG. 5) can be transferred to the tag substrate by a variety of techniques. Conventionally, the transfer is accomplished using a pick and place tool. The pick and place tool uses a vacuum die collet controlled by a robotic mechanism that picks up the die from the support structure by a suction action, and holds the die securely in the die collet. The pick and place tool deposits the die into a die carrier or transfer surface. For example, a suitable transfer surface is a "punch tape" manufactured by Mulbauer, Germany. A disadvantage of the present pick and place approach is that only one die at a time may be transferred. Hence, the present pick and place approach does not scale well for very high throughput rates.

The present invention allows for the transfer of more than one die at a time from a support surface to a transfer surface. In fact, the present invention allows for the transfer of more than one die between any two surfaces, including transferring dies from a support surface to an intermediate surface, transferring dies between multiple intermediate surfaces, transferring dies between an intermediate surface and the final substrate surface, and transferring dies directly from a support surface to the final substrate surface.

Figure 6:
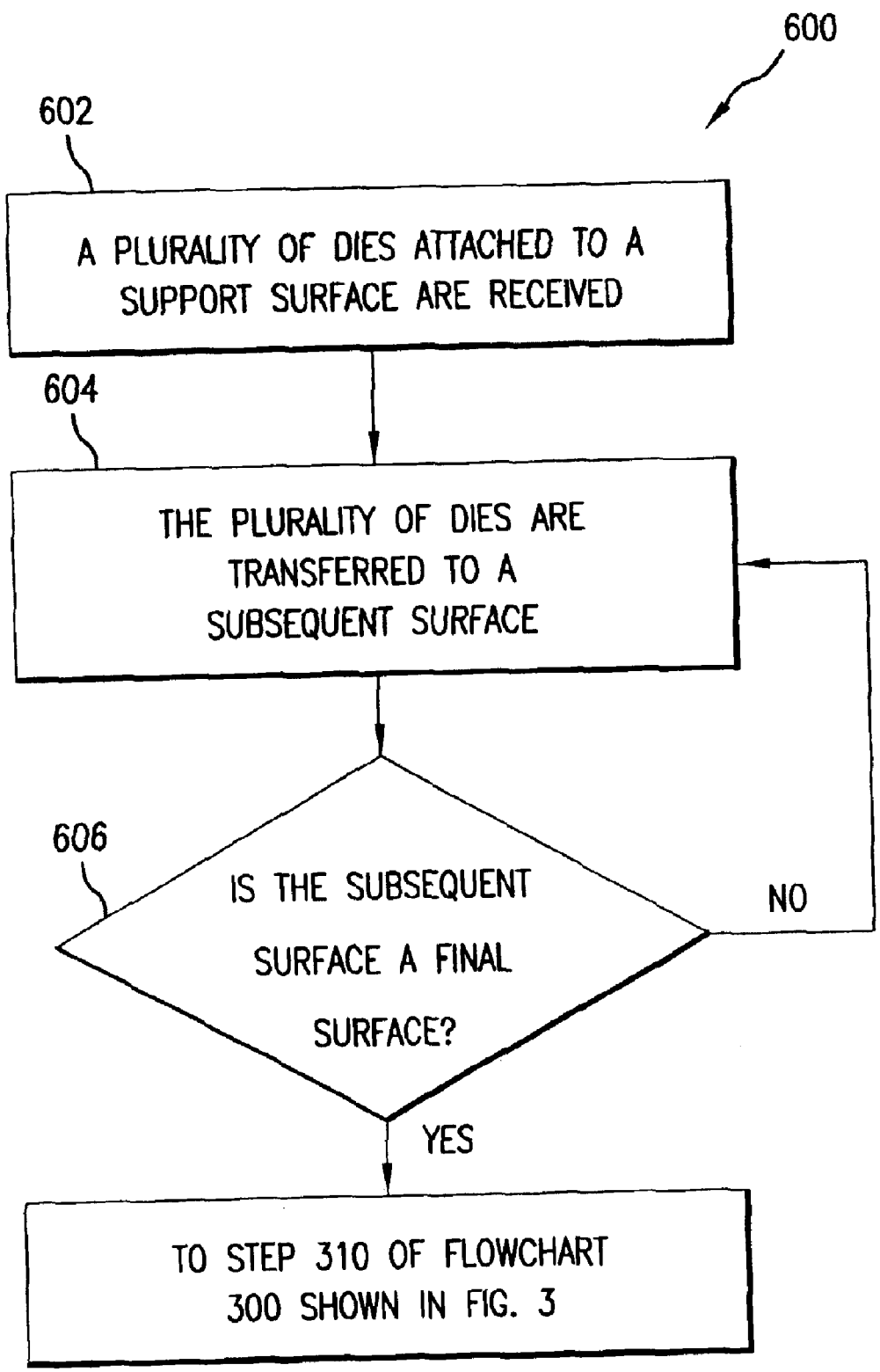
FIG. 6 shows a flowchart providing steps for transferring dies from a first surface to a second surface, according to embodiments of the present invention.

FIG. 6 shows a flowchart 600 providing steps for transferring dies from a first surface to a second surface, according to embodiments of the present invention. Structural embodiments of the present invention will be apparent to persons skilled in the relevant art(s) based on the following discussion. These steps are described in detail below.

Flowchart 600 begins with step 602. In step 602, a plurality of dies attached to a support surface are received. For example, the dies are dies 104, which are shown attached to a support surface 404 in FIG. 4A. The support surface can be a "green tape" as would be known to persons skilled in the relevant art(s).

In step 604, the plurality of dies are transferred to a subsequent surface. For example, dies 104 may be transferred according to embodiments of the present invention. For example, the dies may be transferred by an adhesive tape, a punch tape, a multi-barrel transport mechanism and/or process, or a die frame, such as are further described below, and may be transferred by other mechanisms and processes, or by combinations of the mechanisms/processes described herein. In embodiments, the subsequent surface can be an intermediate surface or an actual final substrate. For example, the intermediate surface can be a transfer surface, including a "blue tape" as would be known to persons skilled in the relevant art(s). When the subsequent surface is a substrate, the subsequent surface may be a substrate structure that includes a plurality of tag substrates, or may be another substrate type.

In step 606, it is determined whether the subsequent surface is a final surface. If the subsequent surface is a substrate to which the dies are going to be permanently attached, the process of flowchart 600 is complete. Thus, as shown in FIG. 6, the process proceeds to step 310 of flowchart 300, as shown in FIG. 3. If the subsequent surface is not a final surface, then the process proceeds to step 604, where the plurality of dies are then transferred to another subsequent surface. Steps 604 and 606 may be repeated as many times as is required by the particular application.

Any of the intermediate/transfer surfaces and final substrate surfaces may or may not have cells formed therein for dies to reside therein. Various processes described below may be used to transfer multiple dies simultaneously between first and second surfaces, according to embodiments of the present invention. In any of the processes described herein, dies may be transferred in either pads-up or pads-down orientations from one surface to another.

The die transfer processes described herein include transfer using an adhesive surface, a parallel die punch process, a multi-barrel die collect process, and a die frame. Elements of the die transfer processes described herein may be combined in any way, as would be understood by persons skilled in the relevant art(s). These die transfer processes, and related example structures for performing these processes, are further described in the following subsections.

2.1.1 Die Transfer Using an Adhesive Surface

According to an embodiment of the present invention, an adhesive substance coated onto a second surface may be pressed against separated die that reside on a first surface, causing the die to attach to the adhesively coated second surface. The second surface may be moved away from the first surface, to carry the attached die away from the first surface. The die can then be transferred to subsequent intermediate/transfer surfaces, or to a final surface, such as a substrate.

Figure 7:
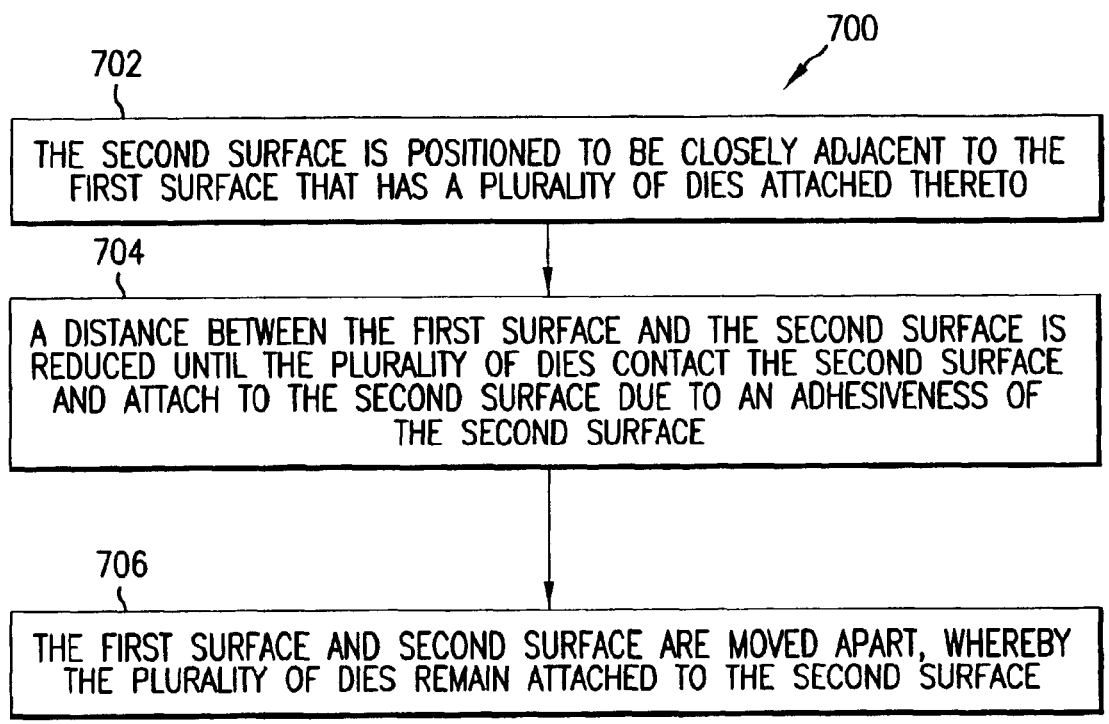
FIG. 7 shows a flowchart providing steps for transferring a plurality of dies from a first surface to a second surface using an adhesive surface.

FIG. 7 shows a flowchart 700 providing steps for transferring a plurality of dies from a first surface to a second surface using an adhesive surface. For illustrative purposes, flowchart 700 will be described in reference to FIGS. 8–10, although the process of flowchart 700 is not limited to the structures shown in FIGS. 8–10.

Figure 8:
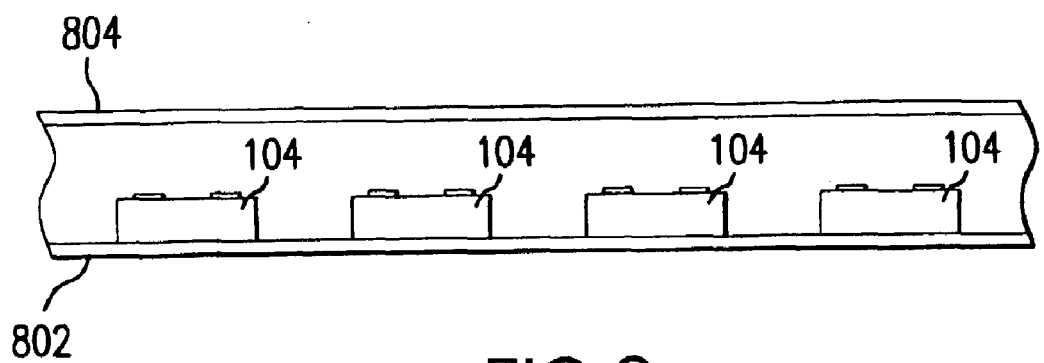
FIGS. 8–10 show views of a plurality of dies being transferred from a first surface to a second surface using an adhesive according to the process of FIG. 7.

Flowchart 700 begins with step 702. In step 702, the second surface is positioned to be closely adjacent to the first surface that has a plurality of dies attached thereto. For example, as shown in FIG. 8, a plurality of dies 104 are attached to a first surface 802. A second surface 804 is positioned closely to first surface 802. In embodiments, for example, surface 802 may be a scribed wafer or support surface, or may be an intermediate surface. Furthermore, second surface 804 may be an intermediate or transfer surface, or may be a substrate surface. An example support surface is shown in FIG. 4A, as support surface 404. Second surface 804 may be a green tape or a blue tape, as they are known in the industry, for example.

Figure 9:
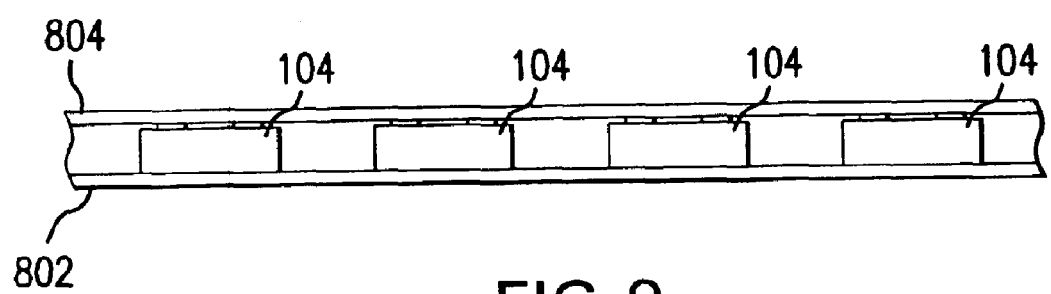

In step 704, a distance between the first surface and a second surface is reduced until the plurality of dies contact the second surface and attach to the second surface due to an adhesiveness of the second surface. An example of this is shown in FIG. 9. As shown in FIG. 9, second surface 802 is in contact with plurality of dies 104. Either or both of first and second surfaces 802 and 804 may be moved to cause the contact. Note that second surface 804 may have the adhesiveness because it is an adhesive tape, or may be a surface that has an adhesive material, such as an epoxy, glue, or wax applied thereto, to cause it to be adhesive.

Figure 10:
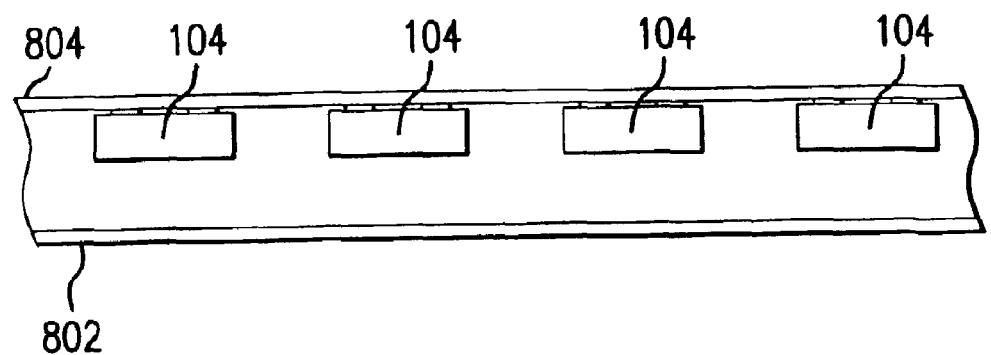

In step 706, the first surface and second surface are moved apart, whereby the plurality of dies remain attached to the second surface. For example, this is illustrated in FIG. 10. As shown in FIG. 10, first surface 802 and second surface 804 have been moved apart, and the plurality of dies 104 remain attached to second surface 804. The plurality of dies 104 are detached from first surface 802. The plurality of dies 104 remain attached to second surface 804 due to a greater adhesiveness of second surface 804 relative to first surface 802.

In an embodiment, flowchart 700 may include the additional step where an adhesive material is applied to the second surface so that the adhesiveness of the second surface is greater than that of the first surface.

Note that overlapping (including identical) means may be used to perform steps 704 and 706 to reduce the distance between the first and second surfaces, and to move the first and second surfaces apart, or different means may be used. For example, the means used for performing steps 704 and/or 706 may include the use of rollers, piston-type punching techniques, air jets, and/or any other suitable mechanisms described elsewhere herein or otherwise known.

Note that flowchart 700 is applicable to dies being oriented in a pads-up or pads-down orientation on either of first and second surfaces 802 and 804. For example, flowchart 700 may include the further step where the plurality of dies attached to the first surface are oriented so that at least one contact pad of each die of the plurality of dies is facing away from the first surface. Hence, when the first surface and second surface are moved apart, the plurality of dies will remain attached to the second surface in a pads-down manner. Alternatively, flowchart 700 can include the step where the plurality of dies attached to the first surface are oriented so that at least one contact pad of each die of the plurality of dies is facing towards the first surface. Hence, when the first surface and, second surface are moved apart, the plurality of dies remain attached to the second surface in a pads-up manner.

In embodiments, the process of flowchart 700 may be implemented on any portion of, or all of the separated die on the first surface. For example, this process may be accomplished in one or more iterations, using one or more strips of an adhesive coated second surface 804 that each adhere to and carry away a single column of die 104 from first surface 802. Alternatively, a sheet sized adhesive coated second surface 804 may be used to adhere to and carry away multiple columns/any size array of die 104 from first surface 802.

The following two subsections are presented herein to provide more detailed examples of die transfer using an adhesive surface, for illustrative purposes. However, the present invention is not limited to these examples.

2.1.1.1 Pads Up Transfer

As described herein with reference to FIG. 3, in step 308, dies 104 can be transferred from support surface 404 to tag substrate 116 in a "pads up" manner. When a die 104 is transferred to tag substrate 116 in this manner, it is oriented so that connecting pads 204a–d face away from tag substrate 116.

Figure 11:
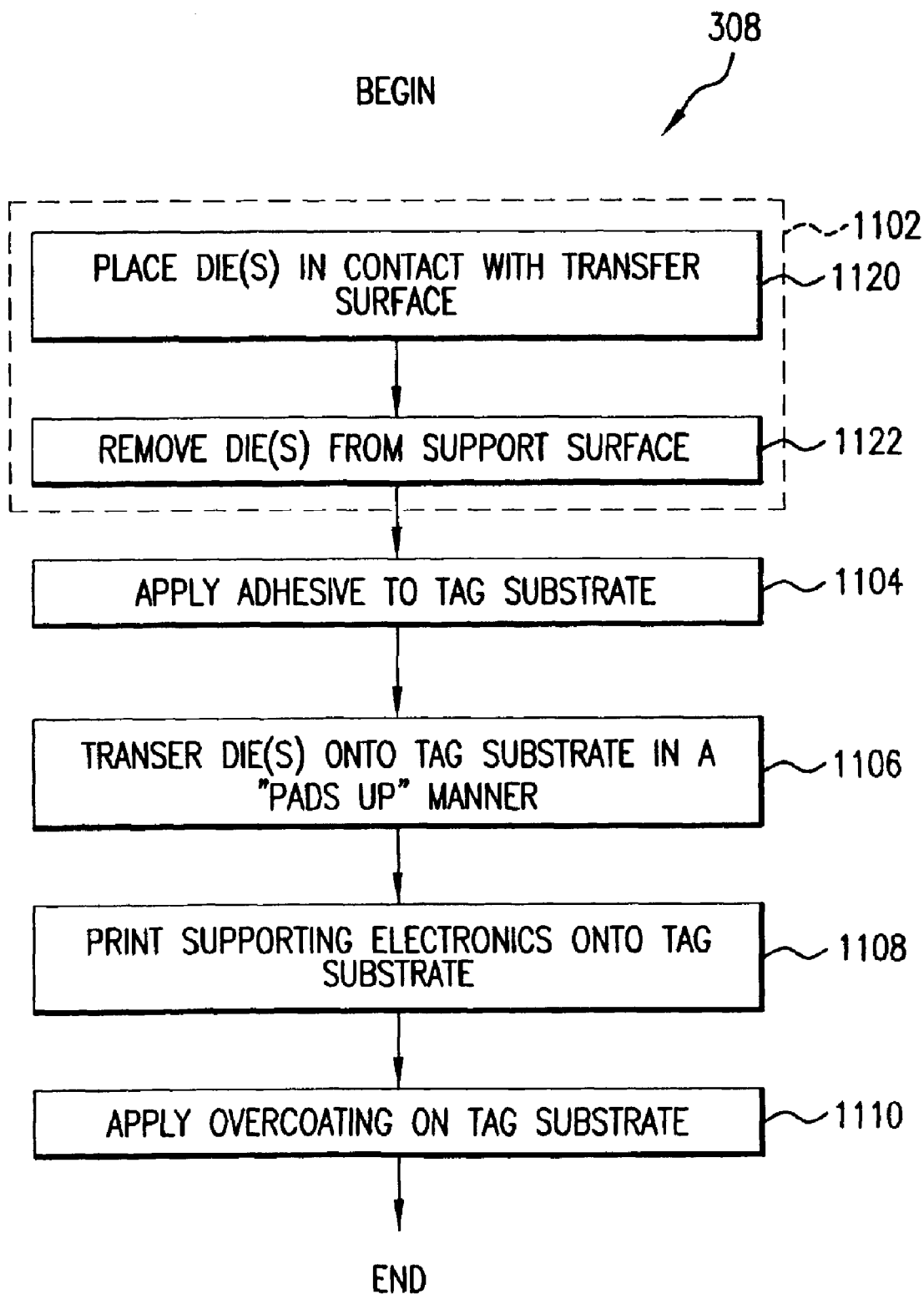
FIG. 11 is a flowchart illustrating a "pads up" die transfer onto a tag substrate.

FIG. 11 is a flowchart illustrating performance of step 308 in greater detail for "pads up" transfer. This performance begins with a step 1102. In step 1102, one or more dies 104 are oriented for "pads up" transfer from support surface 404 onto tag substrate 116. Step 1102 is described in greater detail with reference to FIGS. 12A, 12B, 13, 14, and 15, which provide exemplary views of dies 104, support surface 404, a transfer surface 1202, and tag substrate 116 during various stages of a "pads up" transfer operation.

Figure 12A:
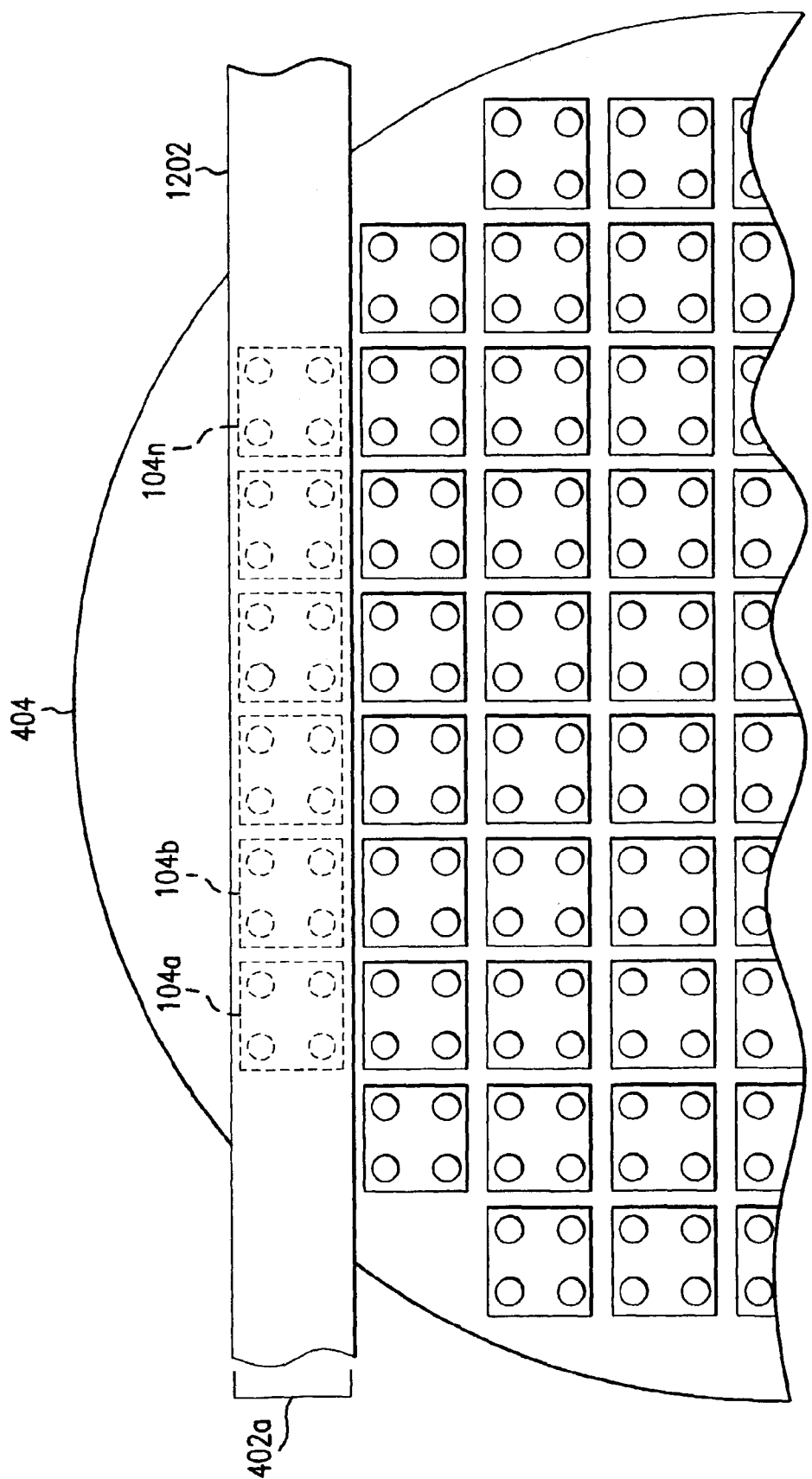

Step 1102 comprises transferring die(s) 104 onto a transfer surface. Thus, step 1102 includes steps 1120 and 1122. In step 1120, die(s) 104 are placed in contact with transfer surface 1202. A performance of this step is illustrated in FIGS. 12A and 12B, which provide views of a die 104 in contact with support surface 404 and transfer surface 1202. Transfer surface 1202 is an adhesive material, such as tape. Placing die(s) 104 in contact with transfer surface 1202 can include the step of reducing the physical separation between support surface 404 and transfer surface 1202 until die 104 contacts transfer surface 1202. This can be performed through the use of rollers, piston-type punching techniques, and/or air jets.

Step 1120 further includes the step of aligning transfer surface 1202 with one or more rows 402. For example, FIG. 12A shows transfer surface 1202 aligned with row 402a. In this example, transfer surface 1202 has a width 1204 that is selected to contact a single row 402 of dies 104. However, other widths 1202 can be employed that enable contact with multiple rows 402.

Figure 13:
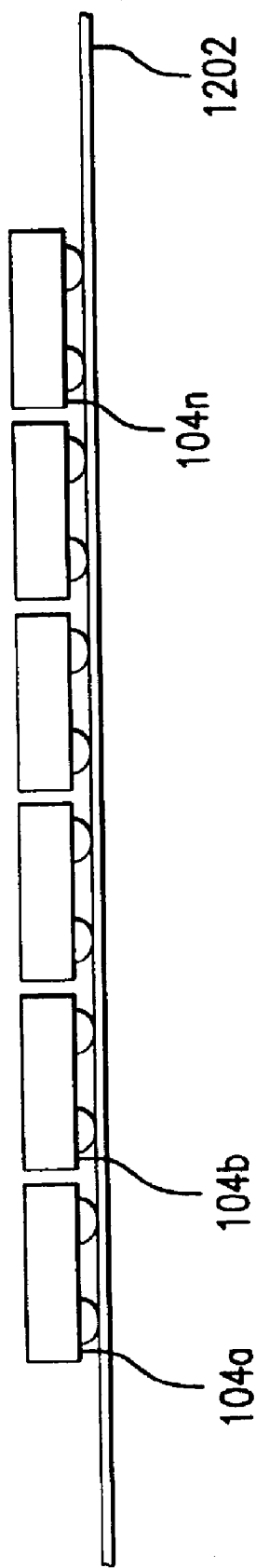
FIG. 13 is a view of a plurality of dies attached to a transfer surface.

In step 1122, die(s) 104 are removed from support surface 404, thereby resulting in the transfer of die(s) 104 from support surface 404 to transfer surface 1202. FIG. 13 is a view of a plurality of dies 104 transferred to transfer surface 1202. Removal of die(s) 104 from support surface 404 can include the steps of providing a stronger adhesive on transfer surface 1202 than on support surface 404, and increasing the physical separation between support surface 404 and transfer surface 1202. Alternatively, removal of dies 104 from support surface 404 can include the steps of providing a release adhesive on support surface 404 that loses its adhesive properties upon a release action, such as exposure to thermal energy, radiation, or ultraviolet light, and creating a release action at a time when removal is desired.

After performance of 1102, a step 1104 is performed. In step 1104, an adhesive is applied to tag substrate 116. This adhesive will provide a bond between die 104 and tag substrate 116.

A step 1106 follows step 1104. In step 1106, die(s) 104 are transferred onto tag substrate 116 in a "pads up" manner. Step 1106 includes the steps of placing die(s) 104 in contact with tag substrate 116 and removing die(s) 104 from transfer surface 1202. Snapshots from a performance of step 1106 are illustrated in FIGS. 14 and 15.

Figure 14:
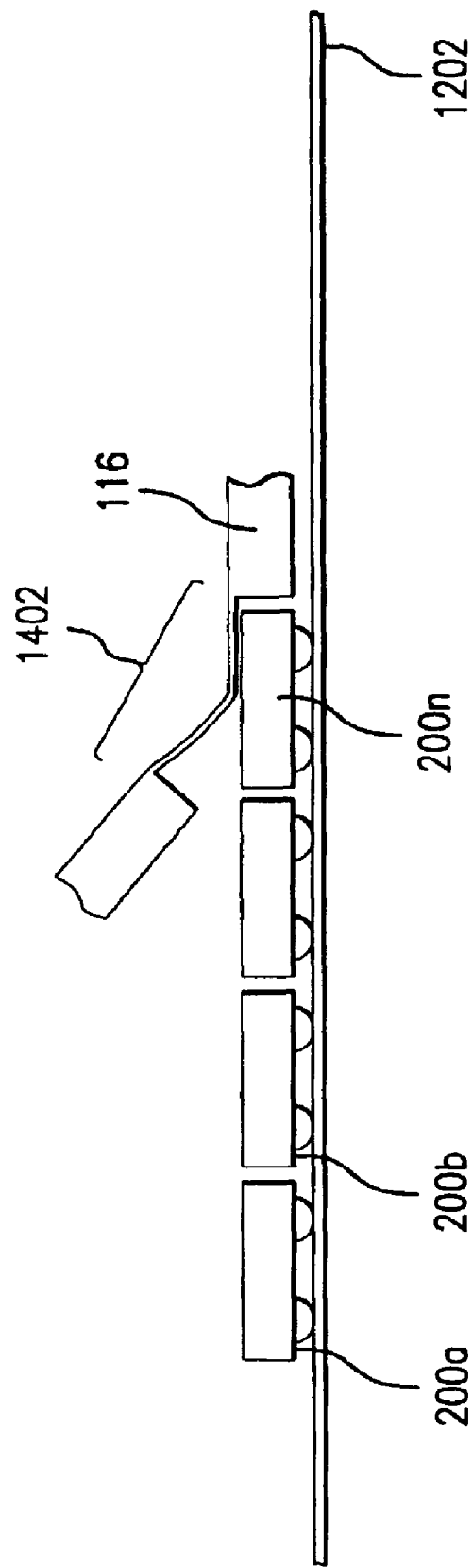
FIG. 14 is a view of a "pads up" oriented die in contact with a transfer surface and a tag substrate.

FIG. 14 shows a die 104n in contact with a transfer surface 1202 and tag substrate 116. Die 104n is in contact with a cell or indentation 1402 that is formed on tag substrate 116. Indentation 1402 enables connection pads 204 to be substantially even with surface(s) on tag substrate 116 that accommodate related electronics 106. Placing die(s) 104 in contact with tag substrate 116 includes the step of reducing the physical separation between transfer surface 1202 and tag substrate 116 until die 104 contacts tag substrate 116. This can be performed through the use of rollers, piston-type punching techniques, and/or air jets. In addition, placing die(s) 104 in contact with tag substrate 116 in a "pads up" orientation includes the step of aligning die(s) 104 with corresponding indentations 1402.

Removal of die(s) 104 from transfer surface 1202 can include the steps of providing a stronger adhesive on tag substrate 116 than on transfer surface 1202, and increasing the physical separation between transfer surface 1202 and tag substrate 104. Alternatively, removal of dies 104 from support surface 404 can include the steps of providing a release adhesive on transfer surface 1202 that loses it adhesive properties upon a release action, such as exposure to thermal energy, radiation, or ultraviolet light, and creating a release action at a time when removal is desired.

Figure 15:
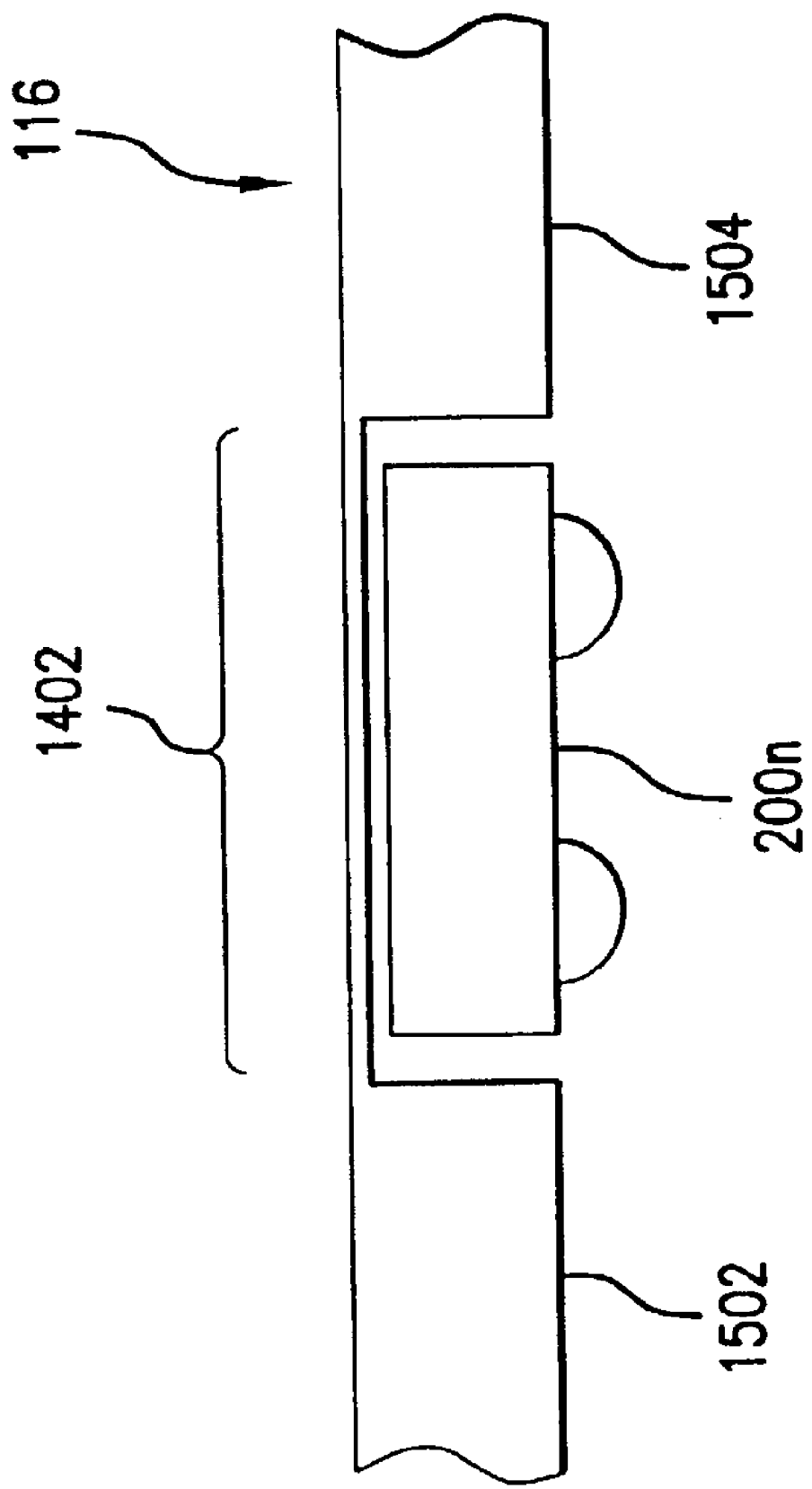
FIG. 15 is a view of a "pads up" oriented die attached to a tag substrate.

FIG. 15 shows a die 104n released from transfer surface 1202 and transferred to tag/substrate 116. As illustrated in FIG. 15, pads 204 are substantially even with surfaces 1502 and 1504 of tag substrate 116, thereby enabling electrical connections to be easily formed between pads 204 and related electronics 106 printed on these surfaces.

After step 1106, a step 1108 is performed. In step 1108, related electronics 106 are printed on tag substrate 116. Step 1106 can comprise the steps of printing related electronics 106 onto tag substrate 116 through a screen printing process, an ink jet process, and/or a thermal spray process. Alternatively, step 1106 can comprise the step of removing conductive material already disposed on tag substrate 116 through an oblation process.

After step 1108, a step 1110 is performed. In step 1110, an overcoating is applied on tag substrate 116. This overcoating protects elements of tag 100, such as die 104 and related electronics 106, from mechanical forces. In addition, this overcoating provides electrical insulation. Moreover, this overcoating can provide a compression force on tag substrate 116 to further ensure proper connections between related electronics 106 and die 104. Such a compression force can be provided through the use of heat shrinkable materials.

2.1.1.2 Pads Down Transfer

As described herein with reference to FIG. 3, in step 308, dies 104 can be transferred from support surface 404 to tag substrate 116 in a "pads down" manner. When a die 104 is transferred to tag substrate 116 in this manner, it is oriented so that connecting pads 204a–d face towards tag substrate 116.

Figure 16:
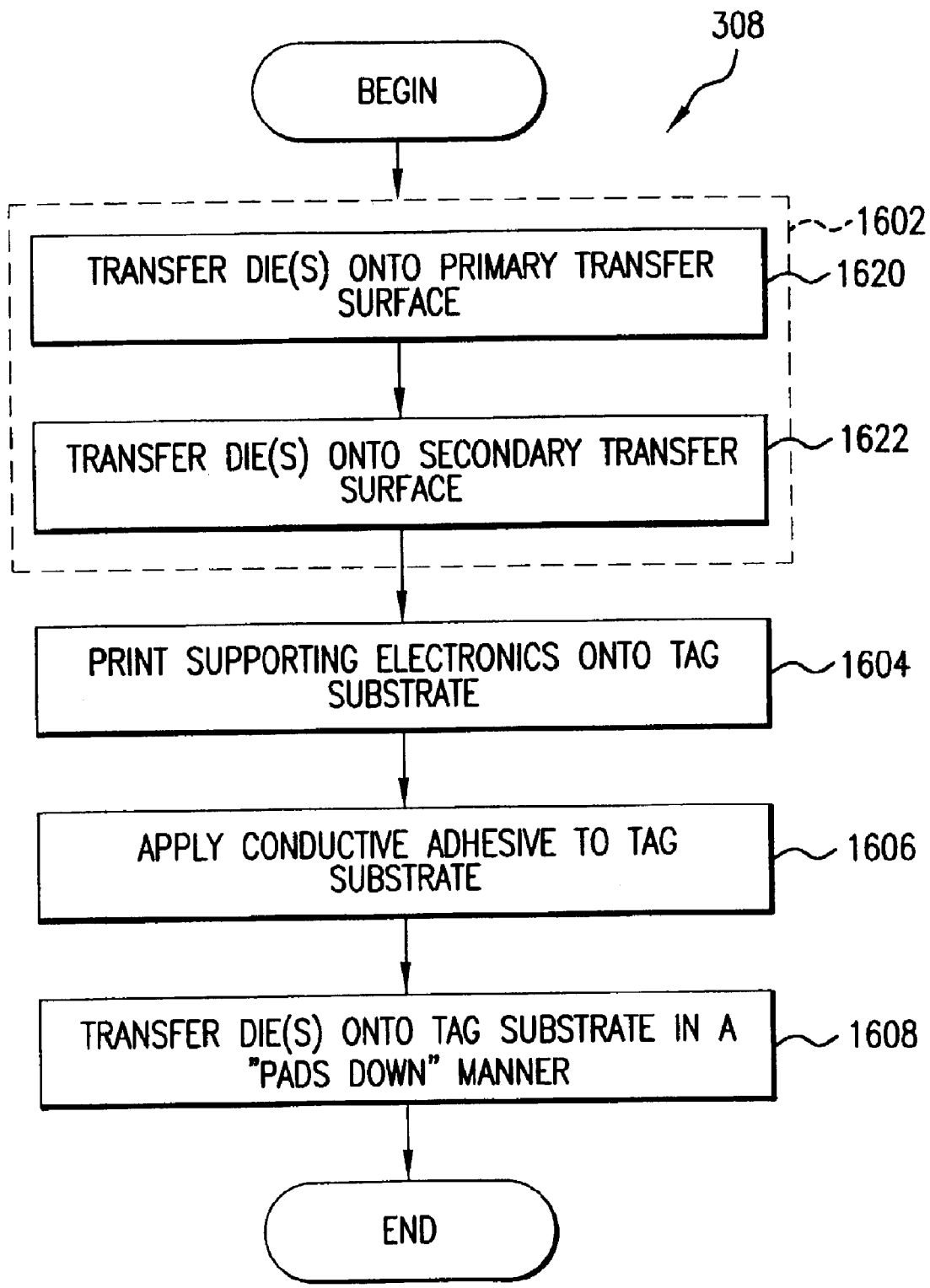
FIG. 16 is a flowchart illustrating a "pads down" die transfer onto a tag substrate.

FIG. 16 is a flowchart illustrating a performance of step 308 in greater detail for "pads down" transfer. This performance begins with a step 1602. In step 1602, one or more dies 104 are oriented for pads down transfer from support surface 404 onto tag substrate 116. Step 1602 is described in greater detail with reference to FIGS. 12A, 12B, 13–15, and 17–20. These drawings provide exemplary views of dies 104, support surface 404, a transfer surface 1202, a secondary transfer surface 1702, and tag substrate 116 during various stages of a "pads down" transfer operation.

Step 1602 comprises a step 1620 of transferring die(s) 104 onto a primary transfer surface and a step 1622 of transferring die(s) 104 onto a secondary transfer surface.

In step 1620, die(s) 104 are placed in contact with transfer surface 1202 and removed from support surface 404, thereby resulting in the transfer of die(s) 104 from support surface 404 to transfer surface 1202.

FIGS. 12A and 12B provide views of a die 104 in contact with support surface 404 and transfer surface 1202. Transfer surface 1202 is an adhesive material, such as tape. Placing die(s) 104 in contact with transfer surface 1202 can include the step of reducing the physical separation between support surface 404 and transfer surface 1202 until die 104 contacts transfer surface 1202. This can be performed through the use of rollers, piston-type punching techniques, and/or air jets.

FIG. 13 is a view of a plurality of dies 104 removed from support surface 404 and transferred to transfer surface 1202. Removal of die(s) 104 from support surface 404 can include the steps of providing a stronger adhesive on transfer surface 1202 than on support surface 404, and increasing the physical separation between support surface 404 and transfer surface 1202. Alternatively, removal of dies 104 from support surface 404 can include the steps of providing a release adhesive on support surface 404 that loses it adhesive properties upon a release action, such as exposure to thermal energy, radiation, or ultraviolet light, and creating a release action at a time when removal is desired.

Figure 17:
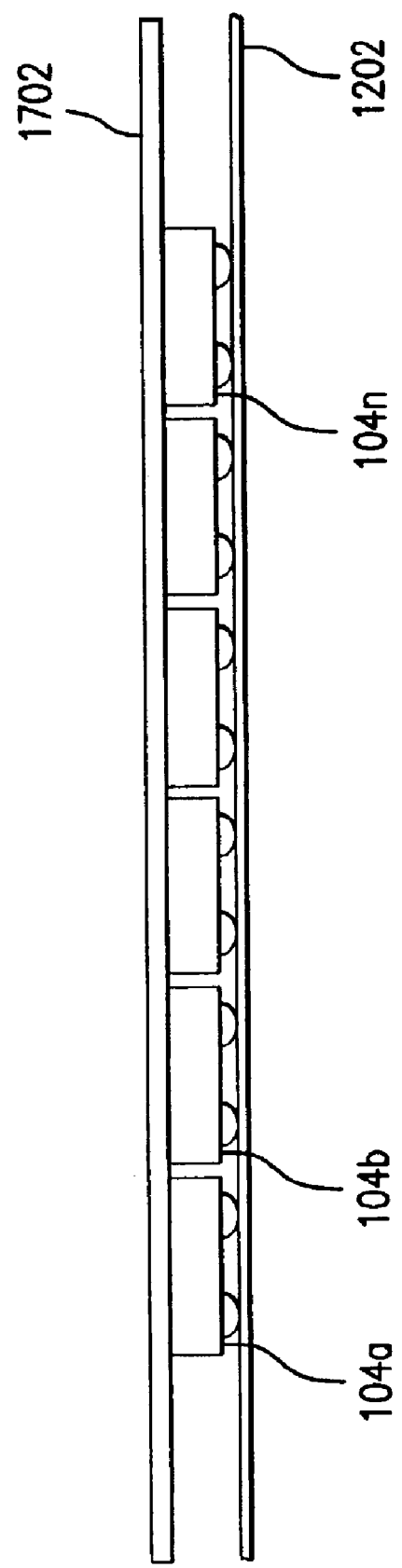
FIG. 17 is a view of a plurality of dies in contact with primary and secondary transfer surfaces.

After step 1620, a step 1622 is performed. In step 1622, die(s) 104 are transferred from transfer surface 1202 onto secondary transfer surface 1702. In step 1622, die(s) 104 are placed in contact with secondary transfer surface 1702. FIG. 17 provides an exemplary view of such contact, where die(s) 104 are in contact with transfer surface 1202 and secondary transfer surface 1702. Placing die(s) 104 in contact with secondary transfer surface 1702 can include the step of reducing the physical separation between support surface 404 and transfer surface 1202 until die 104 contacts transfer surface 1202. This can be performed through the use of rollers, piston-type punching techniques, and/or air jets.

Figure 18:
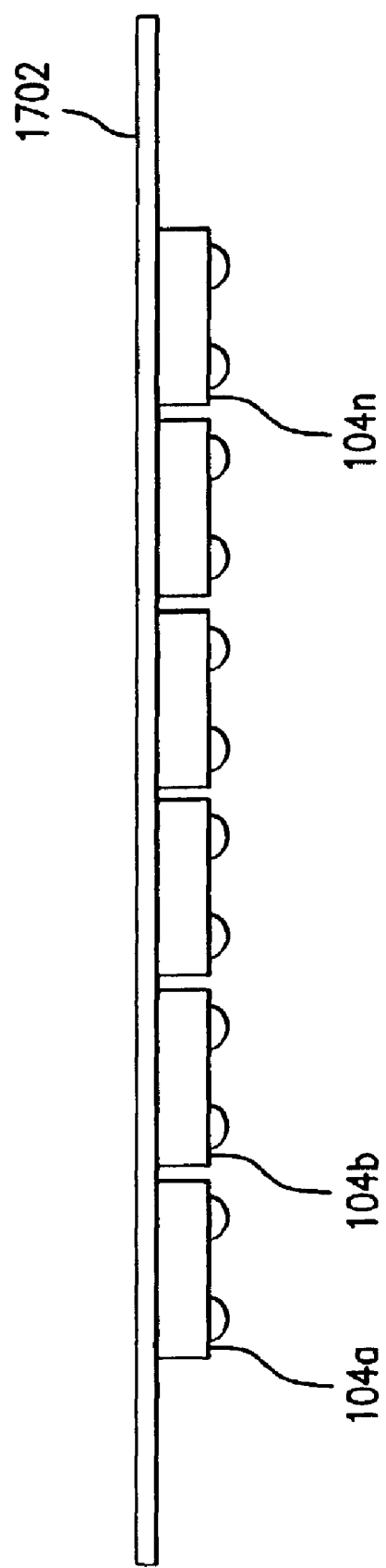
FIG. 18 is a view of a plurality of dies attached to a secondary transfer surface.

Next, pursuant to step 1622, die(s) 104 are removed from transfer surface 1202 to complete the transfer to secondary transfer surface 1702. FIG. 18 is a view of a die 104 that has been removed from transfer surface 1202, and is therefore transferred to secondary transfer surface 1702. As described herein, both transfer surface 1202 and secondary transfer surface 1702 are adhesive surfaces. Thus, removal of die(s) 104 from transfer surface 1202 can include the steps of providing a stronger adhesive on secondary transfer surface 1702 than on transfer surface 1202, and increasing the physical separation between transfer surface 1202 and secondary transfer surface 1702. Alternatively, removal of die(s) 104 from transfer surface 1202 can include the steps of providing a release adhesive on transfer surface 1202 that loses it adhesive properties upon a release action, such as exposure to thermal energy, radiation, or ultraviolet light, and creating a release action at a time when removal is desired.

In step 1604, related electronics 106 are printed onto tag substrate 116. Step 1604 can comprise the steps of printing related electronics 106 onto tag substrate 116 through a screen printing process, an ink jet process, and/or a thermal spray process. Alternatively, step 1604 can comprise the step of removing conductive material already disposed on tag substrate 116 through an oblation process.

In step 1606, a layer of conductive adhesive is placed on tag substrate 116. This step comprises applying an anisotropic adhesive that conducts electricity in a single dimension. One such adhesive is commercially available "z-axis" adhesive, which is well-known in the relevant arts. Anisotropic adhesives conduct electricity in a single direction. Therefore, they advantageously enable electrical connections to be established between connecting pads 204 and related electronics 106 without shorting connecting pads 204 together.

In step 1608, die(s) 104 are transferred onto tag substrate 116 in a "pads down" manner. The anisotropic adhesive layer placed on tag substrate 116 in step 1606 provides an electrical connection between each connecting pad 204 and corresponding elements of related electronics 106. Step 1608 comprises the steps of placing die(s) 104 in contact with tag substrate 116 and removing die(s) 104 from secondary transfer surface 1702.

Figure 19:
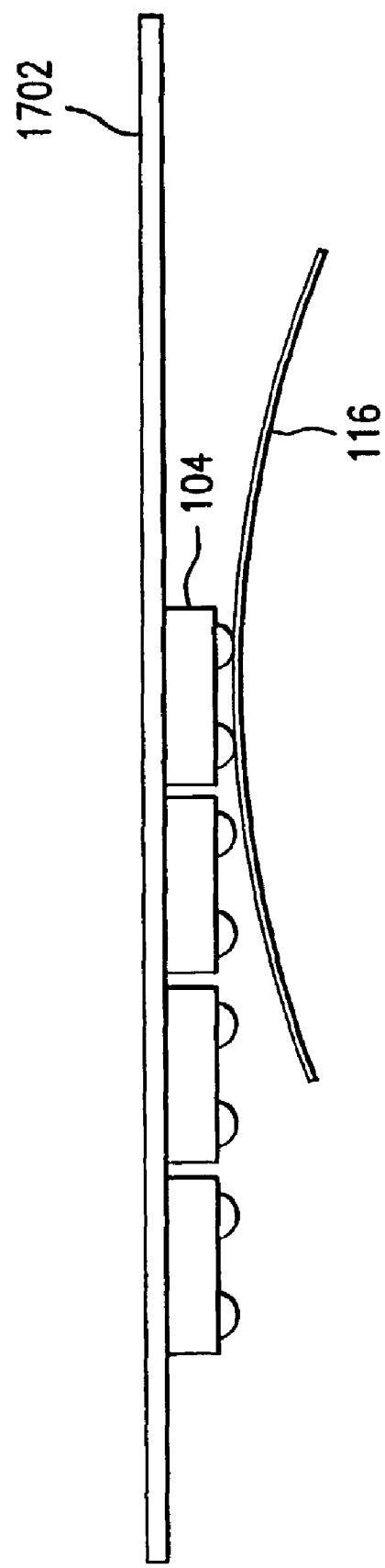
FIG. 19 is a view of a "pads down" oriented die in contact with a transfer surface and a tag substrate.

Placing die(s) 104 in contact with tag substrate 116 can include the step of reducing the physical separation between secondary transfer surface 1702 and tag substrate 116 until die 104 contacts tag substrate 116. This can be performed through the use of rollers, piston-type punching techniques, and/or air jets. FIG. 19 is a view of a "pads down" oriented die 104 in contact with secondary transfer surface 1702 and tag substrate 116. As shown in FIG. 19, a punching member 1902 can be used to punch secondary transfer surface 1702 at a location opposite of die 104, to transfer die 104 from secondary transfer surface 1702 to tag substrate 116. As describe above, other transfer mechanisms and/or processes may be alternatively used.

Figure 20:
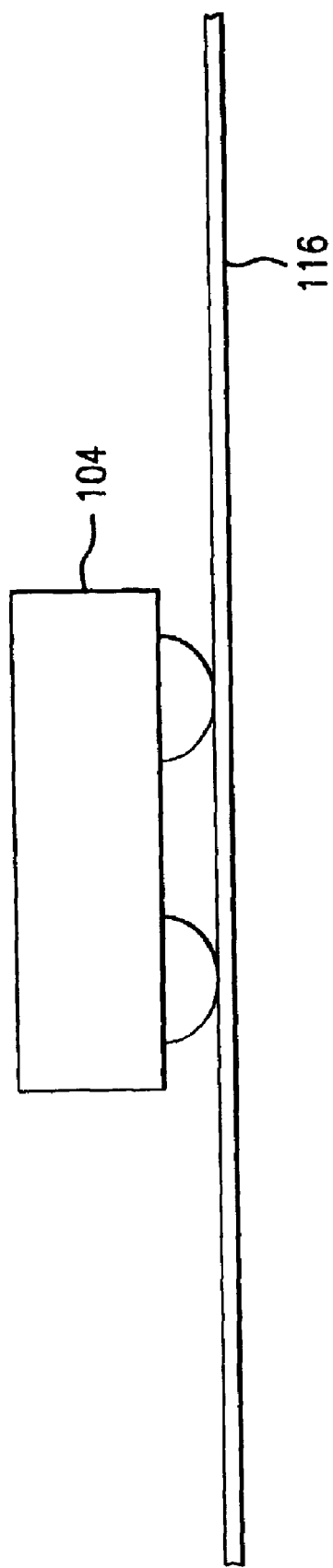
FIG. 20 is a view of a "pads down" oriented die attached to a tag substrate.

Removal of die(s) 104 from secondary transfer surface 1702 can include the steps of providing a stronger adhesive on tag substrate 116 than on secondary transfer surface 1702, and increasing the physical separation between secondary transfer surface 1702 and tag substrate 116. Alternatively, removal of dies 104 from secondary transfer surface 1702 can include the steps of providing a release adhesive on secondary transfer surface 1702 that loses its adhesive properties upon a release action, such as exposure to thermal energy, radiation, or ultraviolet light, and creating a release action at a time when removal is desired. FIG. 20 is a view of a "pads down" oriented die 104 attached to tag substrate 116.

2.1.2 Parallel Die Punch onto a Support Surface

According to a parallel die punch process of the present invention, a second surface, such as a punch tape, is aligned over separated dies attached to a first surface. The punch tape has multiple die receptor holes, "divots," or cells formed in a surface. Each receptor cell in the punch tape is aligned with a corresponding die of the first surface. Multiple mechanical punches are actuated to push the die from the first surface into the corresponding receptor cell of the punch tape. In this manner, any number of dies, including tens and hundreds of dies, can be transferred simultaneously into the punch tape, instead of merely transferring one die at a time.

Figure 21:
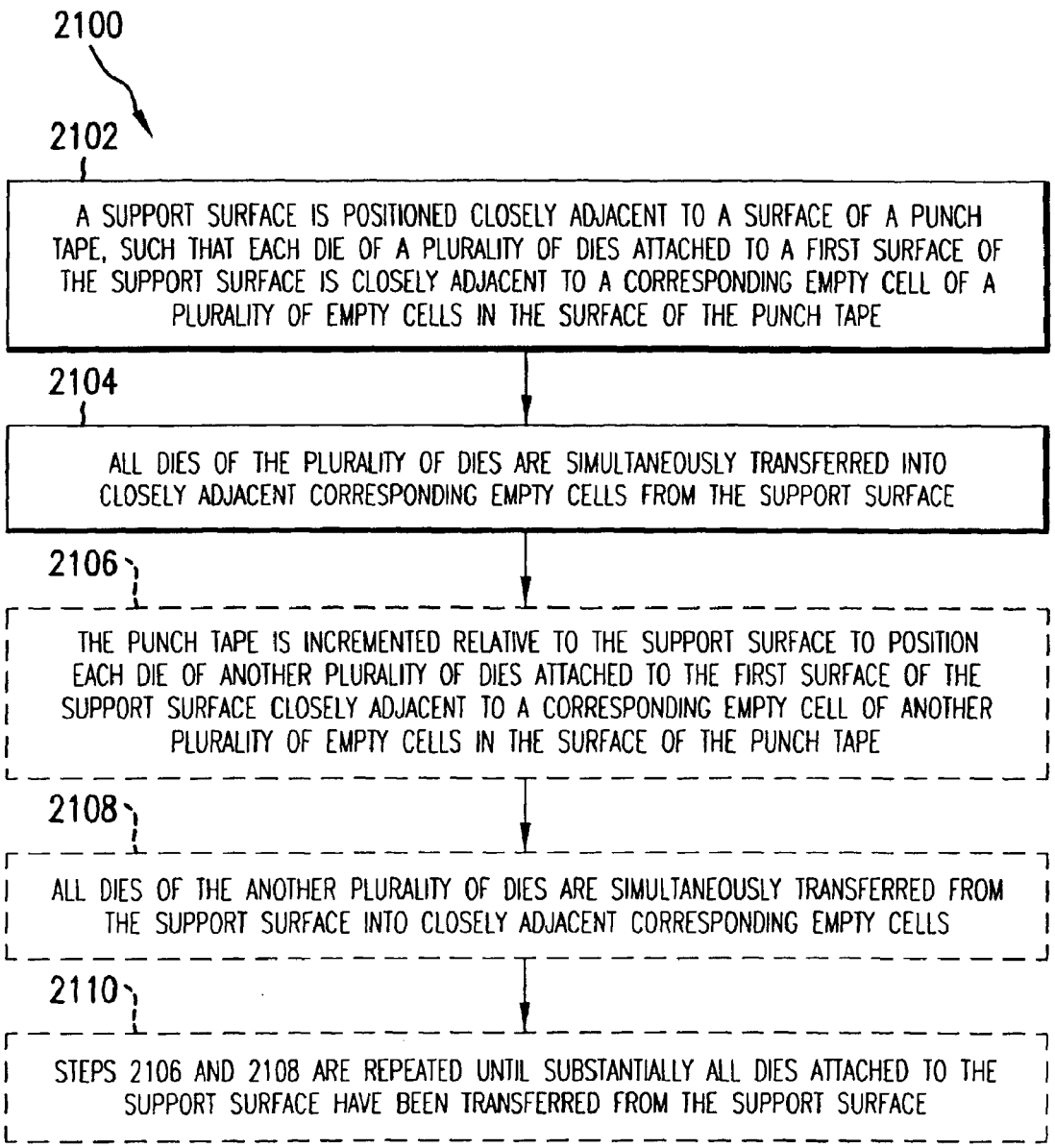
FIG. 21 shows a flowchart providing steps for transferring a plurality of dies from a first surface to a second surface using a parallel punching process, according to embodiments of the present invention.

FIG. 21 shows a flowchart 2100 providing steps for transferring a plurality of dies from a first surface to a second surface using a parallel punching process, according to embodiments of the present invention. Note that steps of flowchart 800 that are optional are shown enclosed in dotted lines. Further structural embodiments will be apparent to persons skilled in the relevant art(s) based on the following discussion.

Figure 22:
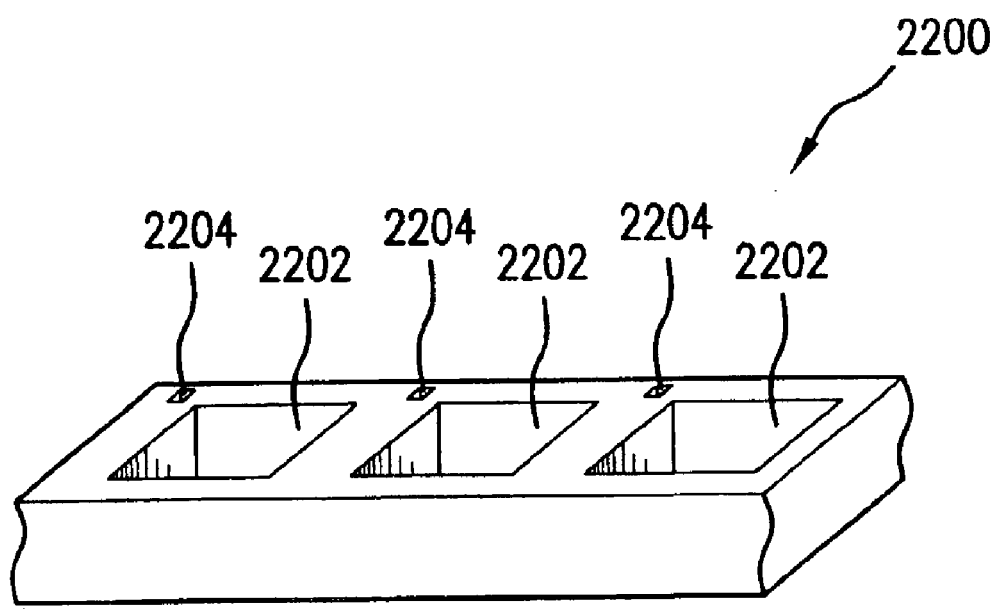
FIGS. 22–29 show views of a plurality of dies being transferred from a first surface to a second surface using the punching process of FIG. 21.
Figure 23:
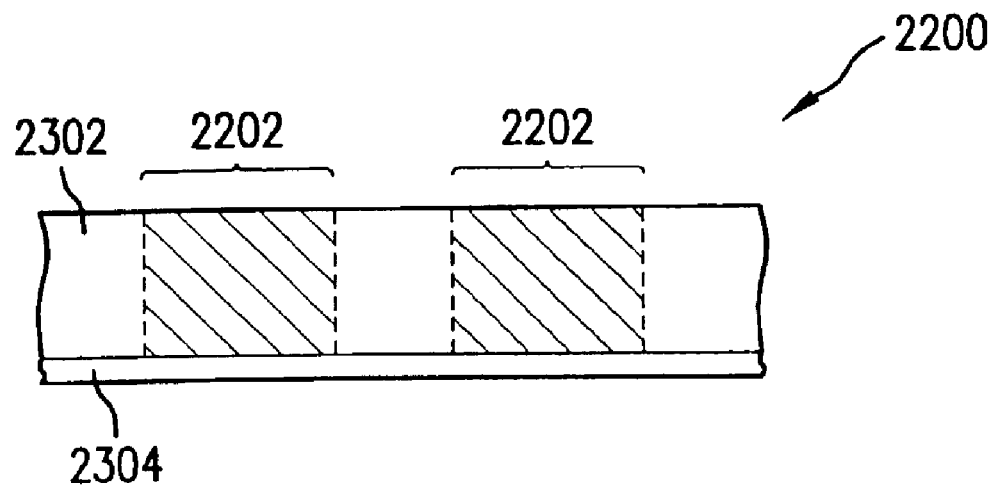

Flowchart 2100 will be described in relation to FIGS. 22–29, for illustrative purposes. A perspective view of an example punch tape 2200 is shown in FIG. 22, according to an embodiment of the present invention. FIG. 23 shows a cross-sectional view of punch tape 2200. As shown in FIG. 22, punch tape 2200 has a plurality of cells 2202 formed in a top surface. In some embodiments, punch tape 2200 may further have a plurality of guide holes 2204 formed in the top surface.

As the example shown in FIG. 23, punch tape 2200 may be formed from a punch tape body 2302 and an adhesive tape 2304. Adhesive tape 2304 is attached to a bottom surface of punch tape body 2302. Punch tape body 2302 is typically flexible, and may have a variety of thicknesses, including thicknesses ranging from 5 mils to 11 mils, or other thicknesses. Punch tape body 2302 may be made from plastic or from other flexible or non-flexible material. Adhesive tape 2304 may be any type of adhesive tape or other adhesive material. Alternatively, punch tape 2200 may be a conventional chip carrier as are available in the industry, and/or may be a single piece punch tape.

Cells 2202 are open on a top surface of punch tape 2200 and are not open on the bottom surface of punch tape 2200. Plurality of cells 2202 are formed from a plurality of openings through punch tape body 2302, having one end covered by adhesive tape 2304. The openings may be preformed, or may be formed in punch tape 2200 by laser etching, or by other process.

When present, guide holes 2204 may penetrate all the way through punch tape 2200 to be open at the bottom and top surfaces of punch tape 2200, or may be open at only one of the two surfaces. Guide holes 2204 may be used to align punch tape 2200 with a surface.

In the discussion that follows, punch tape 2200 is described as receiving dies from a support surface, and transferring dies to a substrate. However, in embodiments, for example, punch tape 2200 may receive dies from a surface that is a scribed wafer or support surface, or an intermediate surface. Furthermore, punch tape 220 may transfer dies to an intermediate or transfer surface, or to a substrate surface.

Figure 24:
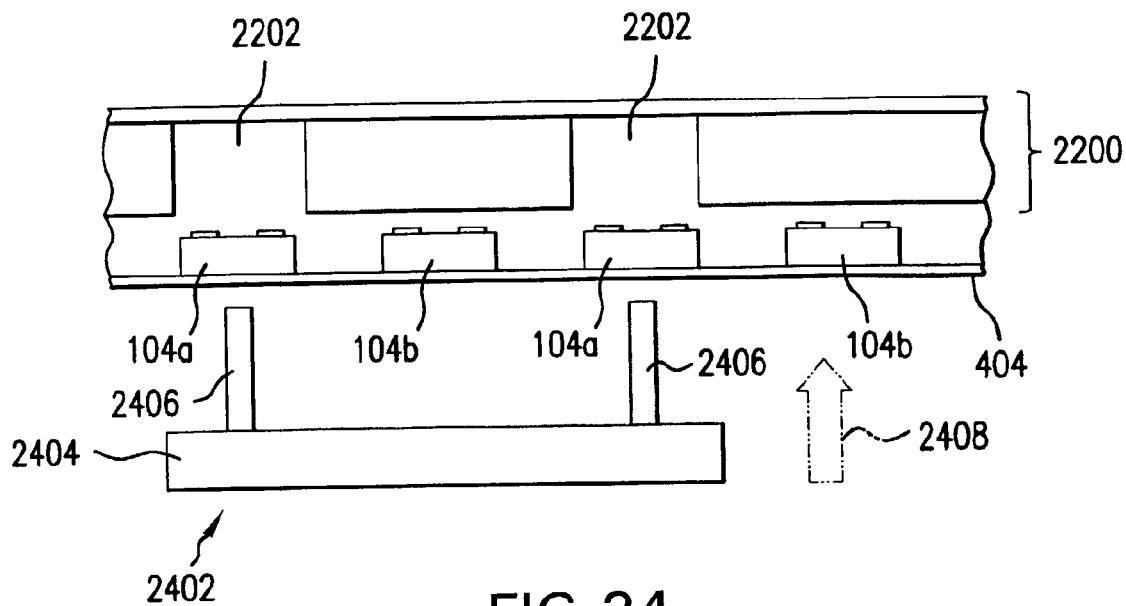

Flowchart 2100 shown in FIG. 21 begins with step 2102. In step 2102, a support surface is positioned closely adjacent to a surface of a punch tape, such that each die of a plurality of dies attached to a first surface of the support surface is closely adjacent to a corresponding empty cell of a plurality of empty cells in the surface of the punch tape. FIG. 24 illustrates step 2102. For example, as shown in FIG. 24, the support surface of step 2102 may be support surface 404, which is positioned closely adjacent to punch tape 2200. As shown in FIG. 24, a plurality of dies 104*a* are attached to support surface 404, and another plurality of dies 104*b* are attached to the surface of support surface 404. Each die of plurality of dies 104*a* is positioned closely adjacent to an empty cell 2202 in punch tape 2200.

FIG. 24 also shows a punching apparatus 2402 positioned adjacent to support surface 404, according to an example embodiment of the present invention. Punching apparatus 2402 includes a body 2404 and a plurality of punching members 2406. Punching members 2406 are attached to body 2404. In embodiments, punching body 2402 may be any type of applicable punching device, including a flat surface having punching members 2406 extending therefrom, or may be a rolling-pin type device with punching members 2406 extending outward radially therefrom. Punching apparatus 2402 may be configured in additional ways.

Figure 25:
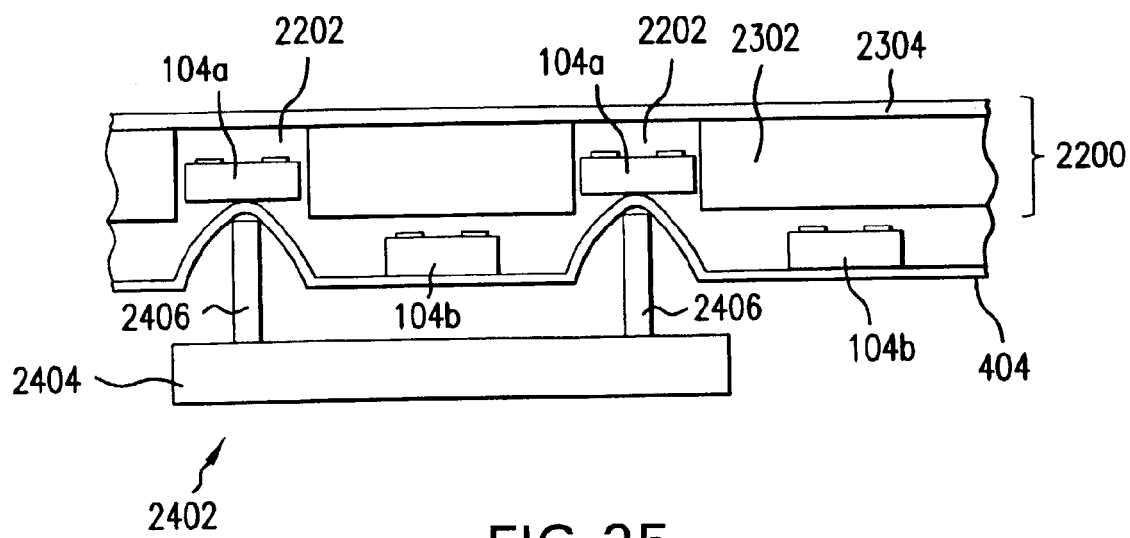

In step 2104, all dies of the plurality of dies are simultaneously transferred into closely adjacent, corresponding empty cells from the support surface. For example, as shown in FIG. 25, all dies of plurality of dies 104A are simultaneously being transferred into the corresponding empty cells 2202 of punch tape 2200 by punching apparatus 2402. As shown in FIG. 25, punching mechanism 2402 has moved upward to push each of the plurality of dies 104A into their corresponding cells 2202 by pushing through substrate surface 404. As shown in FIG. 25, substrate surface 404 substantially flexes to allow punching members 2406 to push plurality of dies 104a upwards without substantial damage to support surface 404. Although not shown in FIG. 25, plurality of dies 104a become attached in cells 2202 due to the adhesiveness of adhesive tape 2304, and remain in cells 2202 after punching members 2406 are removed or retracted.

Figure 26:
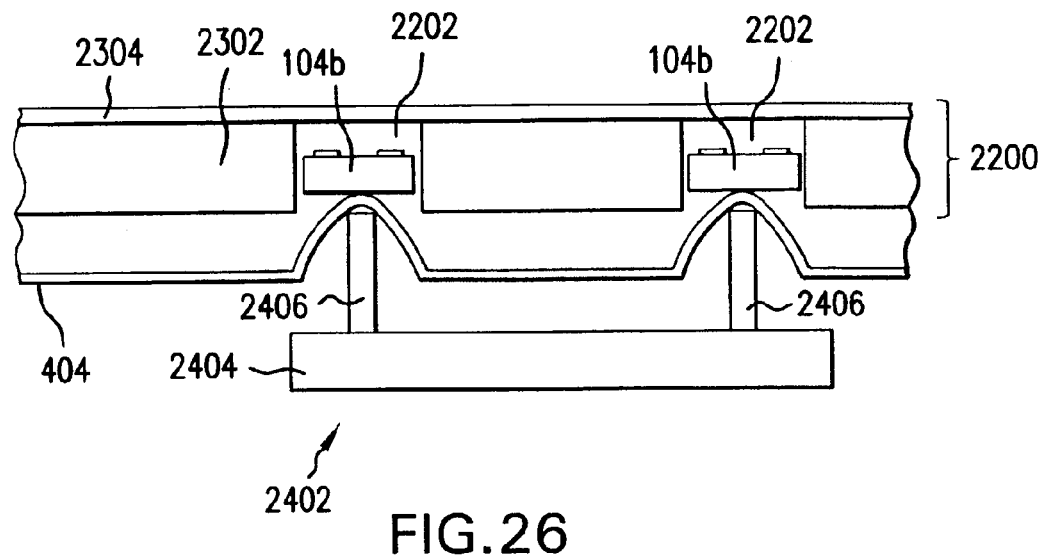

In optional step 2106, the punch tape is incremented relative to the support surface to position each die of another plurality of dies attached to the first surface of the support surface closely adjacent to a corresponding empty cell of another plurality of empty cells in the surface of the punch tape. For example, as shown in FIG. 26, punch tape 2200 has been moved and positioned closely adjacent to plurality of dies 104b such that an empty cell 2202 of punch tape 2200 is closely adjacent to each die of plurality of dies 104b.

Note that the process of incrementing punch tape 2200 relative to support surface 404 means that any one or more of punch tape 2200, support surface 404, and/or punching mechanism 2402 may be moved in order to properly position these elements relative to dies 104 on support surface 404.

In optional step 2108, all dies of the another plurality of dies are simultaneously transferred from the support surface into closely adjacent corresponding empty cells. For example, as shown in FIG. 26, punching mechanism 2402 pushes each die of plurality of dies 104b into the adjacent cell 2202. Plurality of dies 104b become attached in cells 2202 due to an adhesiveness of adhesive tape 2304.

In optional step 2110, steps 2106 and 2108 can be repeated until substantially all dies attached to the support surface have been transferred from the support surface to the punch tape. Note that optional steps 2106, 2108, and 2110 apply to embodiments where multiple iterations are required to punch plurality of dies from one surface to another so that all dies attached to the first surface are transferred to the second surface. In other words, for example, the plurality of dies that are transferred in a single step may be substantially equal to one out of every N dies of a total number of dies attached to the support surface. Thus, in such an embodiment, the support surface may be positioned closely adjacent to the surface of the punch tape, such that each die of the one out of every N dies attached to the first surface of the support surface is closely adjacent to a corresponding empty cell of the plurality of empty cells in the surface of the punch tape. Hence, the plurality of dies are transferred, but not all dies.

Figure 27:
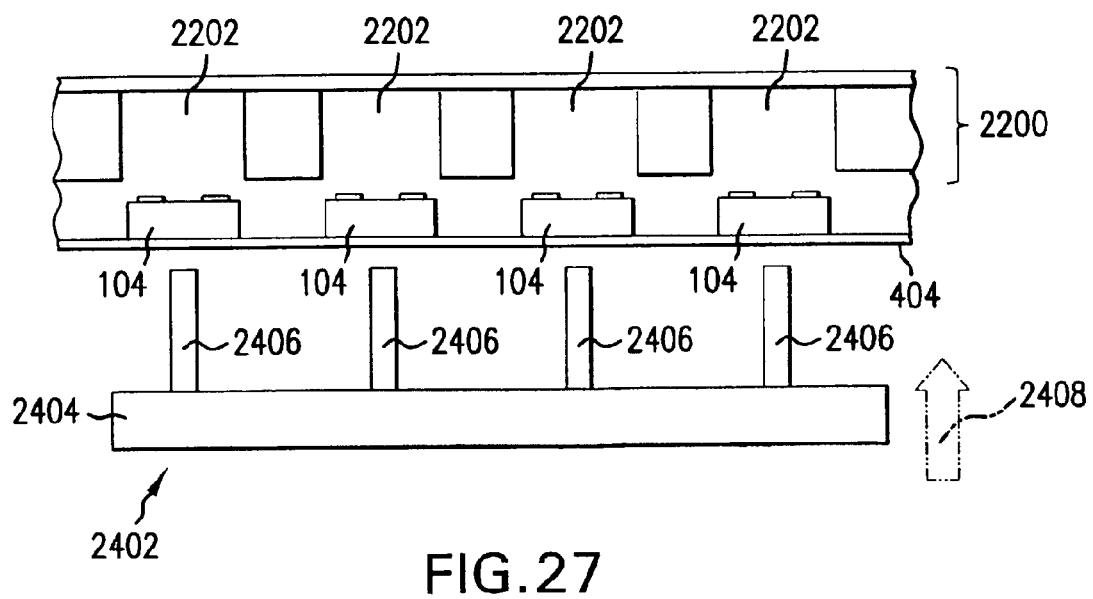

In an alternative embodiment, the plurality of dies transferred may be all of the dies attached to the first surface, so that further iterations are not required. For example, FIG. 27 shows a plurality of dies 104 attached to support surface 404, where each die is positioned closely adjacent to corresponding cell 2202 in punch tape 2200. As shown in FIG. 27, punching mechanism 2402 has a plurality of punching members 2406 that correspond to plurality of dies 104. Hence, when punching members 2406 simultaneously punch upward into support surface 404, all dies of plurality of dies 104 are moved into corresponding cells 2202 of punch tape 2200, simultaneously.

Note that the punch mechanism die transfer embodiments described herein are applicable to both pads-up and pads-down die orientations. Hence, plurality of dies 104 may be transferred into corresponding cells 2202 with pads facing in or out of the corresponding cells 2202, as desired. Furthermore, punching mechanism embodiments may be alternated with adhesive tape transfer embodiments described above in order to flip the orientation of dies 104. Hence, an adhesive tape may be used to transfer dies one or more times followed by a final transfer of the plurality of dies 104 by the punching mechanism. Hence, the adhesive tape embodiments may be used to orient the dies with either pads up or pads down prior to being punched into cells 2202.

For instance, in an example step 2106, support surface 404 may be incremented by one column of dies 104 relative to punch tape. Punch tape 2200 may be spooled on a roll. Punch tape 2200 is advanced so that empty die receptor cells 2202 are aligned over a column of dies 104 on support surface 404. Dies 104 in the column of support surface 404 are punched into the empty die receptor cells 2202 in step 2108. Support surface 404 may then be again incremented by one column, and punch tape 2200 is again advanced, so that the next column of dies 104 of support surface 404 may be punched into further empty die receptor cells of punch tape 2200. This procedure may be repeated until support surface 404 is exhausted of dies 104.

Example die transfer embodiments using a punching mechanism are described in detail in the following subsection.

2.1.2.1 Direct Transfer from Support Surface to Antenna Substrate

According to an embodiment of the present invention, a punching mechanism may simultaneously transfer each die of a plurality of dies from a first surface directly onto a corresponding antenna substrate. In embodiments where the first surface is a support surface that attaches separated dies from a wafer, this process allows for extremely rapid fabrication of a large number of electronic devices, such as RFID tags 100.

Figure 28:
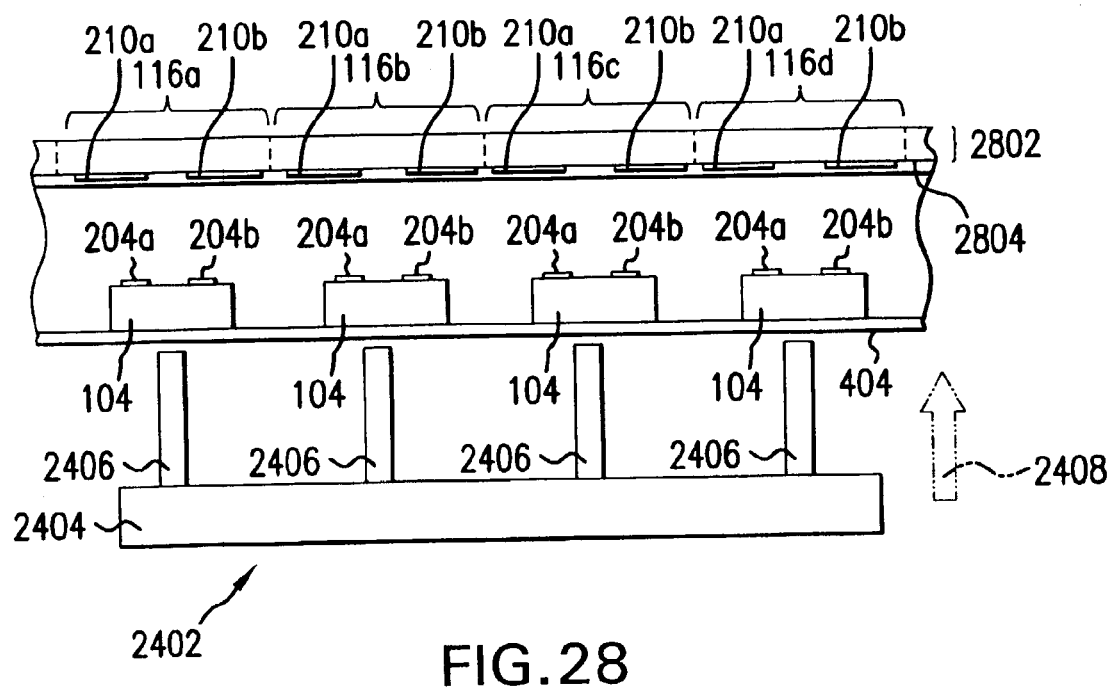

Steps 2102 and 2104 of flowchart 2100 support the transfer for die from a support surface to a substrate, where instead of using a punch tape as a second surface, an substrate is used as the second surface. FIG. 28 illustrates an example using punching mechanism 2402 to transfer a plurality of dies 104 from a support surface 404 to a substrate structure 2802 that includes a plurality of tag substrate portions (i.e., tag substrates 116a–d).

As shown in FIG. 28, punching mechanism 2402 has a plurality of punching members 2406 that are positioned adjacent to dies 104 on an opposite surface of support surface 404. In a modified step 2102, support surface 404 is positioned closely adjacent to a surface of substrate structure 2802, such that each die 104 of the plurality of dies is closely adjacent to a tag substrate 116. Each tag substrate 116 has contact areas 210a and 210b for coupling to contact pads 204a and 204b of each die 104.

Note that an underfill material layer 2804 can be optionally applied to the surface of substrate structure 2802. This allows for each die 104 to be underfilled when attached to substrate structure 2802.

Figure 29:
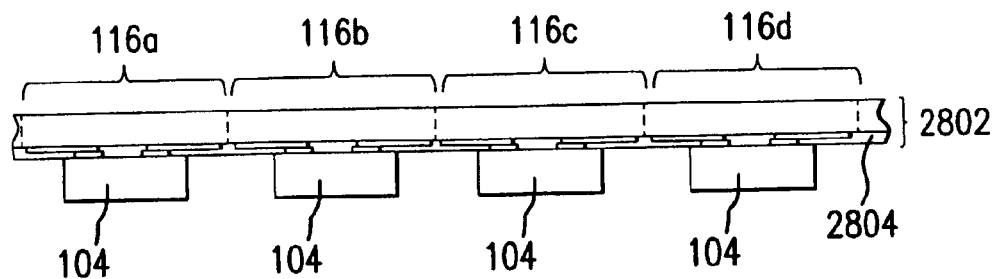

In a modified step 2104, all dies 104 of the plurality of dies are simultaneously transferred onto the closely adjacent, corresponding tag substrate 116 from support surface 404. For example, as shown in FIG. 28, punching members 2408 may be moved in the direction of arrow 2408 to transfer dies 104. FIG. 29 shows substrate structure 2802 with each of dies 104 attached to a corresponding one of tag substrates 116*a*–*d*. Underfill material layer 2804 provides for an underfill material to be located between each die 104 and tag substrate 116. Example underfill materials suitable for underfill material layer 2804 are further described in the following section.

In this manner, a plurality of RFID tags 100 may be rapidly created, with fewer process steps. Tag substrates 116*a*–*d* shown in FIG. 29 may be subsequently separated to create a plurality of individual RFID tags 100. Note that while FIGS. 28 and 29 show the transfer of dies 104 directly to tag substrates 116 in a "pads down" orientation, it will be understood to persons skilled in the relevant art(s) from the teachings herein that this transfer of dies 104 directly to tag substrates 116 may also be accomplished in a "pads up" orientation.

2.1.2.2 Underfill Material Embodiments

According to a parallel die punch embodiment of the present invention, a second surface, such as punch tape 2200, is aligned over separated dies 104 attached to a first surface. Each receptor cell 2202 in punch tape 2202 has a corresponding die 104 placed therein. Each cell 2202 is then filled with an underfill material. Punching mechanism 2402 is actuated to move the die 104 from punch tape 2202 onto corresponding tag substrates 116 of substrate structure 2802. In this manner, any number of dies, including tens and hundreds of dies, can be transferred simultaneously from punch tape 2200, instead of merely transferring one die at a time. Furthermore, by applying the underfill material prior to transferring dies 104 to tag substrates 116, each die can be easily underfilled on the respective tag substrate 116 during the transfer process, providing numerous advantages.

Figure 30:
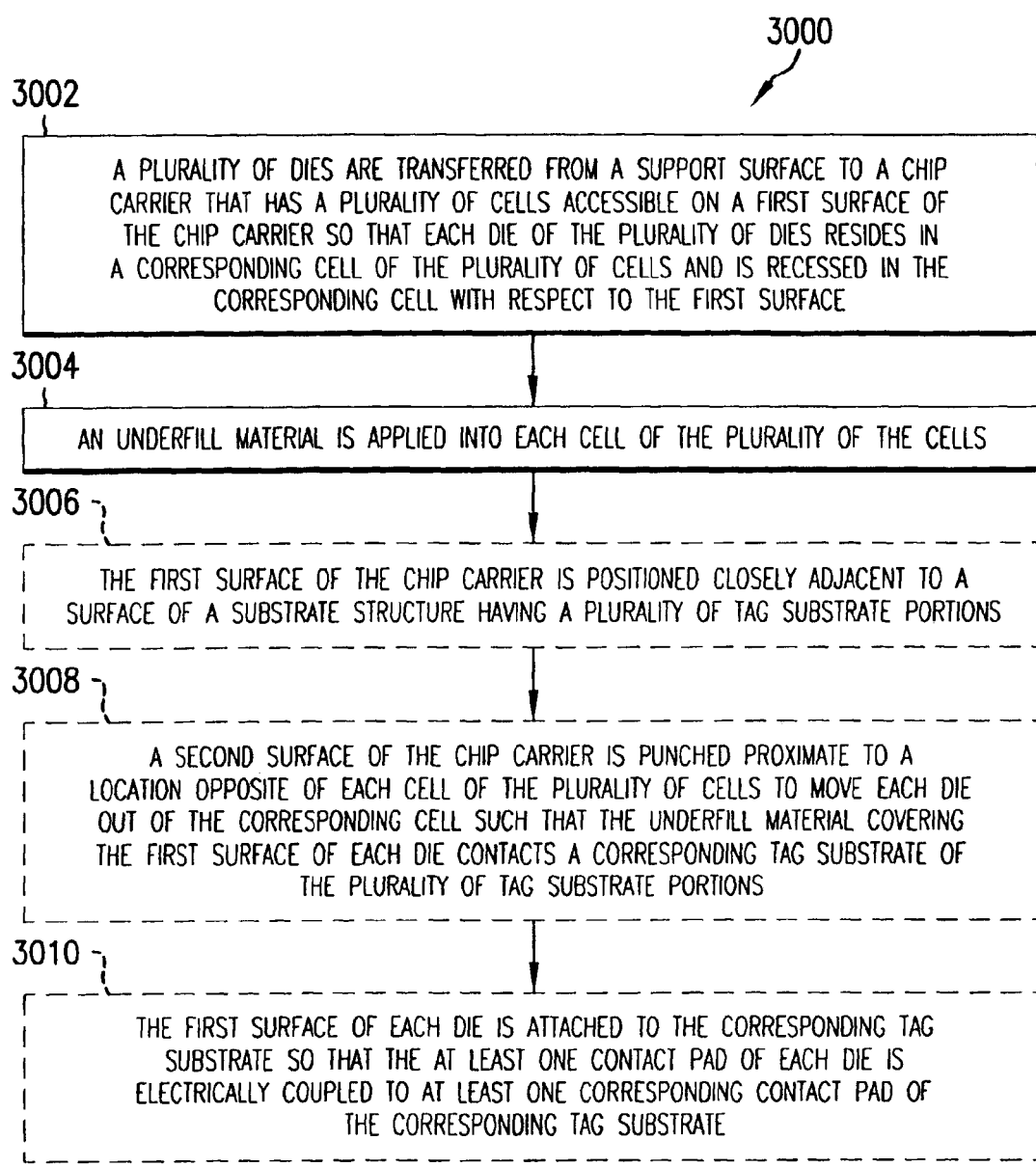
FIG. 30 shows a flowchart providing steps for assembling RFID tags, according to embodiments of the present invention.

FIG. 30 shows a flowchart 3000 providing steps for assembling RFID tags, according to embodiments of the present invention. Note that steps of flowchart 3000 that are optional are shown enclosed in dotted lines. Flowchart 3000 will be described in relation to FIGS. 31–47, for illustrative purposes. Further structural embodiments will be apparent to persons skilled in the relevant art(s) based on the following discussion.

Figure 31:
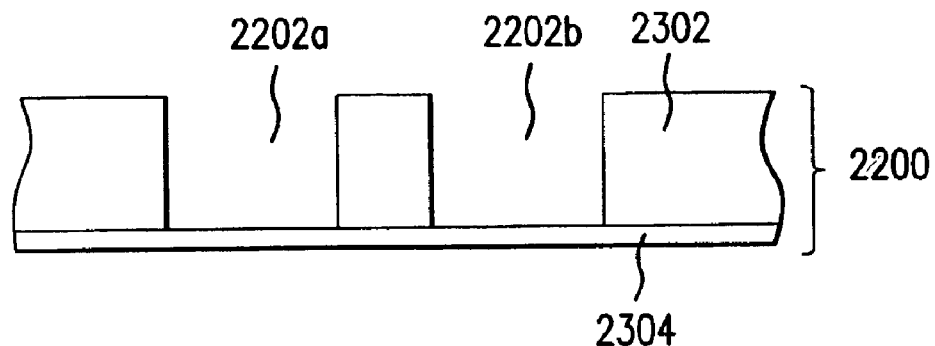
FIGS. 31–36 show views of a plurality of dies being transferred from a chip carrier to a substrate using the punching process of FIG. 30.
Figure 32:
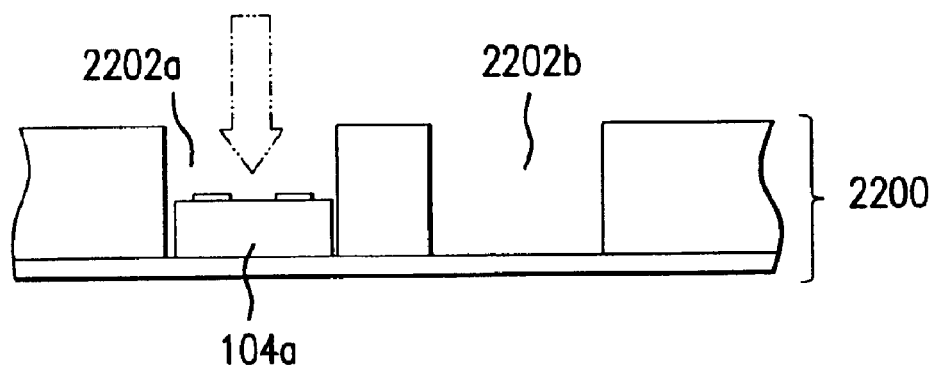
Figure 33:
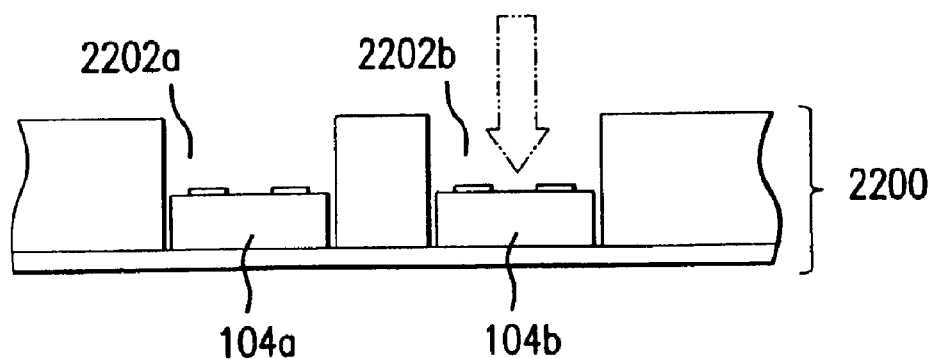

Flowchart 3000 begins with step 3002. In step 3002, a plurality of dies are transferred from a support surface to a chip carrier that has a plurality of cells accessible on a first surface of the chip carrier so that each die of the plurality of dies resides in a corresponding cell of the plurality of cells and is recessed in the corresponding cell with respect to the first surface. For example, the chip carrier is a punch tape, such as punch tape 2200 shown in FIG. 31. As shown in FIG. 31, punch tape 2200 has example empty first and second cells 2202*a* and 2202*b*. FIGS. 32 and 33 show first and second dies 104*a* and 104*b* being transferred into first and second cells 2202*a* and 2202*b*. First and second dies 104*a* and 104*b* may be transferred into first and second cells 2202*a* and 2202*b* by any process described here or otherwise known, including by a pick and place process. First and second dies 104*a* and 104*b* may be transferred into first and second cells 2202*a* and 2202*b* one at a time, as shown in FIGS. 32 and 33, or simultaneously. Note that two dies are shown in the current example for illustrative purposes, and that the present invention is applicable to any number of dies.

Figure 34:
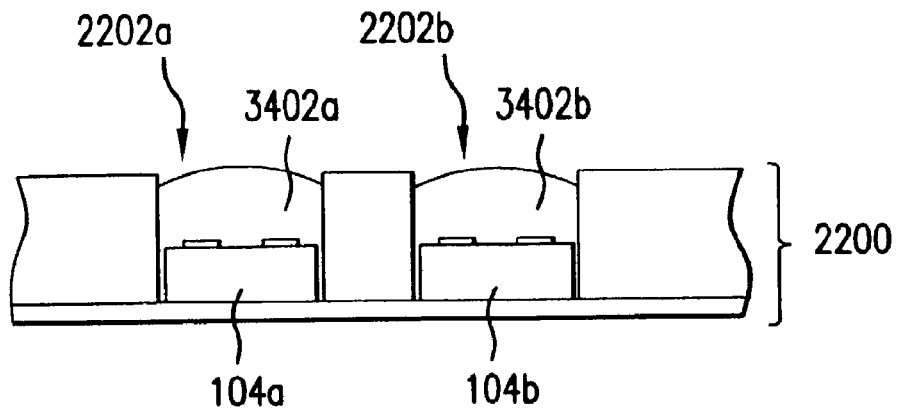

In step 3004, an underfill material is applied into each cell of the plurality of cells. For example, as shown in FIG. 34, an underfill material 3402 is applied into first and second cells 2202*a* and 2202*b* to substantially cover each of dies 104*a* and 104*b*, shown as first and second underfill material portions 3402*a* and 3402*b*. Underfill material 3004 is used to underfill dies 104 when attached to a substrate, such as a tag substrate 116, for purposes such as environmental and hermetic protection, among other reasons.

In embodiments, underfill material 3402 may be any underfill material conventionally known to persons skilled in the relevant art(s). Underfill material 3402 may be electrically conductive, or electrically non-conductive. For example, underfill material 3402 may be isotropically conductive, i.e., substantially uniformly conductive in all directions. Furthermore, underfill material 3402 may be anisotropically conductive, i.e., conductive in a desired direction. For example, underfill material 3402 may be a Z-axis epoxy.

Figure 35:
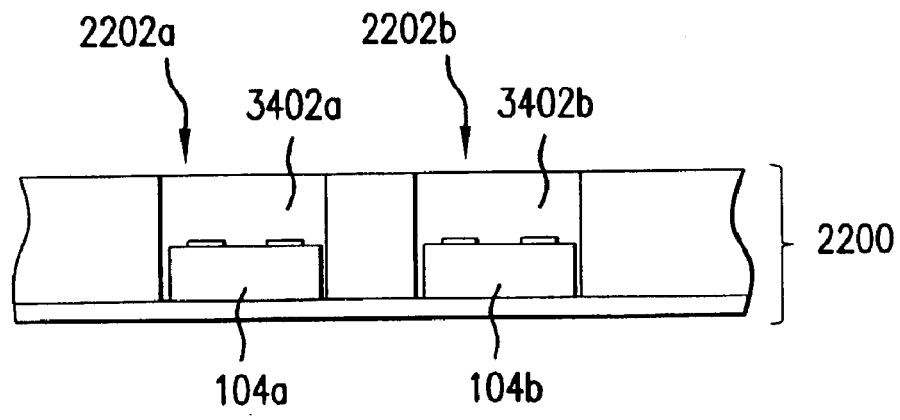
Figure 36:
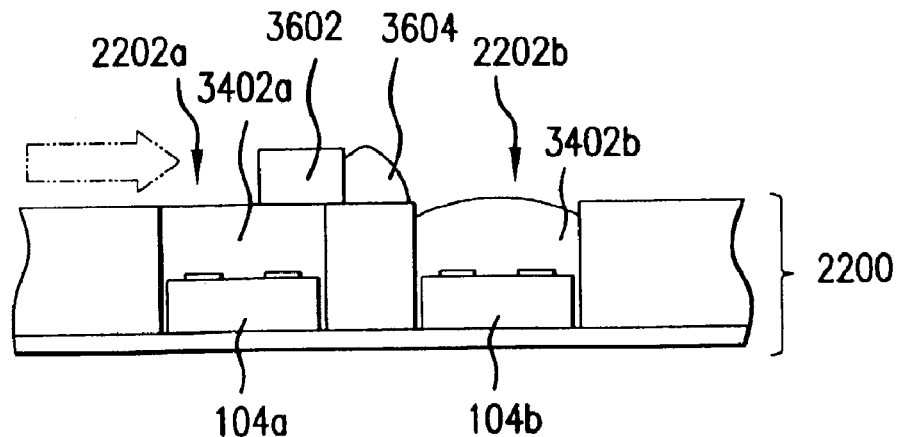

In an embodiment, the amount of underfill material 3402 applied in each cell 2202 can be controlled, so that an amount required by the particular application is present. For example, FIG. 34 shows first and second underfill material 3402*a* and 3402*b* have been applied so that the underfill material extends out of first and second cells 2202*a* and 2202*b*. In another example, FIG. 35 shows first and second underfill material 3402*a* and 3402*b* have been applied so that the underfill material is flush or even with the top surface of punch tape 2200. For example, in order to cause underfill material 3402 to be flush or even with the top surface of punch tape 2200, a "squeegee" process may be used. FIG. 36 shows an example squeegee process being performed. A squeegee element 3602 is passed along the top surface of punch tape 2200, smoothing first underfill material 3402*a* in first cell 2202*a*, for example. An excess underfill material 3604 is shown being removed. In the example of FIG. 36, underfill material 3402 was applied to cells 2202 before squeegee element 3602 was applied. Alternatively, underfill material 3402 may be applied by squeegee element 3602.

In the example of FIGS. 34–36, a height of each die 104 is approximately equal to half of a height of the corresponding cell 2202. Underfill material 3604 fills a remaining half of the height of the cell 2202. With such an amount of underfill material 3604 in cell 2202 relative to the size of die 104, enough underfill material 3604 is present to underfill die 104 when attached to substrate 116, without having excess underfill material. However, the present invention is applicable to higher and lower proportions of underfill material 3604 in cells 2202.

Figure 37:
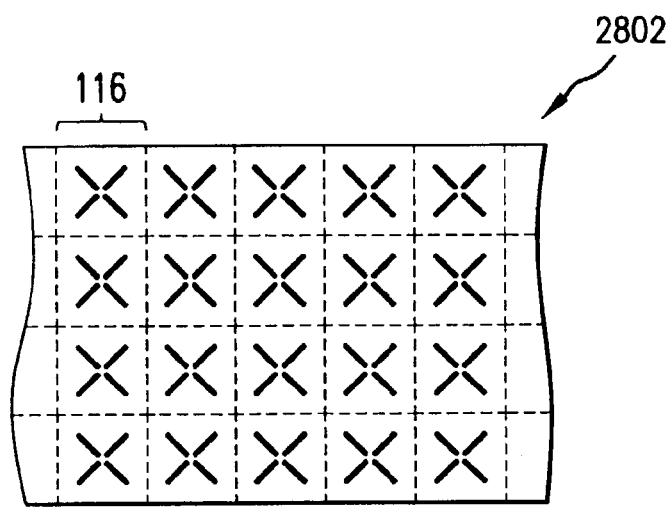
FIGS. 37–39 show view of substrate structures that include a plurality of individual substrates.
Figure 38:
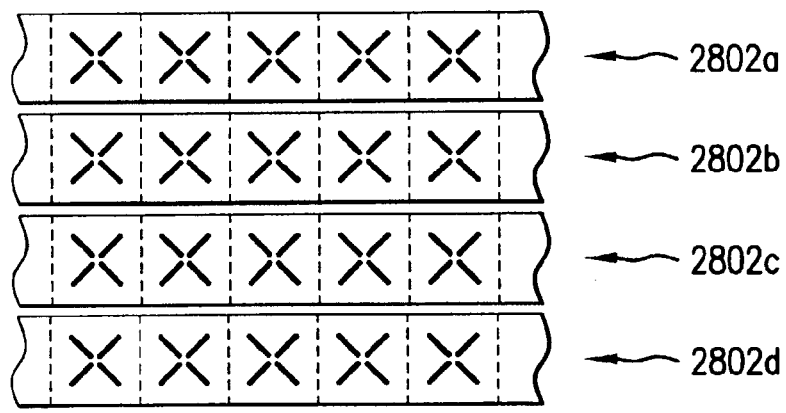

In optional step 3006 of flowchart 3000, the first surface of the chip carrier is positioned closely adjacent to a surface of a substrate structure having a plurality of tag substrate portions. For example, FIG. 37 shows an example substrate structure 2802. Substrate structure 2802 includes a plurality of tag substrate portions (i.e., tag substrates 116), also referred to as a web or array of tag substrates. Substrate structure 2802 includes any number of tag substrates 116, and may be shaped into any size column, row, or array of tag substrates 116. FIG. 38 shows substrate structure 2802 of FIG. 37 after having been separated into separate strip-shaped tag substrate structures 2802*a*, 2802*b*, 2802*c*, and 2802*d*. Substrate structure 2802 may be separated into strips by sawing, cutting, by laser, and by other processes. A strip for substrate structure 2802 can be conveniently used to transfer dies 104 from punch tape 2200, which typically is also formed in a strip.

Figure 39:
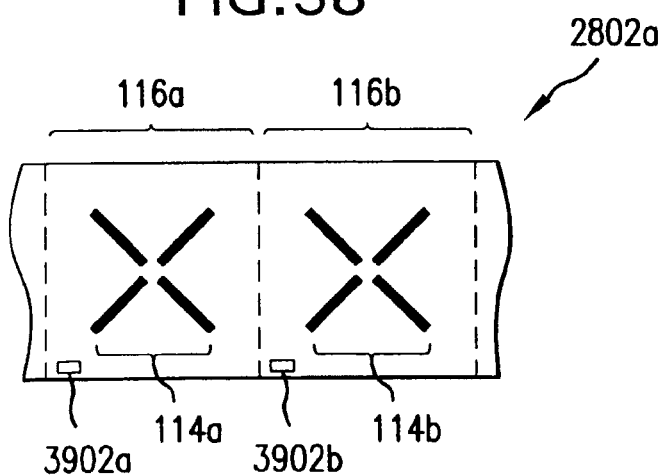

FIG. 39 shows a view of a portion of strip-shaped substrate structure 2802*a*. Substrate structure 2802 includes first and second tag substrates 116*a* and 116*b*. First tag substrate 116*a* includes an antenna 114*a* and a guide hole 3902*a*. Second tag substrate 116*b* includes an antenna 114*b* and a guide hole 3902*b*.

Guide holes 3902 may be used to align substrate structure 2802*a* with punch tape 2200. For example, guide holes 3902 may be used with guide holes 2204 shown in FIG. 22 to provide alignment. Guide holes 3902 and guide holes 2204 may be used to mechanically or optically align substrate structure 2802a with punch tape 2202. For example, mechanical alignment can include aligning punch tape 2202 using a first wheel having spaced pegs that interlock with guide holes 2204, and aligning substrate structure 2802a using a second wheel having spaced pegs that interlock with guide holes 3902. The first wheel and second wheel are synchronized.

Figure 40:
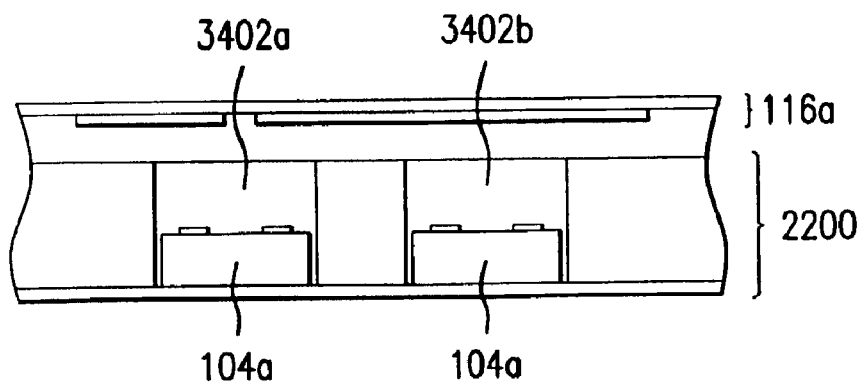
FIGS. 40–45 show views of a plurality of dies being transferred from a chip carrier to a substrate using the punching process of FIG. 30.

FIG. 40 shows the top surface of the punch tape 2200 being positioned closely adjacent to substrate structure 2802a, according to step 3006. Tag substrate 116a is positioned closely adjacent to cell 2202a.

Figure 41:
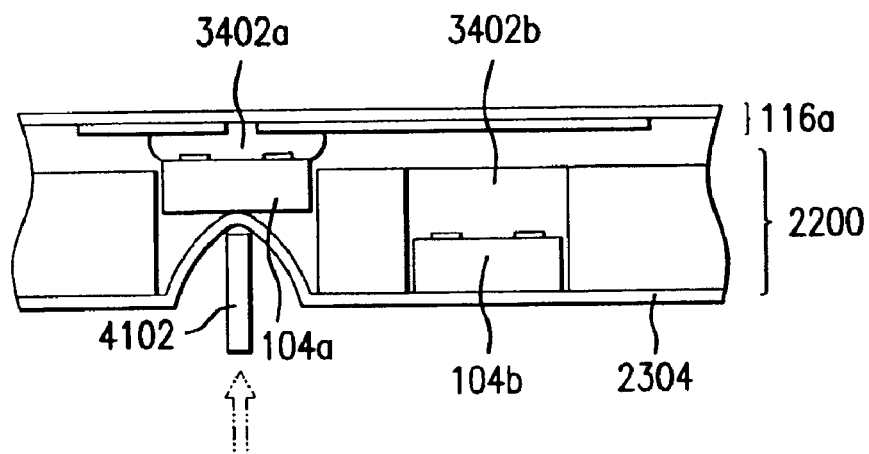
Figure 42:
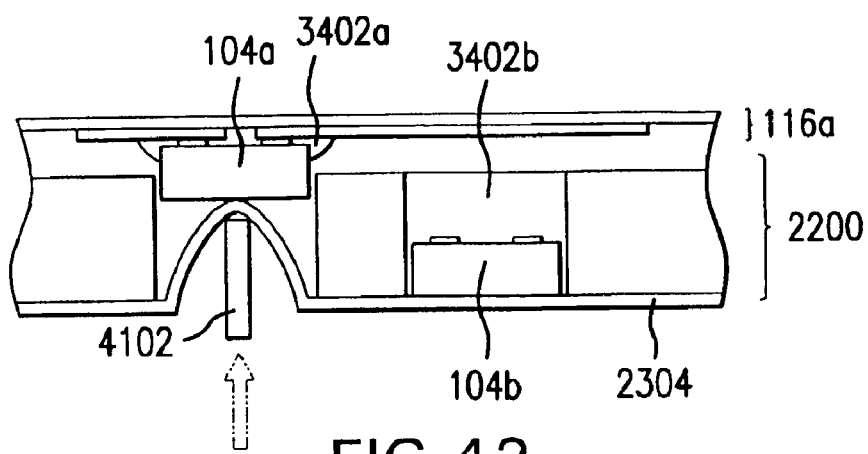

In optional step 3008, a second surface of the chip carrier is punched proximate to a location opposite of each cell of the plurality of cells to move each die out of the corresponding cell such that the underfill material covering each die contacts a corresponding tag substrate of the plurality of tag substrate portions. For example, as shown in FIG. 41, a punching member 4102 punches the bottom surface of punch tape 2200 opposite to first cell 2202a. First die 104 moves out of first cell 2202a towards tag substrate 116a. Underfill material 3402a contacts tag substrate 116a. As shown in FIG. 42, punching member 4102 moves first die 104 until first die 104 comes into contact with tag substrate 116a.

In optional step 3010, the first surface of each die is attached to the corresponding tag substrate so that the at least one contact pad of each die is electrically coupled to at least one corresponding contact pad of the corresponding tag substrate. For example, first die 104 is attached to tag substrate 116a such that contact pads 204a–d are electrically coupled to contact areas 210a–d of tag substrate 116a. First die 104a may be attached to tag substrate 116a in a variety of ways. For example, step 3010 may include the step where underfill material 3402 is cured to attach each die 104 to the corresponding tag substrate 116. A curable underfill material 3402 may be flash curable, thermally curable, acoustically curable, electron beam curable, ultraviolet (UV) light curable, infrared (IR) light curable, pressure curable, and other type of curable material. Hence, heat, an acoustic source, an electron beam, UV light, IR light, and/or pressure may be applied as needed to cure underfill material 3402. A two-party epoxy may be used for a flash curable underfill material, for example.

In an embodiment, curing of underfill material 3402 causes underfill material 3402 to contract or shrink. By contracting, underfill material 3402 can cause a decrease in a distance between each die 104 and the corresponding tag substrate 116, leading to improved mechanical and/or electrical coupling of contact pads 204a–d of each die 104 to the corresponding contact areas 210a–d of the corresponding tag substrate 116. In such an embodiment, underfill material 3402 has a thermal coefficient of expansion/contraction that dictates the amount of contraction when cured. By selecting the material used for underfill material 3402, this coefficient can be tuned. Hence, the thermal coefficient of underfill material 3402 can by tuned to match that of tag substrate 116, or otherwise. For instance, underfill material 3402 can be tuned to contract by a particular amount, such as 2 times or 3 times its mass, for example. Underfill material 3402 can be alternatively be tuned to apply a particular force over an area, such as 50 kg/cm$^2$, for example.

For example, the contraction of underfill material 3402 can cause contact pads 204a–d to come into contact with the corresponding contact areas 210a–d, creating a sufficient electrical connection for operation of the resulting device. Contact pads 204a–d and/or contact areas 210a–d may be substantially uniform in their smoothness or flatness so that a large area may come into contact between them. In another example, contact pads 204a–d and/or contact areas 210a–d may be non-uniform in smoothness or flatness to enhance connectivity. For instance, contact pads 204a–d (and/or contact areas 210a–d) may have one or more bumps, spikes, peaks, etc. Thus, when contact pads 204a–d come into contact with contact areas 210a–d, the one or more bumps, spikes, or peaks can partially or completely penetrate or pierce contact areas 210a–d, creating an enhanced electrical and mechanical connection.

In another example, in an embodiment, underfill material 3402 includes electrically conductive microspheres to provide electrical connectivity. The microspheres may be gold, silver, other metal, or combination/alloy of metals, for example. Hence, when curing the contractable underfill material causes the underfill material to contract, a pressure is created between each die and corresponding tag substrate. The increased pressure causes the microspheres to form a contact between the die and substrate, and to deform, to electrically couple contact pads 204a–d to contact areas 210a–d.

After die 104a is attached to tag substrate 116a, die 104b can be similarly attached to tag substrate 116b. Alternatively, dies 104a and 104b can be simultaneously attached to their respective tag substrates.

Figure 43:
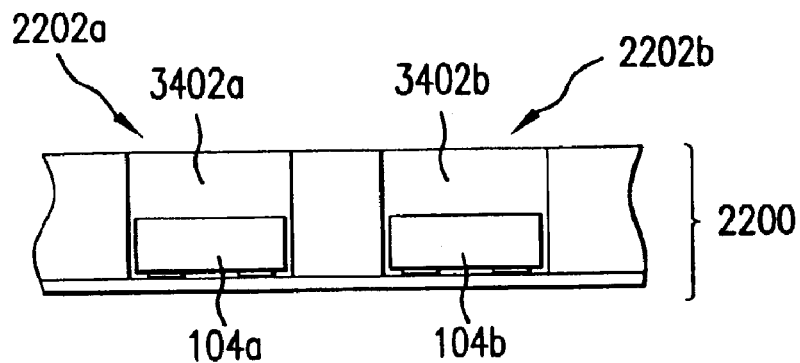

In the example of FIGS. 32–42, dies 104 are oriented to be mounted on tag substrate 116 in a pads down fashion. FIGS. 43–47 shows an example where dies 104 are oriented to be mounted on tag substrate 116 in a pads up fashion. For example, as shown in FIG. 43, first and second dies 104a and 104b have been inserted into cell 2202a and 2202b such that contact pads 204a–d face into the cells.

Figure 44:
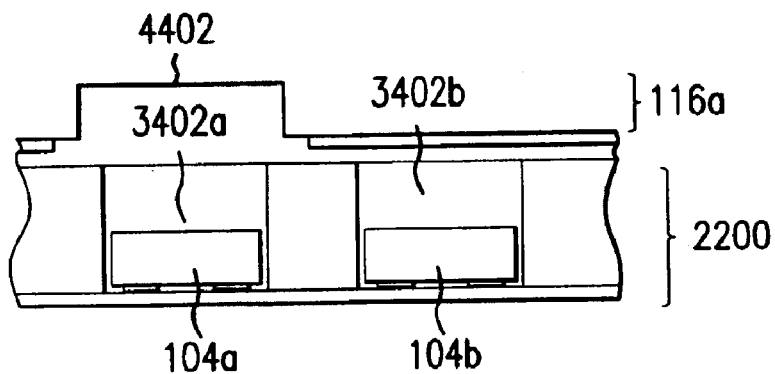
Figure 45:
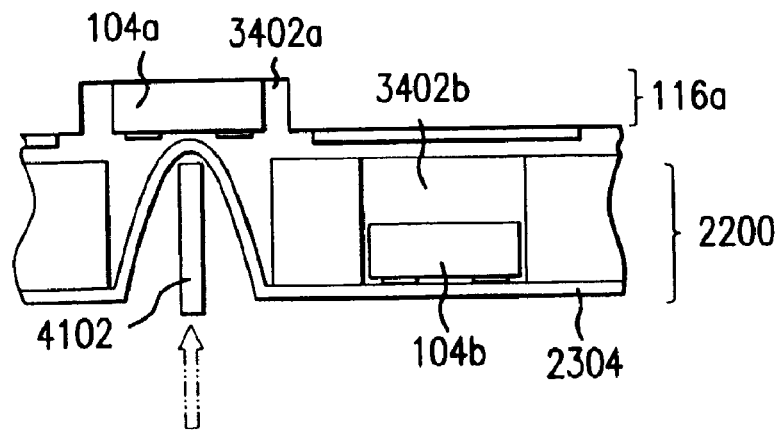

As shown in FIG. 44, punch tape 2200 is positioned closely adjacent to tag substrate 116a of substrate structure 2802a. As shown in FIG. 45, punch tape 2200 is punched proximate to a location of cell 2202a to move die 104a out of cell 2202a into a corresponding cell or cavity 4402 in tag substrate 116a such that underfill material 3402a substantially fills a gap between an outer edge of die 104a and cavity 4402. As shown in FIG. 45, a surface of die 104a and a surface of underfill material 3402a is substantially flush or even with the surface of tag substrate 116a.

Figure 46:
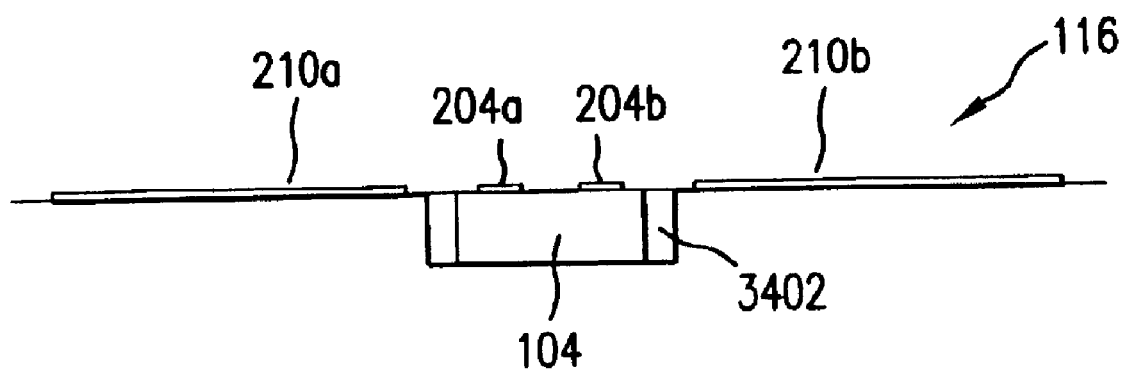
FIGS. 46 and 47 show views of the formation of electrical conductors on a substrate.
Figure 47:
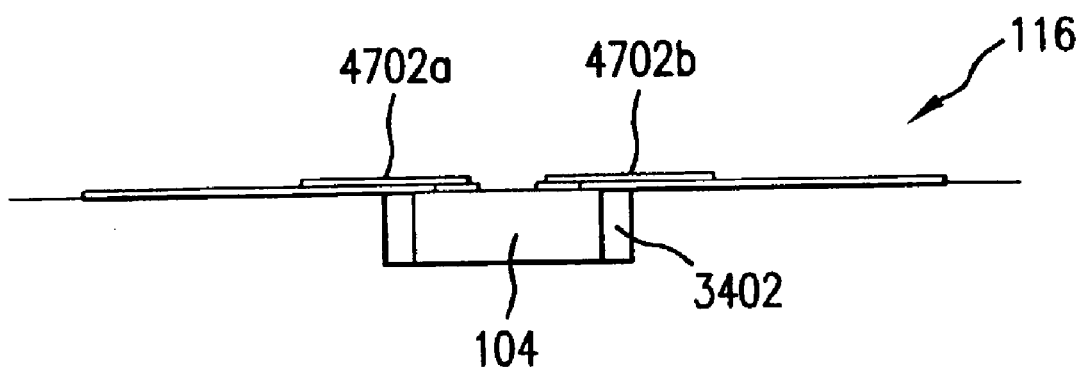

FIG. 46 shows a single die 104 attached in a cavity of tag substrate 116. As shown in FIG. 46, in the current example, contact pads 204a and 204b of die 104 are not electrically coupled to signals of tag substrate 116. FIG. 47 shows contact pads 204a and 204b of die 104 having been electrically coupled to contact areas 210a and 210b of tag substrate 116 by first and second electrical conductors 4702a and 4702b. For example, electrical conductors 4702 can be printed, applied by a vapor deposition process, soldered, and otherwise formed between contact pads 204 of each die 104 and contact areas 210 on the surface of the corresponding tag substrate 116.

2.1.3 Multi-barrel Die Transfer

Figure 48A:
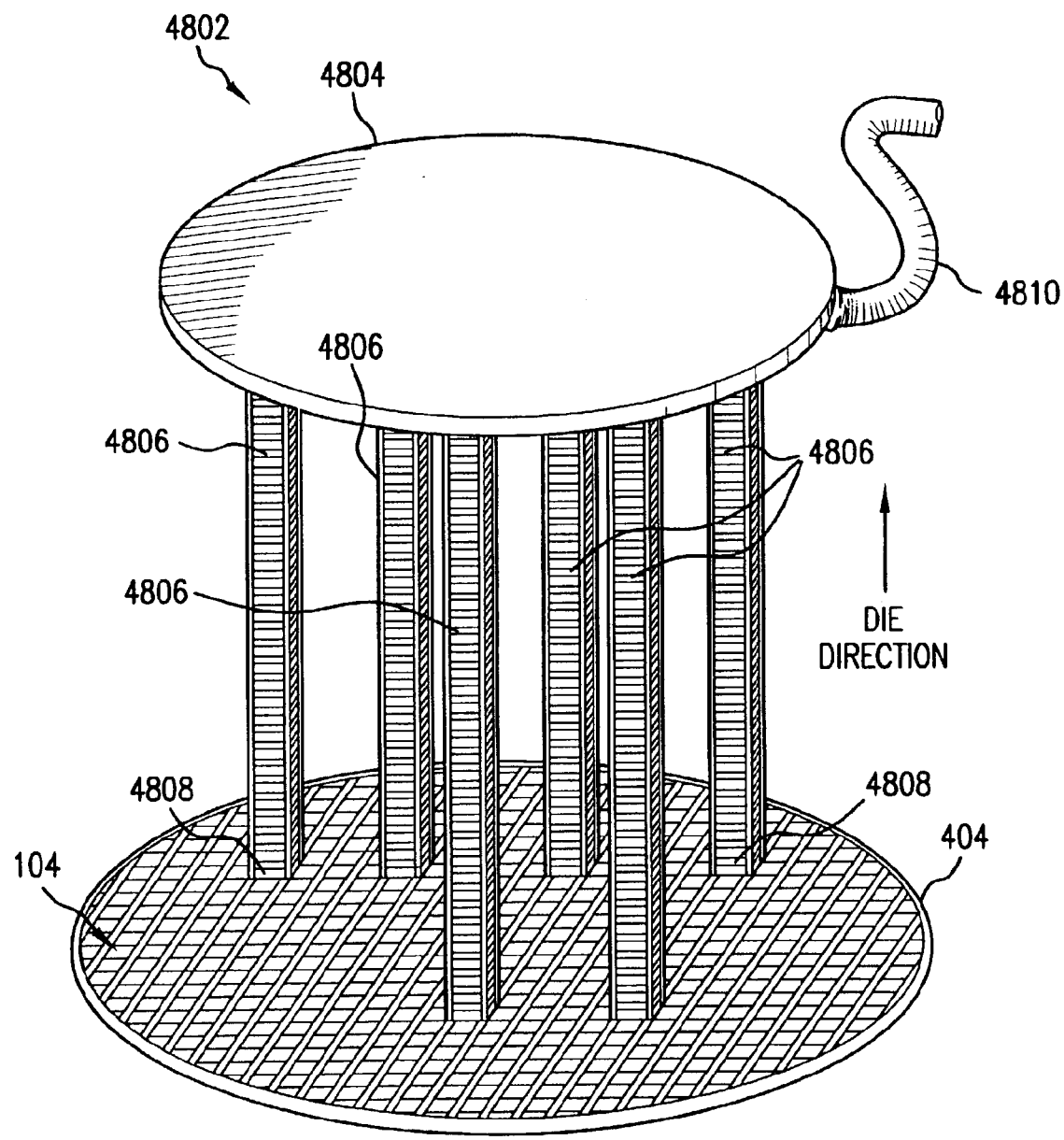
FIGS. 48A and 48B show views of an example multi-barrel die transfer apparatus, according to an embodiment of the present invention.

According to an embodiment of the present invention, a plurality of dies 104 may be transferred from a first surface to a second surface using a multi-barrel die transfer apparatus. FIG. 48A shows an example multi-barrel die transfer apparatus 4802, according to an embodiment of the present invention. Multi-barrel die transfer apparatus 4802 includes a body 4804, and a plurality of barrels 4806. Body 4804 couples barrels 4806 to a gas supply and vacuum source 4810. For example, a gas such as air, nitrogen, or other gas may be supplied by vacuum source 4810. In embodiments, any number of one or more barrels 4806 may be present, but typically multiple barrels 4806 are present to increase the transfer rate of dies 104 by a factor of the number of barrels 4806 present. For example, tens or hundreds of barrels may be present.

Figure 48B:
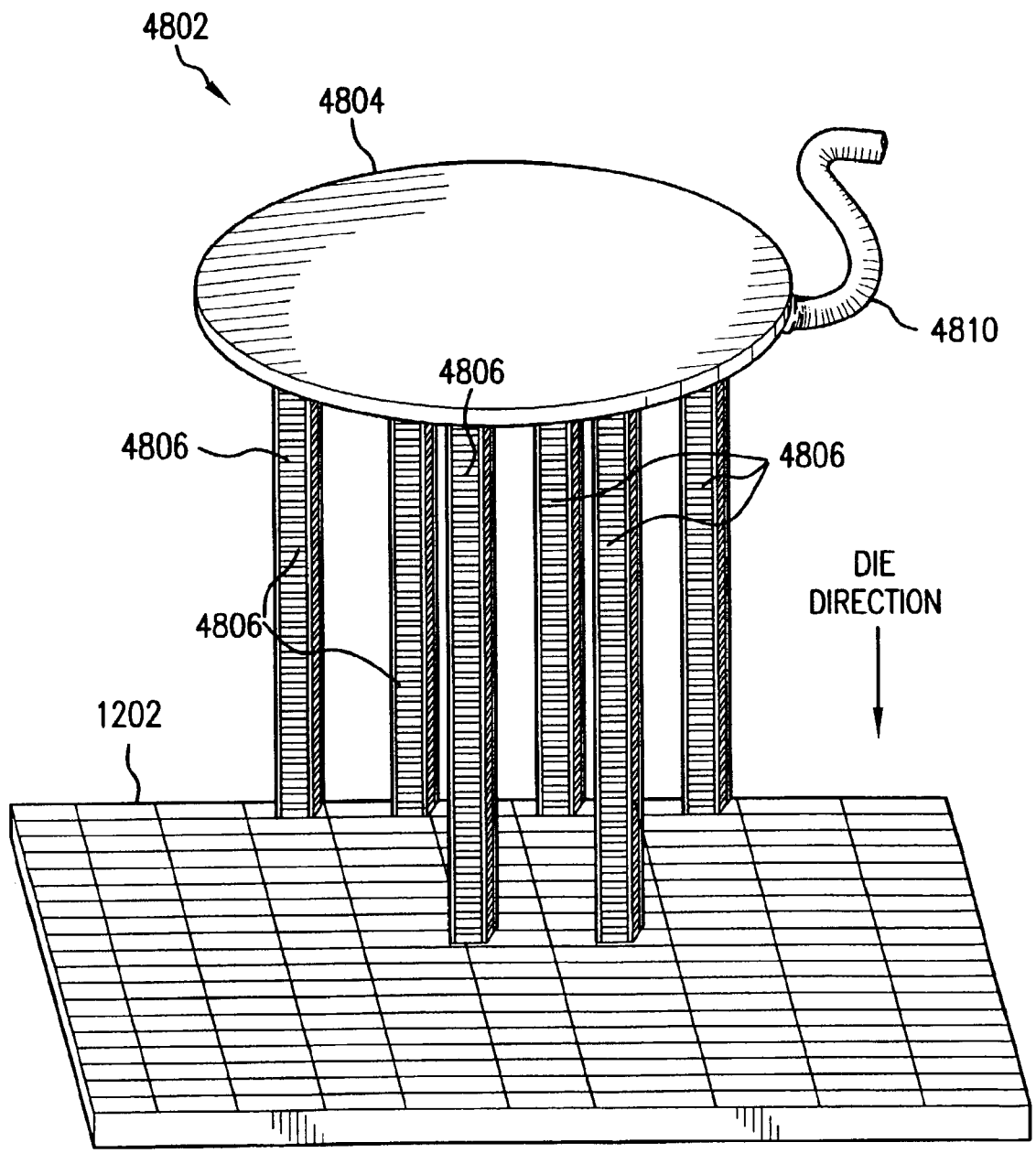

As shown in FIG. 48A, multi-barrel transfer apparatus 4802 having a plurality of barrels 4806 is positioned over separated dies 104 attached to a first surface. The first surface is shown as support surface 404 in the example of FIG. 48A. Each barrel 4806 is positioned so that a respective end 4808 of the barrel 4806 is over a respective die 104 on support surface 404. Multi-barrel transfer apparatus 4802 receives the dies 104, storing them in stacks of dies 104 in the plurality of barrels 4806. As shown in FIG. 48B, multi-barrel transfer apparatus 4802 is then positioned over a second surface. The second surface is shown as transfer surface 1202 in the example of FIG. 48B. Multi-barrel transfer apparatus 4802 deposits the dies 104 stored in the barrels 4806 on the second surface.

Figure 49:
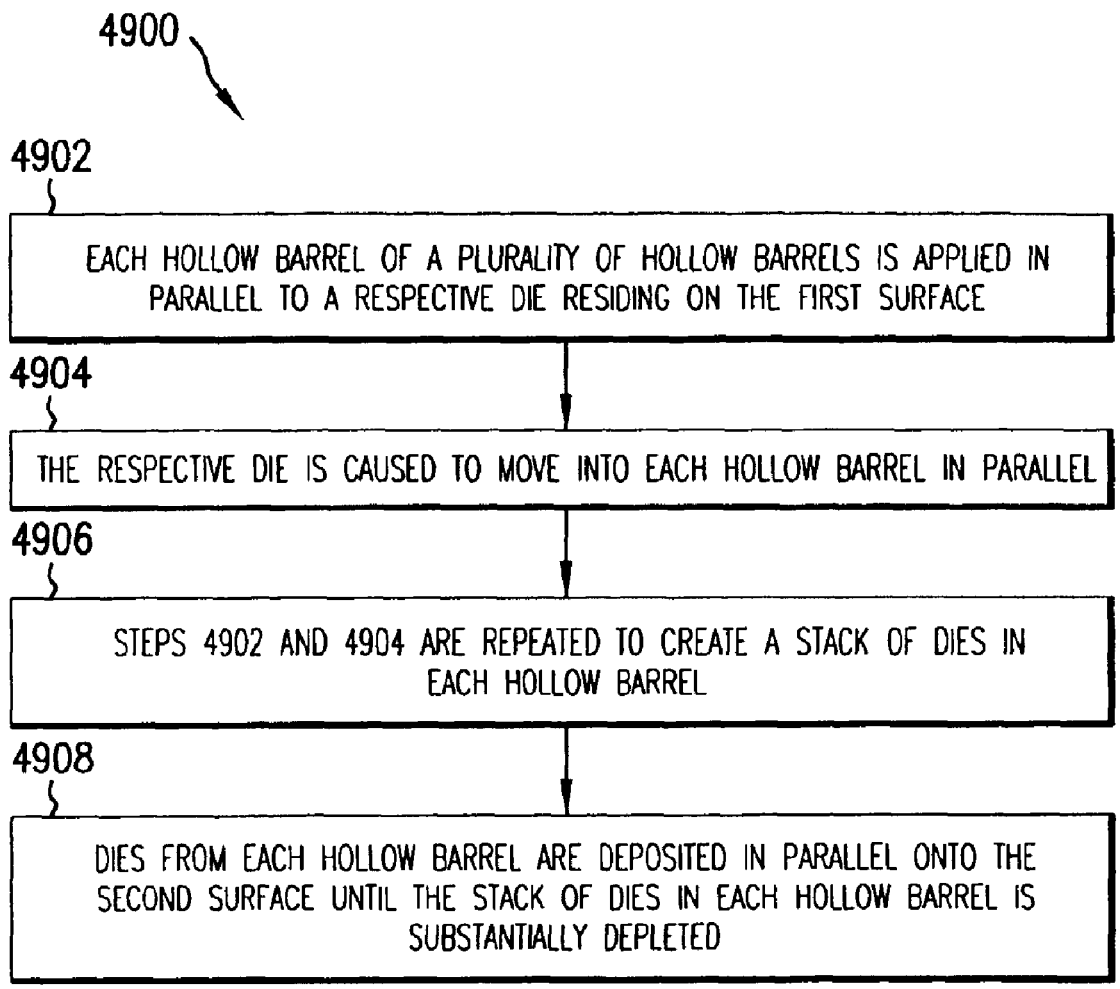
FIG. 49 shows a flowchart providing example steps for transferring dies using a multi-barrel die transfer apparatus, according to an embodiment of the present invention.

FIG. 49 shows a flowchart 4900 providing example steps for transferring dies, according to an embodiment of the present invention. For illustrative purposes, steps of flowchart 4900 may be further described in regards to multi-barrel transfer apparatus 4802, as shown in FIGS. 49–52. However, other structural embodiments will be apparent to persons skilled in the relevant art(s) based on the following discussion. These steps are described in detail below.

Figure 50:
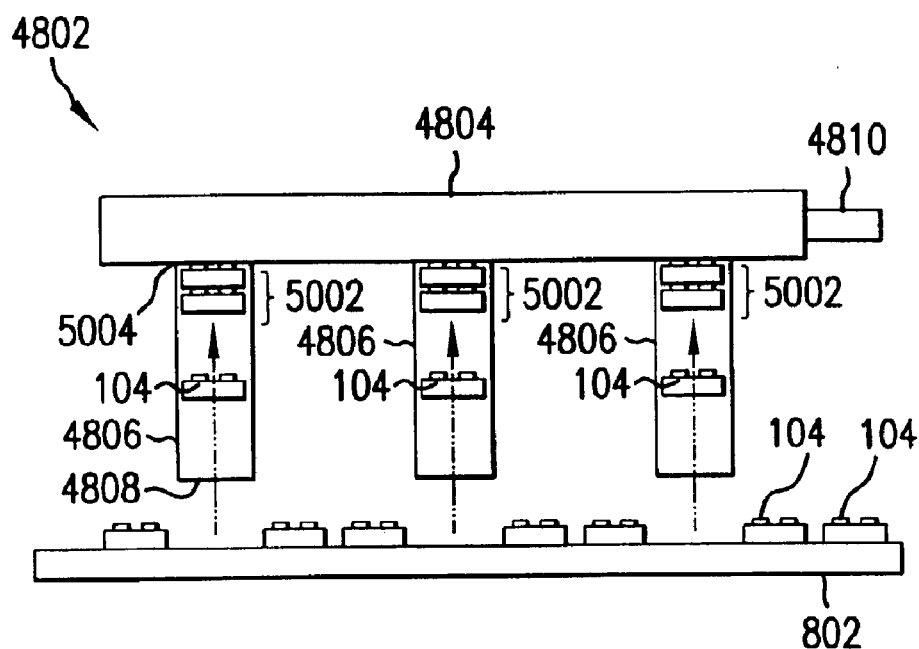
FIG. 50 shows a cross-sectional view of a multi-barrel transfer apparatus being applied to first surface.

Flowchart 4900 begins with step 4902. In step 4902, each hollow barrel of a plurality of hollow barrels is applied in parallel to a respective die residing on the first surface. For example, FIG. 50 shows a cross-sectional view of multi-barrel transfer apparatus 4802 being applied to first surface 802. The plurality of hollow barrels are barrels 4806. Barrels 4806 are hollow so that at least a single die 104 may pass into barrel 4806 at a time, and be stored therein. As shown in FIG. 48A, each barrel 4806 is applied in parallel with the other barrels 4806 to a respective die 104 on the first surface.

In step 4904, the respective die is caused to move into each hollow barrel in parallel. For example, as shown in FIG. 50, each hollow barrel 4806 has a respective die 104 that has moved into the respective hollow barrel 4806.

In step 4906, steps 4902 and 4904 are repeated to create a stack of dies in each hollow barrel. Hence, for example, multi-barrel transfer apparatus 4802 may be moved as many times as needed to position barrels 4806 over respective dies so that barrels 4806 may collect the respective dies 104. For example, as shown in FIG. 50, enough dies 104 have moved into each barrel 4806 to create a stack 5002 of dies 104 in each barrel 4806. Stack 5002 as shown in FIG. 50 includes two dies 104, but in embodiments may include any number of dies 104, including tens, hundreds, thousands, and even more dies.

Figure 51:
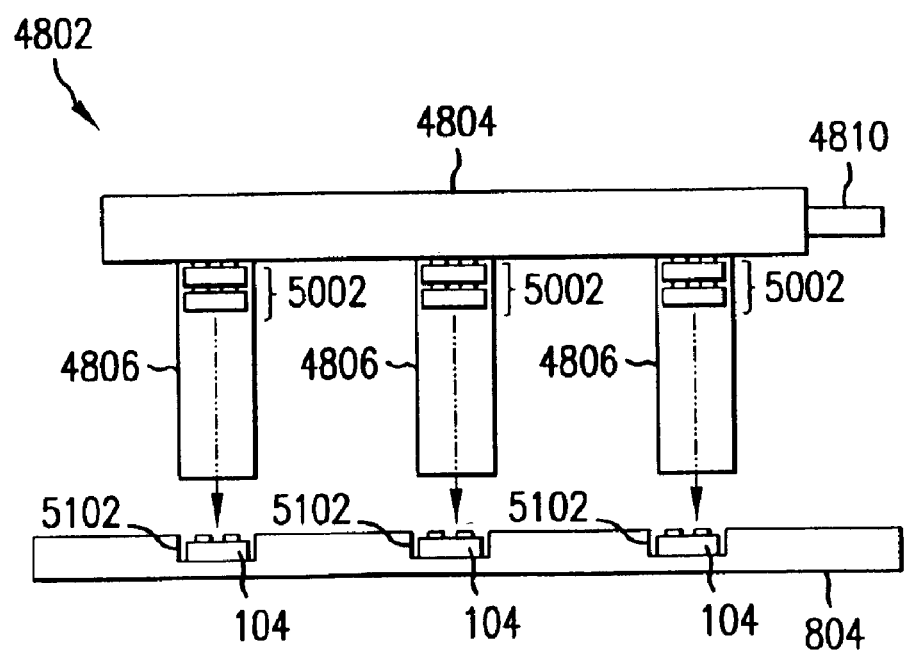
FIGS. 51 and 52 show cross-sectional views of a multi-barrel transfer apparatus transferring dies to second surfaces.
Figure 52:
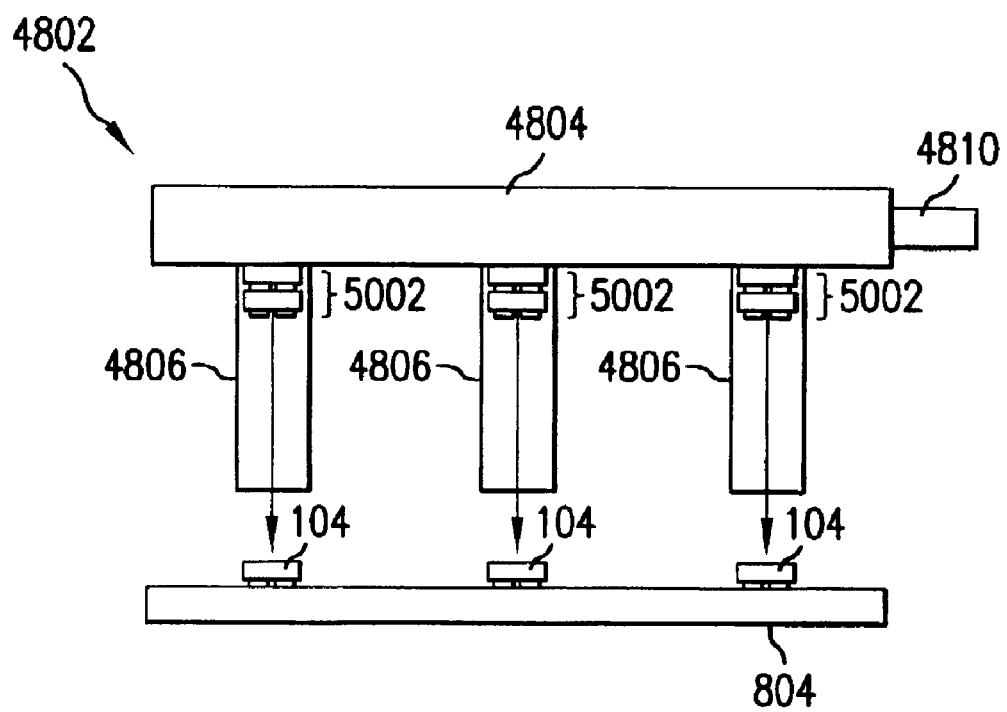

In step 4908, dies from each hollow barrel are deposited in parallel onto the second surface until the stack of dies in each hollow barrel is substantially depleted. For example, FIGS. 51 and 52 show cross-sectional views of multi-barrel transfer apparatus 4802 being applied to various second surfaces 804. As shown in FIGS. 51 and 52, barrels 4806 of multi-barrel transfer apparatus 4802 are depositing dies 104 in parallel onto second surface 804. Barrels 4806 deposit dies 104 until they are substantially depleted of dies 104. In other words, barrels 4806 can deposit varying amounts of dies 104 onto second surface 804, depending on the number of dies required by second surface 804, and/or until one or more barrels 4806 are near or completely depleted of dies 104.

Second surface 804 may have an adhesiveness that allows for dies 104 to stick thereto. For example, second surface 804 may be an adhesive tape, or may have an adhesive material, such as a wax substance applied thereto to provide the adhesiveness. As shown in FIG. 51, second surface 804 has cells 5102 formed therein, in which dies 104 are deposited from barrels 4806. Alternatively, as shown in FIG. 52, second surface 804 may have a substantially planar surface onto which dies 104 are deposited. Furthermore, as shown in FIGS. 51 and 52, dies may be deposited in a pads down or pads up orientation. Barrels 4806 may be reversed end for end after collecting dies 104 in order to change the orientation of dies 104 before being deposited on second surface 804. For example, ends 4808 and 5004 shown in FIG. 50 may be reversed after collecting dies 104. Alternatively, barrels 4806 can be left un-reversed.

In an embodiment, a vacuum may be used in steps 4904 and 4908 to move dies in and out of barrels 4806. For example, a vacuum source 4810 is shown attached to multi-barrel transfer apparatus 4804 in FIGS. 48A, 48B, and 50–51. Vacuum source 4810 may be applied to multi-barrel transfer apparatus 4804 to cause a vacuum or suction in one or more barrels 4806 to move respective dies 104 into the barrel(s) 4806. The vacuum or suction may be continuous or applied in controlled bursts. Vacuum source 4810 may also be applied or varied to move dies 104 out of barrels 4806 onto second surface 804. For example, vacuum source 4810 may apply bursts of positive pressure to move individual dies 104 out of barrels 4806.

Figure 53:
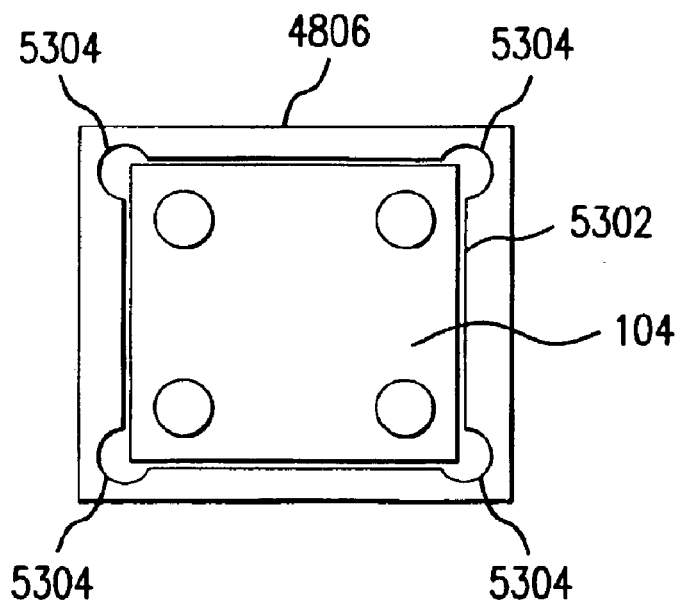
FIG. 53 shows a cross-sectional top view of an example barrel with die inside, according to an embodiment of the present invention.

Barrels 4806 may be configured to allow for proper application of vacuum source 4810. FIG. 53 shows a cross-sectional top view of an example barrel 4806 with die 104 inside, according to an embodiment of the present invention. Barrel 4806 may be rectangular as shown in FIG. 53, or may be round, or other shapes. Barrel 4806 may have a smooth interior surface 5302 in an embodiment of the present invention. Alternatively, as shown in FIG. 53, interior surface 5302 may have a channel 5304 formed in one or more corners to allow gas to pass around dies 104. Channels 5304 may be used to control the vacuum or pressure in barrels 4806.

Barrels 4806 may be made from a metal, plastic, or other applicable material. For example, barrels 4806 may be barrels, tubes, or needles similar to hypodermic needles. Barrels 4806 are configured to collectively hold any number of dies 104. In an embodiment, the number and length of each barrel 4806 will be configured to have a cumulative die 104 holding capacity of at least one wafer worth of dies 104. For example, the cumulative holding capacity may be on the order of 50,000 to 100,000 of dies 104.

The filled multi-barrel die collet can be moved, robotically or otherwise, to a die dispensing station for tag assembly. An empty multi-barrel die collet can then be positioned adjacent to a new wafer of separated die on a support surface to repeat the process.

Note that other mechanisms and/or processes may alternatively be used in step 4904 to cause dies to move into each hollow barrel, and in step 4908 to deposit dies from each hollow barrel. For example, mechanical structures and forces, chemical processes and forces, electrostatic forces, adhesive materials, a gas pressure system, and further mechanisms and processes may be used, as would be understood by persons skilled in the relevant art(s) from the teachings herein.

2.1.4 Die Transfer Using a Die Frame

According to an embodiment of the present invention, a plurality of dies 104 may be transferred to a target surface using a "die frame" or "wafer tape." The die frame or wafer tape is formed directly from a wafer to hold the dies of the wafer such that they may be easily transferred to the target surface. Dies may be transferred from the die frame/wafer tape to an intermediate surface, or directly to a final surface, such as a substrate. Thus, the die frame or wafer tape of the present invention allows for fewer required manufacturing steps when transferring dies to a substrate compared to conventional transfer processes. For example, in a typical conventional process, dies are individually transferred from the wafer to an intermediate transfer surface by a pick-and-place machine. The dies are then transferred from the intermediate surface to the final destination surface. This two step process allows for the dies to be flipped. According to the present invention, dies can be directly transferred from the die frame/wafer tape to a substrate, without transfer to an intermediate surface. Furthermore, the dies can be flipped or not flipped by the transfer, as needed.

Figure 57A:
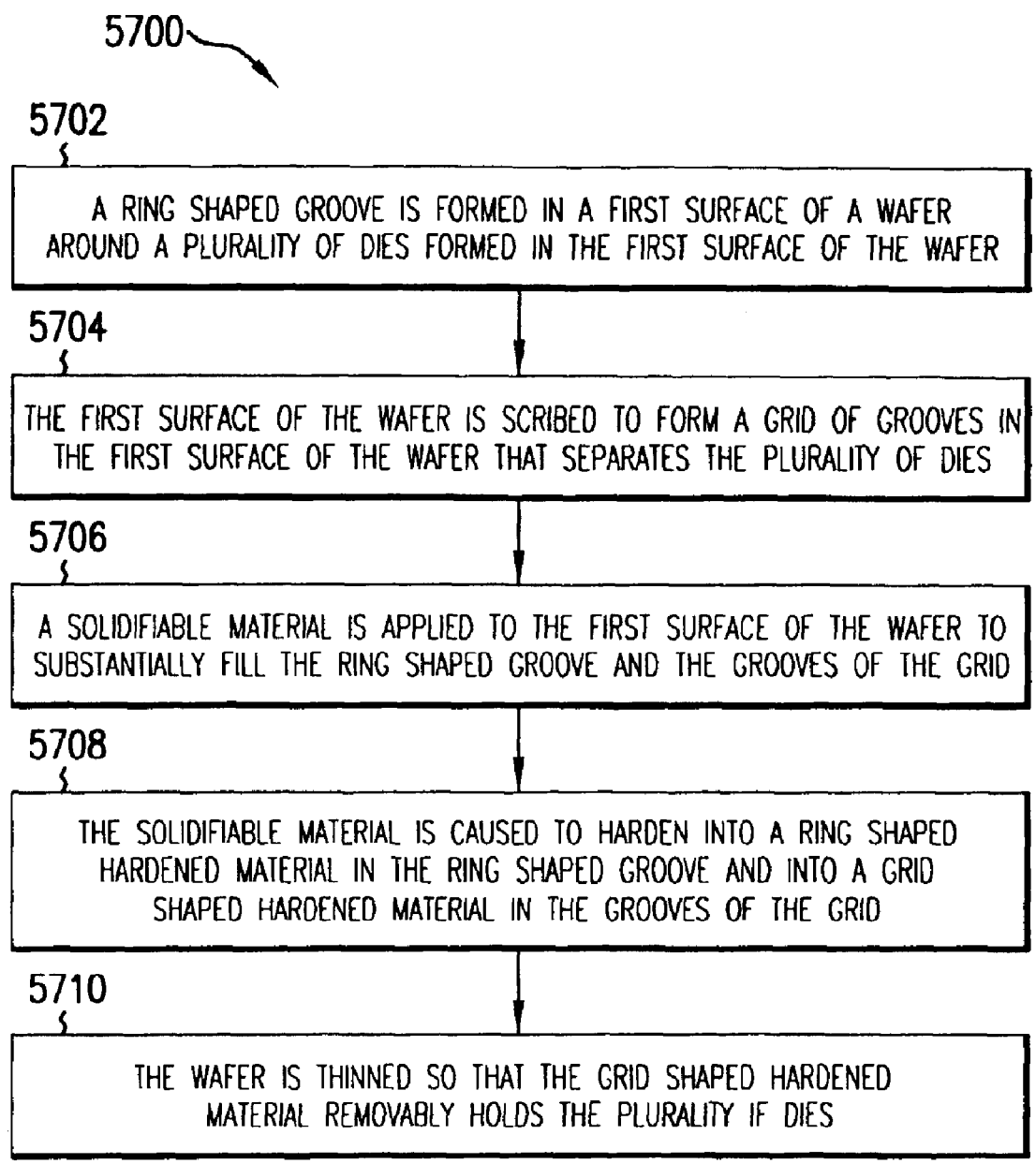
Figure 66:
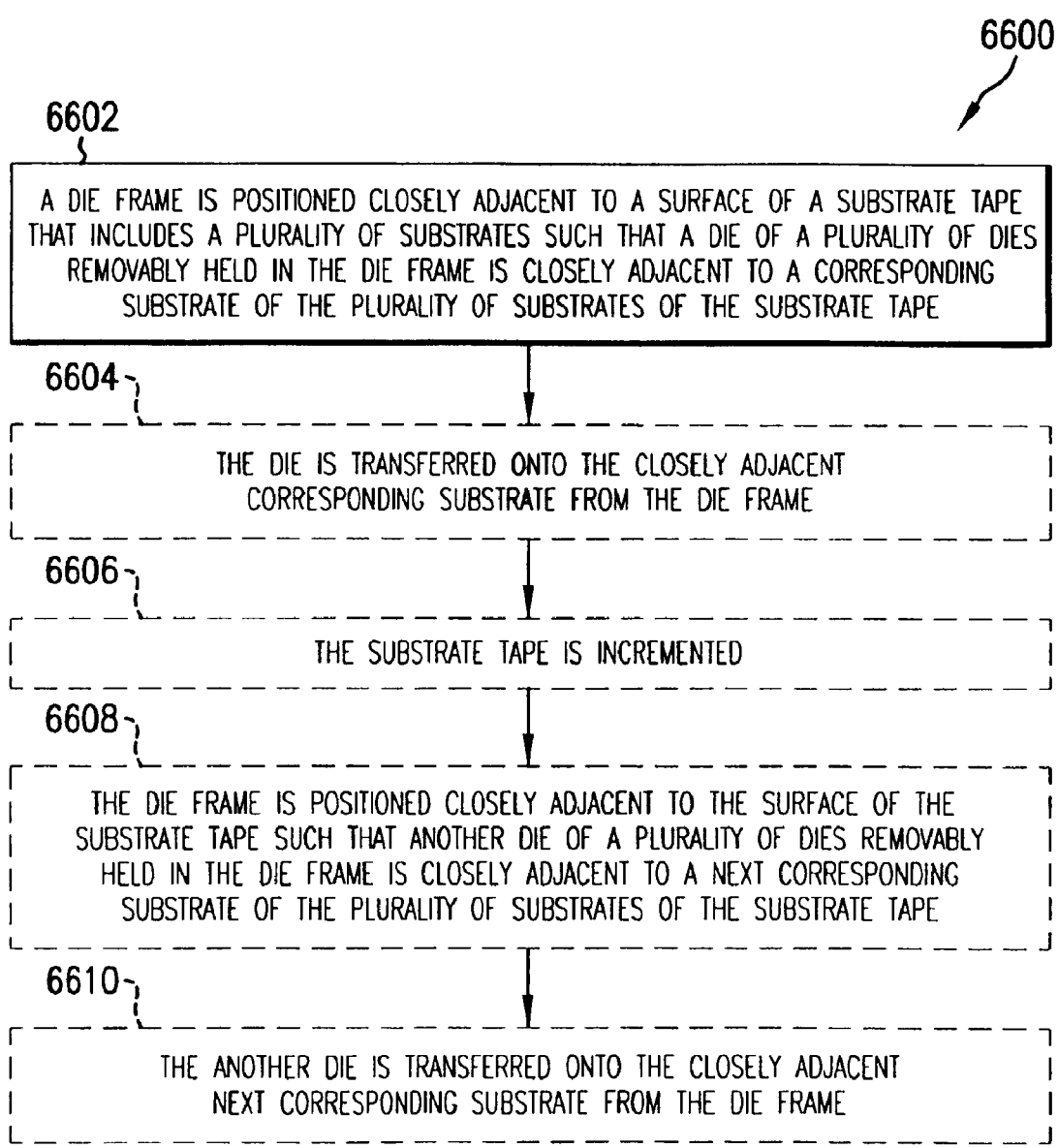
FIG. 66 shows a flowchart providing example steps for transferring dies using a die frame, according to an embodiment of the present invention.
Figure 68A:
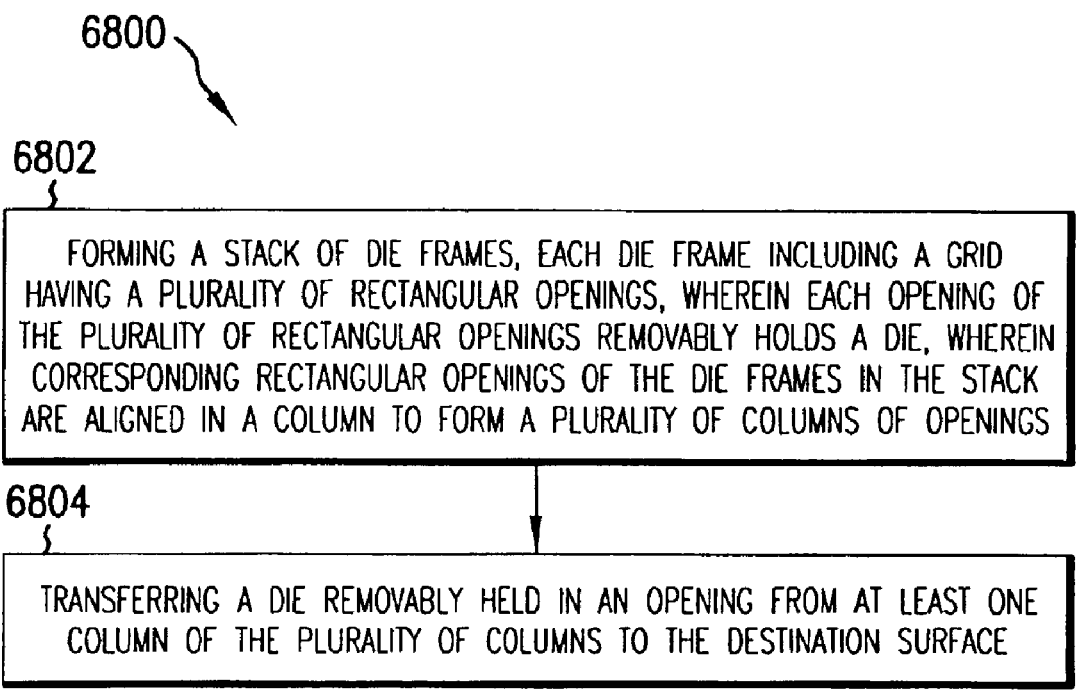
FIGS. 68A and 68B show flowcharts providing example steps for transferring dies using a die frame, according to embodiments of the present invention.
Figure 68B:
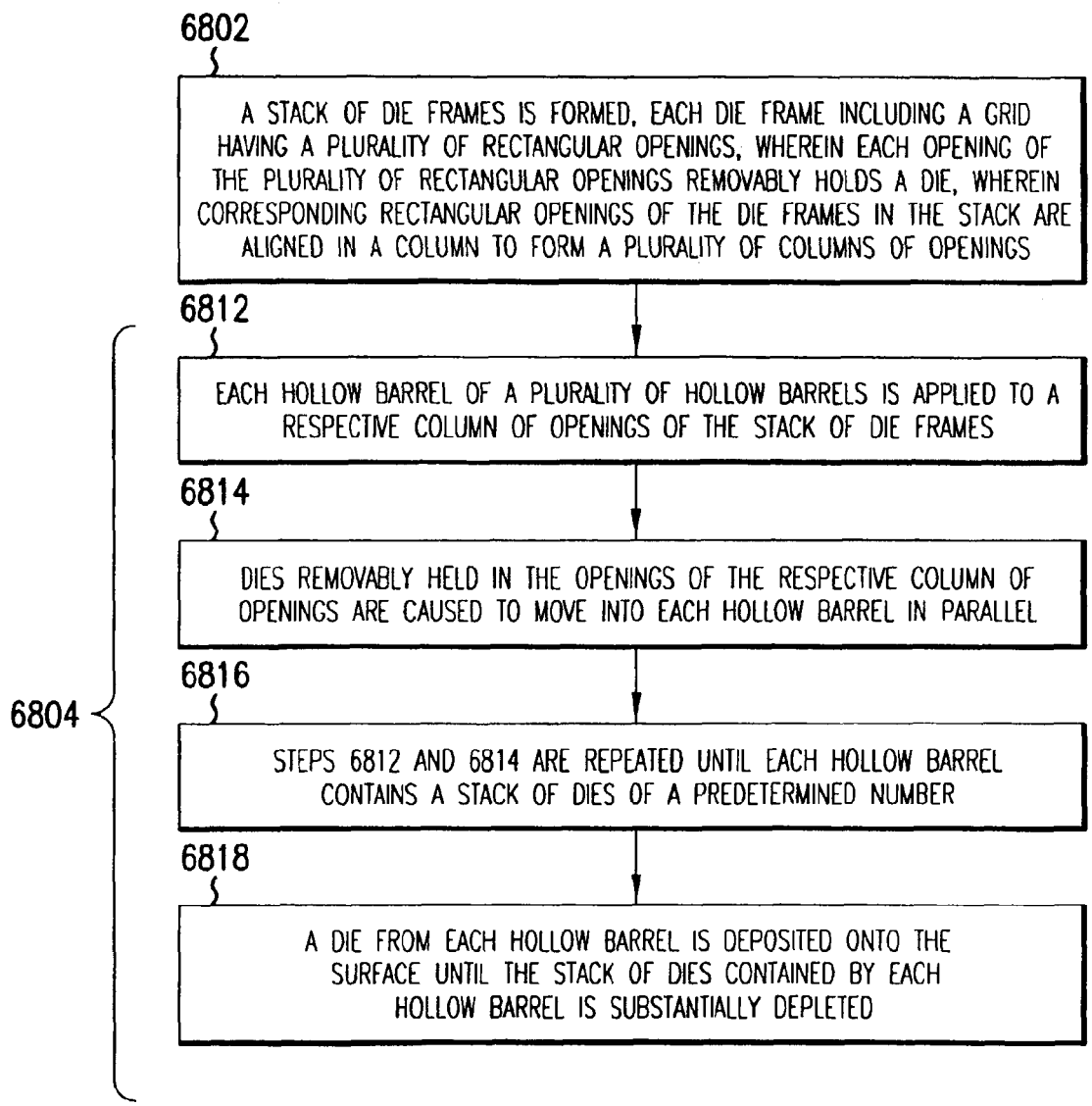

Note that the die frame/wafer tape of the present invention is referred to below as a die frame, for ease of description. The die frame may be formed according to processes of the present invention, some examples of which are described below for purposes of illustration, and not limitation. FIGS. 57A and 57B show flowcharts for making a die frame, according to example embodiments of the present invention. Further embodiments for the die frame of the present invention, and for making the die frame of the present invention, will be apparent to persons skilled in the relevant arts based on the following discussion. Furthermore, FIGS. 66 and 68A–B show example flowcharts for transferring dies using a die frame, according to example embodiments of the present invention. Further embodiments for transferring dies using the die frame of the present invention will be apparent to persons skilled in the relevant arts based on the discussion herein.

Figure 58:
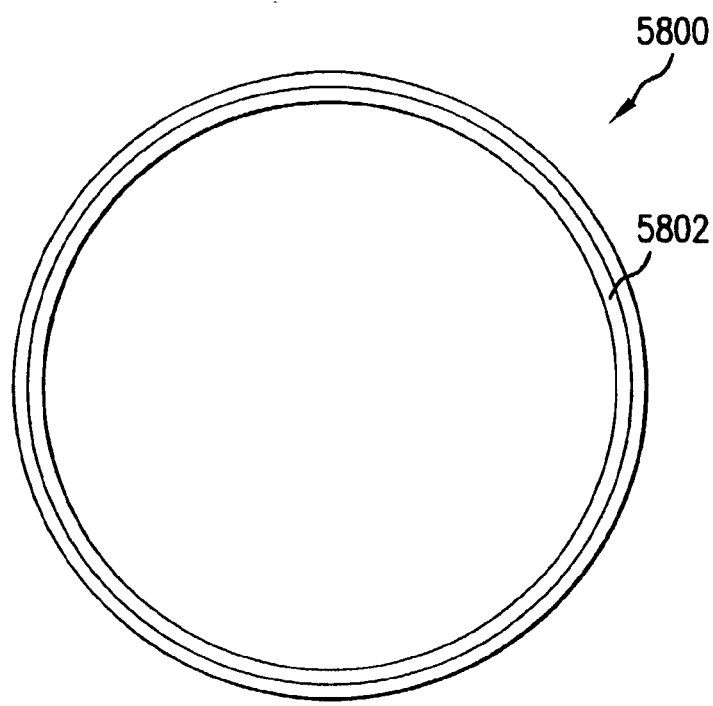
FIGS. 58–62 show example views of a wafer at different process steps while being formed into a die frame, according to embodiments of the present invention.

FIG. 57A shows a flowchart 5700 providing example steps for making a die frame, according to an embodiment of the present invention. Flowchart 5700 will be described below in relation to FIGS. 58–63, for illustrative purposes. Flowchart 5700 begins with step 5702. In step 5702, a ring shaped groove is formed in a first surface of a wafer around a plurality of dies formed in the first surface of the wafer. For example, FIG. 58 shows an example wafer 5800. As shown in FIG. 58, a ring shaped groove 5802 has been formed in a surface of wafer 5800 closely adjacent to an outer edge of wafer 5800. For example, the depth of ring shaped groove 5802 may be approximately equal to the thickness of an integrated circuit die, such as die 104, that is formed in the surface of wafer 5800 (not shown in FIG. 58). In the example of FIG. 58, ring shaped groove 5802 is substantially round or elliptical, and is continuous. In alternative embodiments, ring shaped groove 5802 may be formed in other shapes, including square or other polygon. Furthermore, ring shaped groove 5802 does not necessarily have to be continuous, as shown in the example of FIG. 58, but may be instead be non-continuous, and for example, may include two or more separate portions formed in the surface of wafer 5800.

Figure 59:
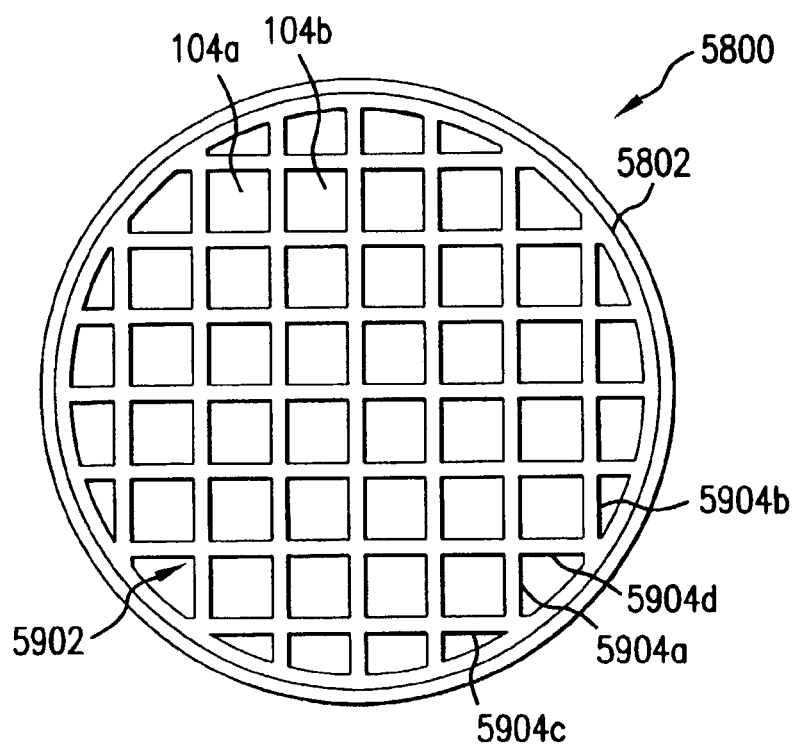

In step 5704, the first surface of the wafer is scribed to form a grid of grooves in the first surface of the wafer that separates the plurality of dies. For example, FIG. 59 shows wafer 5800 after having been scribed. The scribing of wafer 5800 has created a grid 5902 in the surface of wafer 5800. Grid 5902 is formed from a plurality of horizontal and vertical grooves 5904 formed in the surface of wafer 5800. For example, a first groove 5904A, a second groove 5904B, a third groove 5904C, and a fourth groove 5904D of grid 5902 are indicated in FIG. 59. Within grid 5902 resides a plurality of areas of the surface of wafer 5800 in which dies 104 may reside. For example, FIG. 59 shows an area for a first die 104a and an area for a second die 104b that reside within grid 5902. Note that features of dies 104 are not shown in FIG. 58 and FIG. 59.

Figure 60:
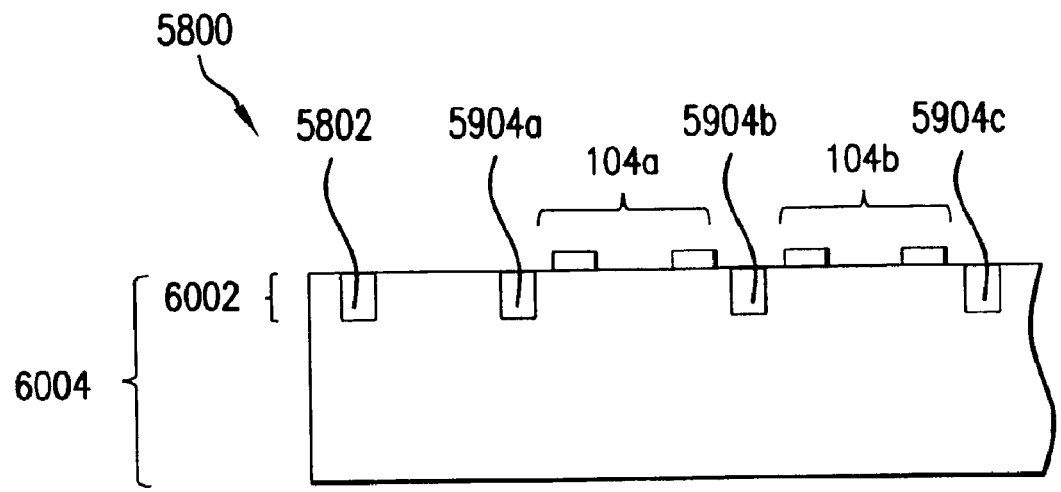

FIG. 60 shows a cross sectional view of a portion of wafer 5800. As shown in FIG. 60, ring shaped groove 5802 and grooves 5904a and 5904b have a thickness or depth of depth 6002. For example, depth 6002 may be 100 micrometers, or other thickness. Depth 6002 is typically equal to or greater than a thickness of a die of wafer 5800. As shown in FIG. 60, wafer 6004 has a thickness 6004. Thickness 6004 can be any thickness of a conventional or special purpose wafer, which may be 600 to 700 micrometers or other thickness, for example.

Figure 61:
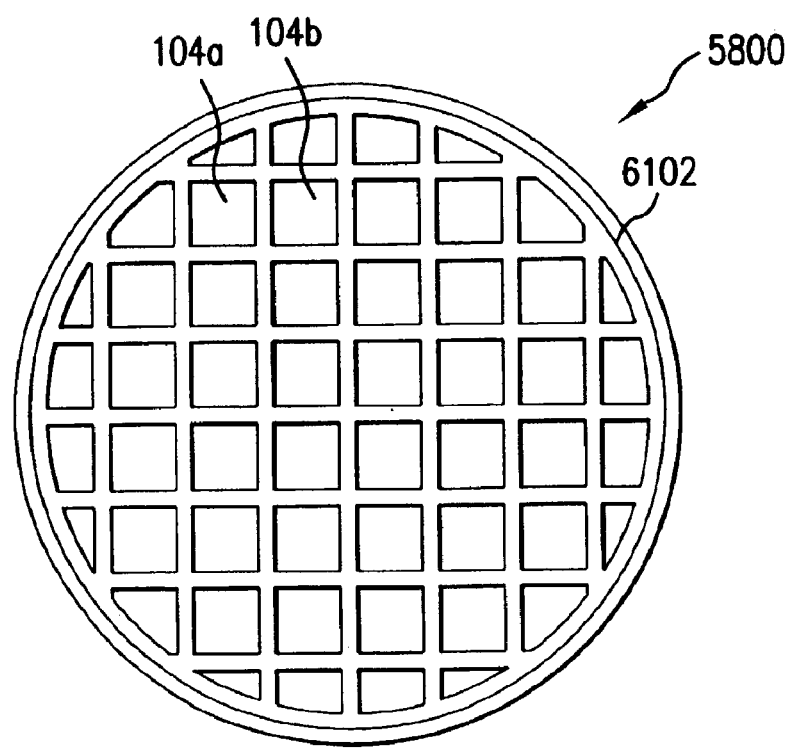
Figure 62:
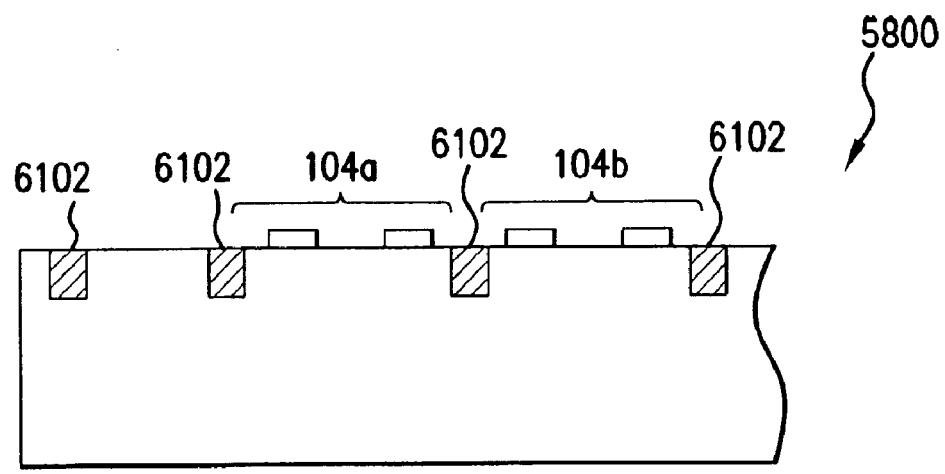

In step 5706, a solidifiable material is applied to the first surface of the wafer to substantially fill the ring shaped groove and the grooves of the grid. FIG. 61 shows, for example, a solidifiable material 6102 that has been applied to the surface of wafer 5800 to substantially fill ring shaped groove 5802 and grooves 5904 of grid 5902. Solidifiable material 6102 substantially fills ring shaped groove 6102 and grooves 5904. For example, solidifiable material 6102 may fill the grooves to a level below the surface of wafer 5800, to the same level as the surface of wafer 5800 (as shown in FIG. 62), or even to slightly protrude above the surface of wafer 5800. Solidifiable material 6102 may be a polymer, epoxy, resin, urethane, glass, or other material, for example.

A variety of processes may be used to cause solidifiable material 6102 to fill grooves 5802 and 5904 when applied to wafer 5800, without leaving a substantial excess amount of solidifiable material 6102 otherwise on the surface of wafer 5800. For example, a vacuum source may be applied to the opposite surface of wafer 5800, or to a tape, such as a blue or green tape, to which wafer 5800 is attached, to cause solidifiable material 6102 to be pulled into grooves 5802 and 5904. In another embodiment, a gas source may direct a gas towards the surface of wafer 5800 to which solidifiable material 6102 is being applied, to blow, force, or push solidifiable material 6102 into grooves 5802 and 5904. In another embodiment, solidifiable material 6102 is applied to the surface of wafer 5800 in a spin-coating fashion, such that a spinning motion of wafer 5800 causes solidifiable material 6102 to move or "wick" into grooves 5802 and 5904. Solidifiable material 6102 may be applied in additional ways to fill grooves 5802 and 5904, including by "squeegee" application, spraying, vapor deposition, physical deposition, or chemical deposition.

In step 5708, the solidifiable material is caused to harden into a ring shaped hardened material in the ring shaped groove, and into a grid shaped hardened material in the grooves of the grid to form the die frame. For instance, in the example of FIGS. 61 and 62, solidifiable material 6102 is caused to hardened in ring shaped groove 5802, and in grooves 5904 of grid 5902. In an embodiment, the hardened material is formed by causing solidifiable material 6102 to hardened by a curing process. Hence, solidifiable material 6102 may be any curable material, such as a curable polymer, epoxy, resin, urethane, glass, or other material, for example. Solidifiable material 6102 may be a material that is caused to harden in a variety of ways, including by heat, by allowing a sufficient amount of time for solidifiable material 6102 to hardened on its own, by applying light, or by other ways described elsewhere herein or otherwise known.

Figure 63:
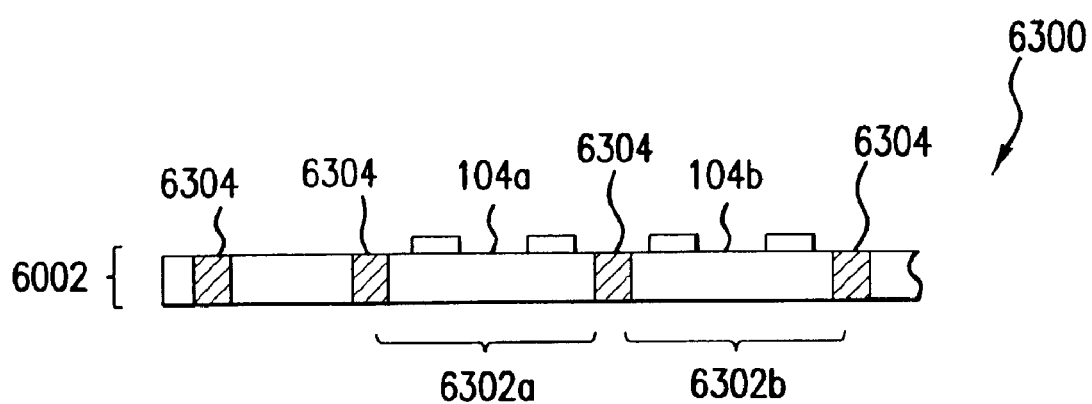
FIG. 63 shows a cross-sectional view of an example die frame, according to an embodiment of the present invention.

In step 5710, the wafer is thinned such that the grid shaped hardened material removably holds the plurality of dies. For example, FIG. 63 shows a die frame 6300 formed according to the present invention. Die frame 6300 includes a hardened material 6304 resulting from the hardening of solidifiable material 6102 in ring shaped groove 5802 and grooves 5904 of grid 5902, as described above. Die frame 6300 further results from the thinning of wafer 5800. As shown in FIG. 63, wafer 5800 has been thinned to form die frame 6300 of a thickness of approximately depth 6002. In embodiments, die frame 6300 can be formed or thinned to have a thickness of approximately equal to depth 6002, or a lesser thickness. Thus, because die frame 6300 has a thickness approximately equal to or less than depth 6002, die frame 6300 removably holds dies 104 in corresponding openings 6302. In other words, dies 104 can be easily removed from openings 6302. For example, as shown in FIG. 63, die frame 6300 removably holds die 104A in opening 6302A, and removably holds die 104B in an opening 6302B. Die frame 6300 provides a support structure in the shape of ring shaped groove 5802 and grid 5904 that is capable of removably holding dies 104 in openings 6302. Dies 104 may be removed from die frame 6300 by pushing, poking, or otherwise forcing them out of openings 6302 from either surface of die frame 6300 onto another surface. Depending on which surface of die frame 6300 that dies 104 are forced from will determine whether dies 104 are transferred to a surface in either a pads up or a pads down orientation.

Note that wafer 5800 may be thinned in step 5710 according to any conventional or otherwise known means. Furthermore, note that solidifiable material 6102 is selected so that it does not substantially adhere to die 104, so that dies 104 may be easily removed from die frame 6300 and are thus removably held therein.

Figure 64A:
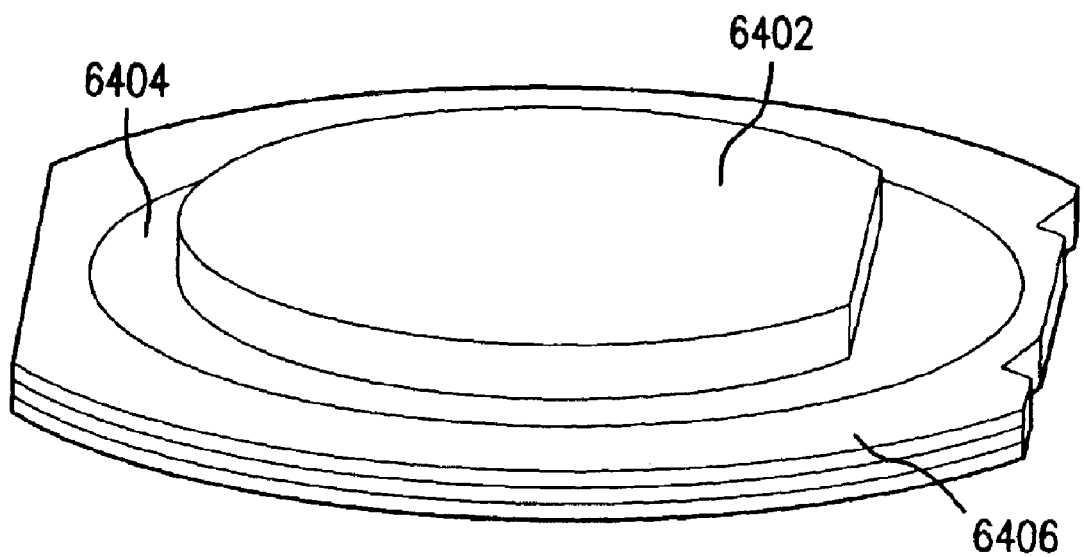
FIGS. 64A–64C show views of a scribed wafer attached to an adhesive surface, and held in a wafer frame.
Figure 64B:
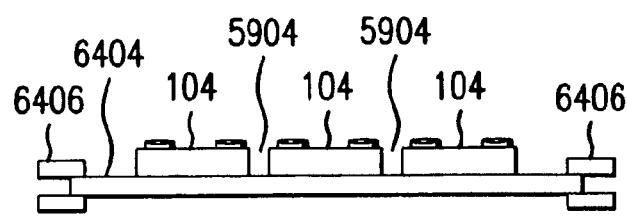
Figure 64C:
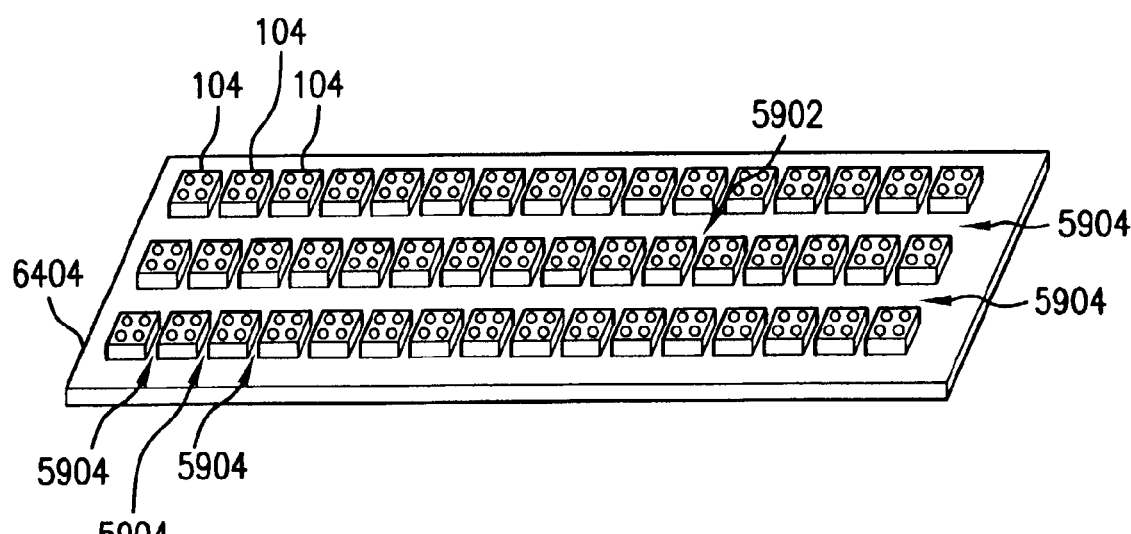

FIG. 57B shows a flowchart 5720 providing example steps for making a die frame, according to another embodiment of the present invention. Flowchart 5720 will be described below in relation to FIGS. 64A–64C, 65A, and 65B, for illustrative purposes. Flowchart 5720 begins with step 5722. In step 5722, a wafer attached to an adhesive surface is scribed such that a resulting plurality of dies are separated by a grid of grooves that extend through the wafer to the adhesive surface. For example, FIG. 64A shows a scribed wafer 6402 attached to an adhesive surface 6404. Adhesive surface 6404 is held in a wafer frame 6406. Wafer frame 6406 may also be referred to as a wafer carrier or tape ring. For example, adhesive surface 6404 may be a green tape, blue tape, or other adhesive surface type. Wafer frame 6406 holds and supports adhesive surface 6404 in a taut fashion so that scribed wafer 6402 may be accessed. Because wafer 6402 has been scribed, wafer 6402 has a grid 5902 of grooves 5904 (not shown in FIG. 64A) that separates the dies 104 of wafer 6402. Wafer 6402 is scribed so that grooves 5904 extend through wafer 6402 to adhesive surface 6404. Hence, dies 104 of wafer 6402 are individually attached to adhesive surface 6404. FIG. 64B shows a cross-sectional view of an example scribed wafer 6402 having three dies 104 separated by grooves 5904. Note that wafer 6402 is shown with three dies 104 for purposes of illustration, and not of limitation. FIG. 64C shows a perspective view of a portion of an example scribed wafer 6402 attached to adhesive surface 6404, having a plurality of dies 104 separated by grooves 5904 of grid 5902.

Figure 65A:
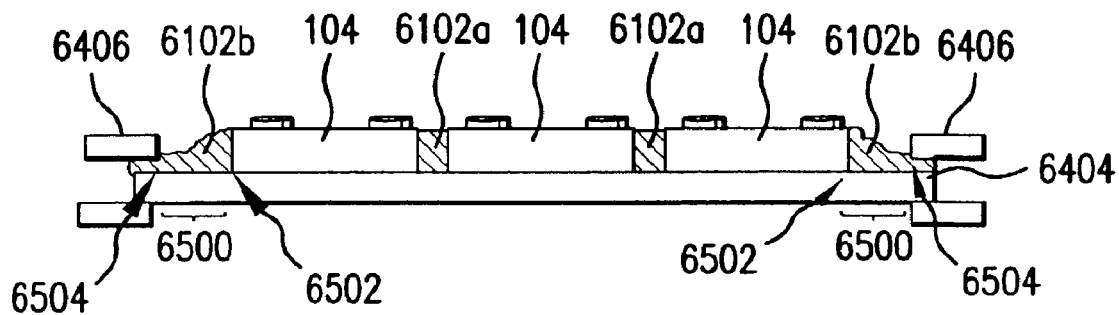
FIGS. 65A and 65B show the scribed wafer of FIGS. 64A–64C with a solidifiable material applied thereto, according to example embodiments of the present invention.

In step 5724, a solidifiable material is applied to the scribed wafer to substantially fill the grooves of the grid. For example, as shown in FIG. 65A, solidifiable material 6102 is applied to scribed wafer 6402 to partially or completely fill grooves 5904 between dies 104. As shown in FIG. 65A, solidifiable material 6102a fills grooves 5904 between dies 104. In an embodiment, solidifiable material 6102 may be applied such that solidifiable material 6102b is present to fill a space 6500 on adhesive surface 6404 between an outer edge 6502 of wafer 6402 and an inner edge 6504 of wafer frame 6406. Note that in an embodiment, solidifiable material 6102 may even extend partially within wafer frame 6406, as shown in FIG. 65A, although this is not required. Solidifiable material 6102 may be applied in any manner described elsewhere herein, such as is described above in relation to FIGS. 61 and 62, or otherwise known.

In step 5726, the solidifiable material is caused to harden into a grid shaped hardened material in the grooves of the grid. For example, solidifiable material 6102a and 6102b shown in FIG. 65A is caused to harden into a grid shaped hardened material, such as is described above for hardened material 6304 in relation to FIG. 63.

Figure 65B:
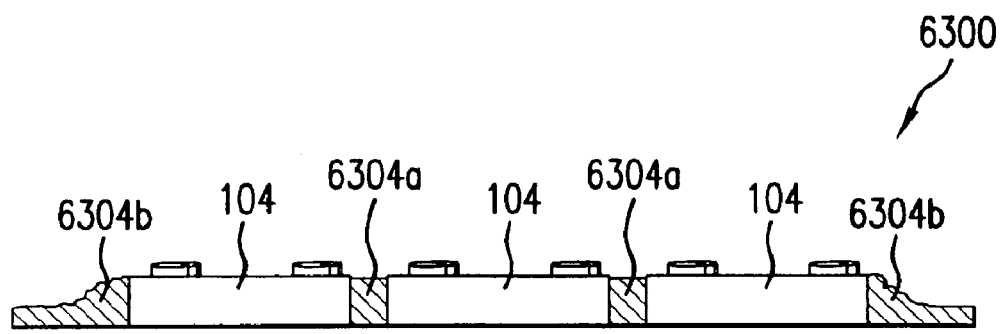

In step 5728, the adhesive surface is removed so that the grid shaped hardened material removably holds the plurality of dies. For example, FIG. 65B shows a die frame 6300 that results from the removal of adhesive surface 6404. Hardened material 6304a is present between dies 104, and hardened material 6304b is present outside of dies 104. Hardened material 6304 removably holds dies 104 in the shape of a grid in die frame 6300, as described above. Note that adhesive surface 6404 may be removed or detached by peeling, chemically dissolving, or otherwise removing it from die frame 6300.

Note that die frame 6300 may be formed in a pads up or pads down fashion. For example, flowchart 5720 may include steps similar to steps 702, 704, and 706 shown in flowchart 700 of FIG. 7, for flipping the orientation of dies 104 prior to performance of step 5722. Thus, the pads of dies 104 may be facing toward or away from adhesive surface 6404, depending on which orientation is selected.

The structure of die frame 6300 has numerous advantages. For example, the portion of die frame 6300 formed in a ring shape in ring shaped groove 5802 allows for a holding mechanism, such as a clamp or jig, to reliably hold die frame 6300 when being used for transferring dies, for example. The portion of die frame 6300 formed in a grid shape in grid 5904 allows for the holding of dies 104, with relative ease in removal of dies 104, as described below. The structure of die frame 6300 has further benefits. Note that in some embodiments, the ring shaped portion of die frame 6300 may not be necessary, and is not present.

Preferably, excess solidifiable material 6102 is not left on the surface of wafer 5800. In embodiments, flowchart 5700 may include an additional step that is performed prior to step 5704, where a layer of protective material is applied onto the surface of the wafer. The protective material, for example, may be a photo-resist material, or other protective material, which may be spin coated or otherwise applied to the surface of the wafer. Thus, in an embodiment, flowchart 5700 may also include the step where the protective material is removed from the surface of the wafer. For example, removing the protective material from the wafer can cause the removal of excess solidifiable material 6102 in its hardened state or in its unhardened state (i.e., prior to or after step 5708). For example, wafer 5800 may be immersed in a solvent, or may have a solvent applied thereto to dissolve the protective material from the surface of wafer 5800. The protective material may be removed from 5800 by other ways that are known to persons skilled in the relevant arts.

Die frame 6300 may be used to transfer dies 104 to a subsequent destination or transfer surface. The subsequent surface can be an intermediate surface, such as a blue or green tape, or intermediate surfaces otherwise known or described elsewhere herein, or may be used to transfer dies 104 to a final destination surface, such as a substrate. Furthermore, die frame 6300 allows for precise transfer of dies. For example, because the location of dies removably held in die frame 6300 is accurately known, precise registration of dies is present. Thus, expensive optical and/or other type registration systems may not be required to locate and accurately place dies.

FIG. 66 shows a flowchart 6600 providing steps for transferring a plurality of dies to a surface using a die frame, according to embodiments of the present invention. Note that steps of flowchart 6600 that are optional are shown enclosed in dotted lines. Flowchart 6600 will be described in relation to FIG. 67, for illustrative purposes. Further structural embodiments will be apparent to persons skilled in the relevant arts based on the following discussion.

Figure 67:
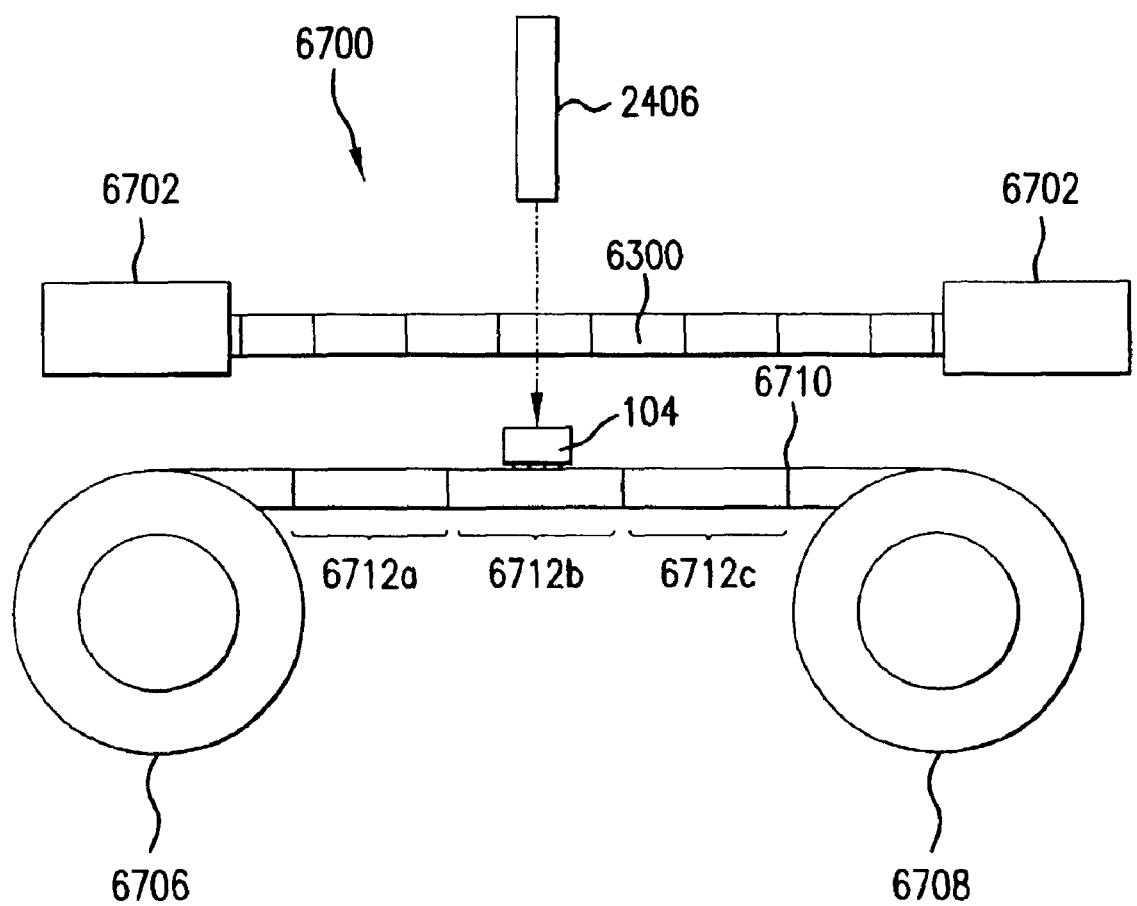
FIG. 67 shows a block diagram of dies being transferred from a die frame to a substrate tape, according to an example embodiment of the present invention.

Flowchart 6600 begins with step 6602. In step 6602, a die frame is positioned closely to a surface of a substrate tape that includes a plurality of substrates such that a die of a plurality of dies removably held in the die frame is closely adjacent to a corresponding substrate of the plurality of substrates of the substrate tape. For example, FIG. 67 shows a system 6700 for transferring dies to a surface using die frame 6300. System 6700 includes die frame 6300, punching member 2406, a die frame jig 6702, a first reel 6706, a second reel 6708, and a substrate tape 6710. As shown in FIG. 67, substrate tape 6710 includes a plurality of substrates 6712*a–c*. Substrate tape 6710 may include any number of substrates 6712. As shown in FIG. 67, die frame 6300 is positioned closely adjacent to a surface of substrate tape 6710. Die frame 6300 is positioned closely adjacent to substrate tape 6710 such that a die 104 may be punched from die frame 6300 to a substrate 6712 of substrate tape 6710, as is described below.

In step 6604, the die is transferred onto the closely adjacent corresponding substrate from the die frame. As shown in FIG. 67, die 104 has been transferred from die frame 6300 to a surface of substrate 6712*b* of substrate tape 6710. For example, as shown in FIG. 67, die 104 may be punched from die frame 6300, which removably holds die 104, onto substrate 6712*a*. For example, a punching mechanism 2406 may be used to punch die 104 from die frame 6300 onto substrate 6712*a*. In further embodiments, other mechanisms may be used to transfer die 104 from die frame 6300 to a substrate 6712.

Multiple dies may be transferred from die frame 6300 to substrate tape 6710 in this manner. In step 6606, the substrate tape is incremented. For instance, as shown in the example of FIG. 67, substrate tape 6710 may include a plurality of substrates 6712 that are serially arranged. Substrate tape 6710 may be incremented according to a reel-to-reel system, such as shown in FIG. 67. In FIG. 67, a first reel 6706 may supply substrate tape 6710 to a second reel 6708, which receives substrate tape 6710. By turning first and second reels 6706 and 6708, substrate tape 6710 may be incremented to move a next substrate 6712 into position to receive a die 104 from die frame 6300. Other mechanisms may be used to increment substrate tape 6710. Furthermore, in alternative embodiments, substrate tape may include an N×M array of substrates 6712, where N>1 and M>1, instead of having substrates 6712 serially aligned.

In step 6608, the die frame is positioned closely adjacent to the surface of the substrate tape such that another die of a plurality of dies removably held in the die frame is closely adjacent to a next corresponding substrate of the plurality of substrates of the substrate tape. For example, shown in FIG. 67, die frame 6300 is held in a die frame jig 6702. Die frame jig 6702 may be moved laterally relative to substrate tape 6710 to position the next die 104 over the next substrate 6712, such as substrate 6712*a* or 6712*b*. Because the size of a die 104 is well known, the die frame jig 6702 may be repositioned by the width or length of a die 104, instead being repositioned by an optical and/or other registration system type which has to determine the location of a die. For example, in an embodiment, for a 500×500 micron sized die, die frame jig 6702 may be moved by 500 microns (possibly plus the width of a groove 5904) to place the next die 104 into position for transfer. Note that the present invention is applicable to any size die.

In step 6610, another die is transferred onto the closely adjacent next corresponding substrate from the die frame. Thus, in this manner a plurality of dies 104 may be transferred from die frame 6300 on to corresponding substrates 6712 of substrate tape 6710. In this manner, for example, a large number of tag substrate/die combinations may be created in a relatively rapid fashion, in fewer steps than with conventional processes.

Note that multiple die frames 6300 may be placed in a stack, from which dies 104 may be transferred to a destination surface. The dies 104 may be transferred from the stack of die frames 6300 to the destination surface using a punching mechanism, a vacuum/gas source, and any other mechanism described elsewhere herein or otherwise known. For example, FIG. 68A shows a flowchart 6800 providing steps for transferring a plurality of dies to a surface using a stack of die frames, according to another embodiment of the present invention. Note that steps of flowchart 6800 that are optional are shown enclosed in dotted lines. Further structural embodiments will be apparent to persons skilled in the relevant arts based on the following discussion.

Figure 69:
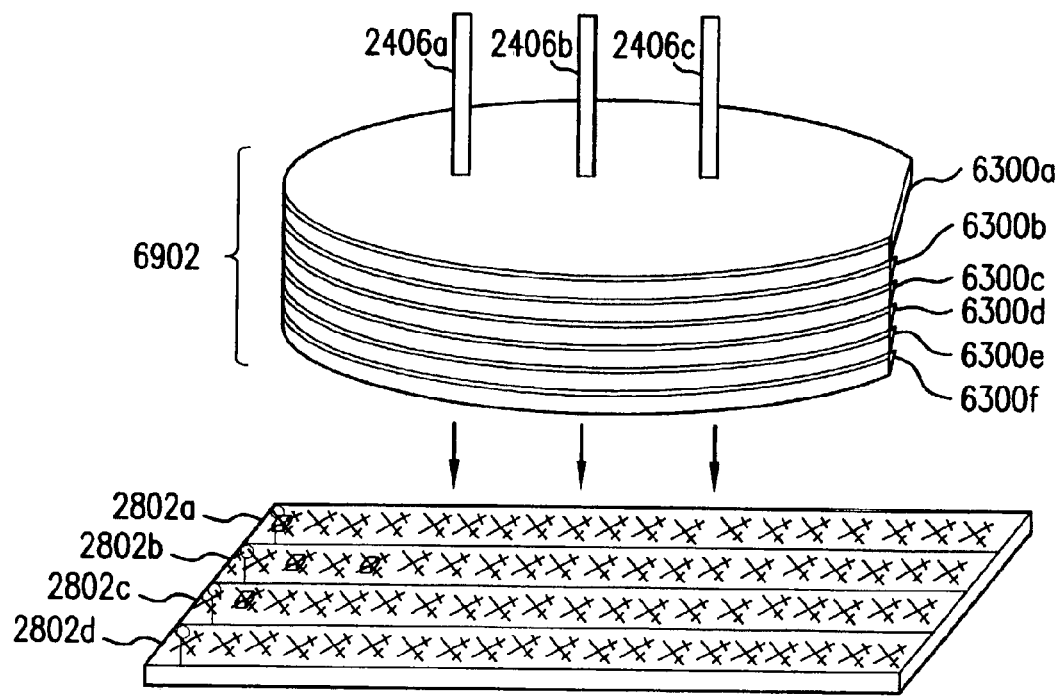
FIG. 69 shows a system for transferring dies from a stack of die frames to a substrate structure, according to an example embodiment of the present invention.

Flowchart 6800 will be described in relation to FIG. 69, for illustrative purposes. Flowchart 6800 begins with step 6802. In step 6802, a stack of die frames is formed, each die frame including a grid having a plurality of rectangular openings, wherein each opening of the plurality of rectangular openings removably holds a die, wherein corresponding rectangular openings of the die frames in the stack are aligned in a column to form a plurality of columns of openings. For example, FIG. 69 shows a stack of die frames 6902. Stack 6902 includes a plurality of die frames 6300. For illustrative purposes, stack 6902 is shown including six die frames 6300*a–f*, but may include any number of two or more die frames 6300. As described above, each die frame 6300 includes hardened material 6304 shaped in the form of grid 5902. A plurality of openings 6302 are present in each die frame 6300, each removably holding a die 104. Die frames 6300 are aligned so that corresponding openings 6302 form columns in the stack 6902 (not shown in FIG. 69).

In step 6804, a die removably held in an opening is transferred from at least one column of the plurality of columns to the destination surface. In other words, one or more dies 104 are transferred from stack 6902 from one or more columns to the destination surface. Dies 104 may be transferred in numerous ways from stack 6902. For example, as shown in FIG. 69, one or more punching members 2406 may be applied to corresponding columns of openings 6302 in stack 6902. A punching member 2406 pushes through stack 6902 to move dies 104 from the respective column of openings 6302 in stack 6902 to the destination surface. A punching member 2406 may be stepped to push out a single die 104 at a time. Any number of punching members 2406 may operate in parallel, such as punching members 2406*a–c* as shown in the example of FIG. 69, to increase the rate of die transfer.

Other processes for transferring dies 104 from stack 6902 may be used, including the use of a gas or vacuum source to apply gas pressure, electrostatic force, pick and place devices, and processes described elsewhere herein, or otherwise known. Another example such process is described in detail below with respect to FIG. 68B.

Note that the destination surface may be a substrate tape or structure, as shown in FIG. 69. Alternatively, the destination surface may be a punch tape or chip carrier, such as shown in FIG. 22, any intermediate surface, such as a green tape or blue tape, or any other surface. Furthermore, dies 104 may be transferred to the destination surface in a pads up or down configuration, depending on the orientation of stack 6902. Stack 6902 may be inserted into a die deposition apparatus that holds and aligns the respective die frames 6300 in a stack, and allows dies to be transferred therefrom.

Figure 70:
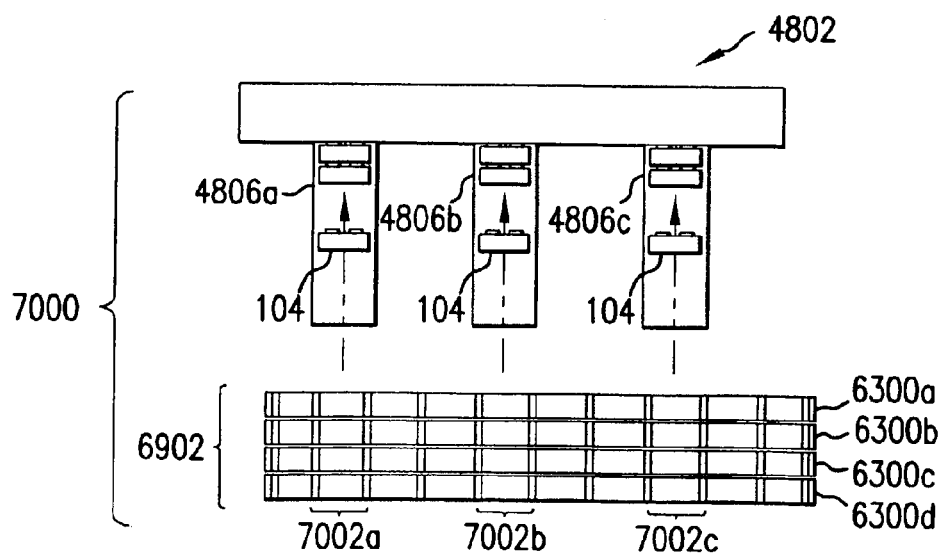
FIG. 70 shows a block diagram of dies being transferred from a stack of die frames into a multi-barrel die transfer apparatus, according to an example embodiment of the present invention.

Further detail for an example embodiment of flowchart 6800 is shown in FIG. 68B. FIG. 68B will be described in relation to FIG. 70, for illustrative purposes. FIG. 70 shows a system 7000 for transferring dies from a die frame 6300 using a multi-barrel die transfer apparatus 4802, according to an embodiment of the present invention. As shown in FIG. 70, multi-barrel die transfer apparatus 4802 includes a plurality of barrels 4806*a–c*. Furthermore, system 7000 includes a stack 6902 of die frames 6300 which includes first, second, third, and fourth die frames 6300*a–d*. Stack 6902 may include any number of die frames 6300.

In step 6802, a stack of die frames is formed, each die frame including a grid having a plurality of rectangular openings, wherein each opening of the plurality of rectangular openings removably holds a die, wherein corresponding openings of the die frames in the stack are aligned in a column. As shown in FIG. 70, for example, the die frames 6300*a–d* of die frame stack 6902 are aligned such that a plurality of columns 7002 are formed. Each column 7002 includes a die removably held in an opening in each of die frames 6300*a–d*.

In step 6812, each hollow barrel of a plurality of hollow barrels is applied to a respective column of openings of the stack of die frames. For example, as shown in FIG. 70, a first column 7002*a* has first barrel 4806*a* applied thereto, a second column 7002*b* has second barrel 4806*b* applied thereto, and a third column 7002*c* has a third barrel 4806*c* applied thereto.

In step 6814, dies removably held in the openings of the respective column of openings are caused to move into each hollow barrel in parallel. As shown in FIG. 70, dies 104 that were removably held in die frames 6300*a*–6300*d* are caused to move into barrels 4806. Dies 104 may be caused to move into the hollow barrels 4806 by vacuum, by gas pressure, by mechanical means, or other means described elsewhere herein or otherwise known.

In step 6816, steps 6812 and 6814 are repeated until each hollow barrel contains a stack of dies of a predetermined number. For example, steps 6812 and 6814 may be repeated until one or more of barrels 4806*a–c* become full, until stack 6902 is depleted of dies, or when an arbitrary number of dies 104 have been moved from stack 6902.

In step 6818, a die from each hollow barrel is deposited onto the surface until the stack of dies contained by each hollow barrel is substantially depleted. Thus, dies 104 from hollow barrels 4806 may be deposited onto the destination or target surface, until the dies 104 in hollow barrels 4806 are depleted, or until the surface is full of dies 104, or until an arbitrary number of dies 104 have been transferred. As described above, dies 104 may be deposited from hollow barrels 4806 by mechanical means, by vacuum, by gas pressure or by other means described elsewhere herein or otherwise known.

Hence, die frame 6300 may be used in a variety of ways to transfer dies to a target surface. Furthermore, die frame 6300 may be combined with any of the other die transfer mechanisms and processes described elsewhere herein to provide for enhanced die transfer mechanisms and processes.

2.2 Post Processing

As described herein with reference to FIG. 3, in step 310, post processing is performed to complete assembly of RFID tag(s) 100.

Figure 54:
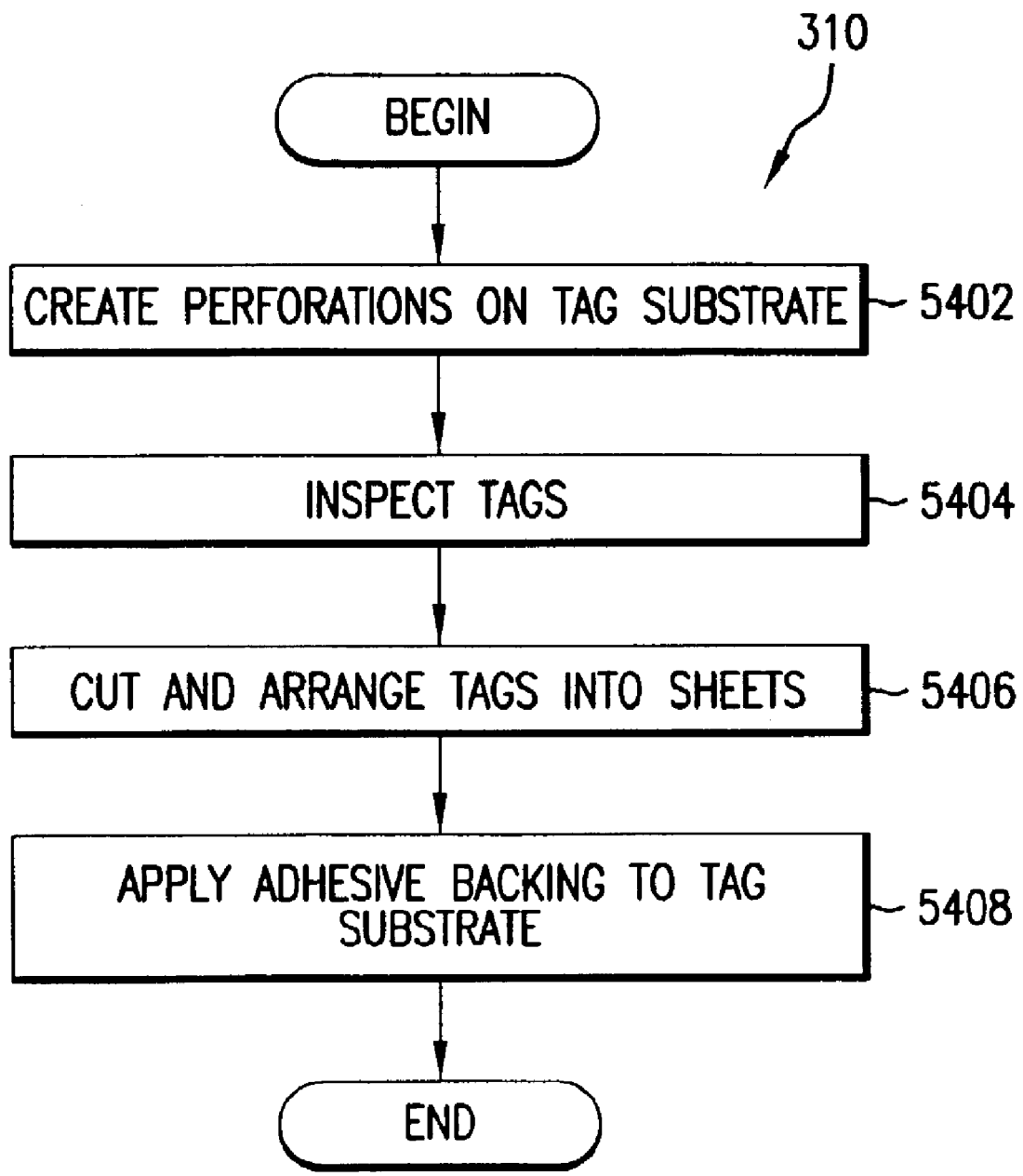
FIG. 54 is a flowchart illustrating a post processing operation.

FIG. 54 is a flowchart illustrating a performance of step 310 in greater detail. This operation begins with a step 5402, where perforations are made on tag substrate 116 between tags 100. These perforations enable users to separate tags 100 for individual placement on various objects.

In step, 5404, each tag 100 is inspected to ensure proper assembly. This step comprises ensuring proper placement of related electronics 106 and die 104.

In step 5406, continuous roll(s) of tags 100 are cut and arranged into sheets.

In step 5408, an adhesive backing is applied to tag substrate 116. This adhesive backing is enables tags 100 to be attached to objects, such as books and consumer products.

3.0 Tag Assembly Apparatuses

Figure 55:
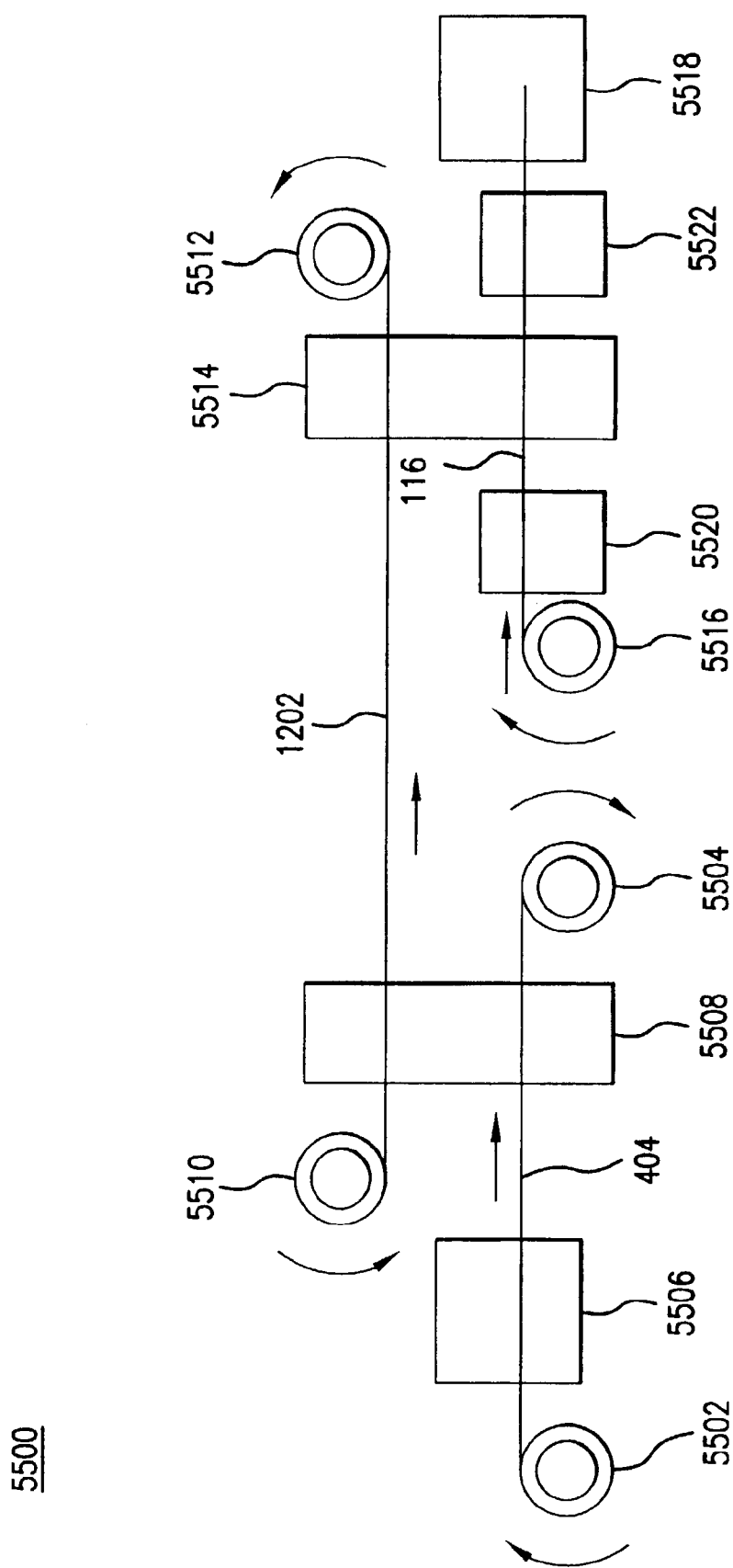
FIGS. 55 and 56 are block diagrams of tag assembly devices.
Figure 56:
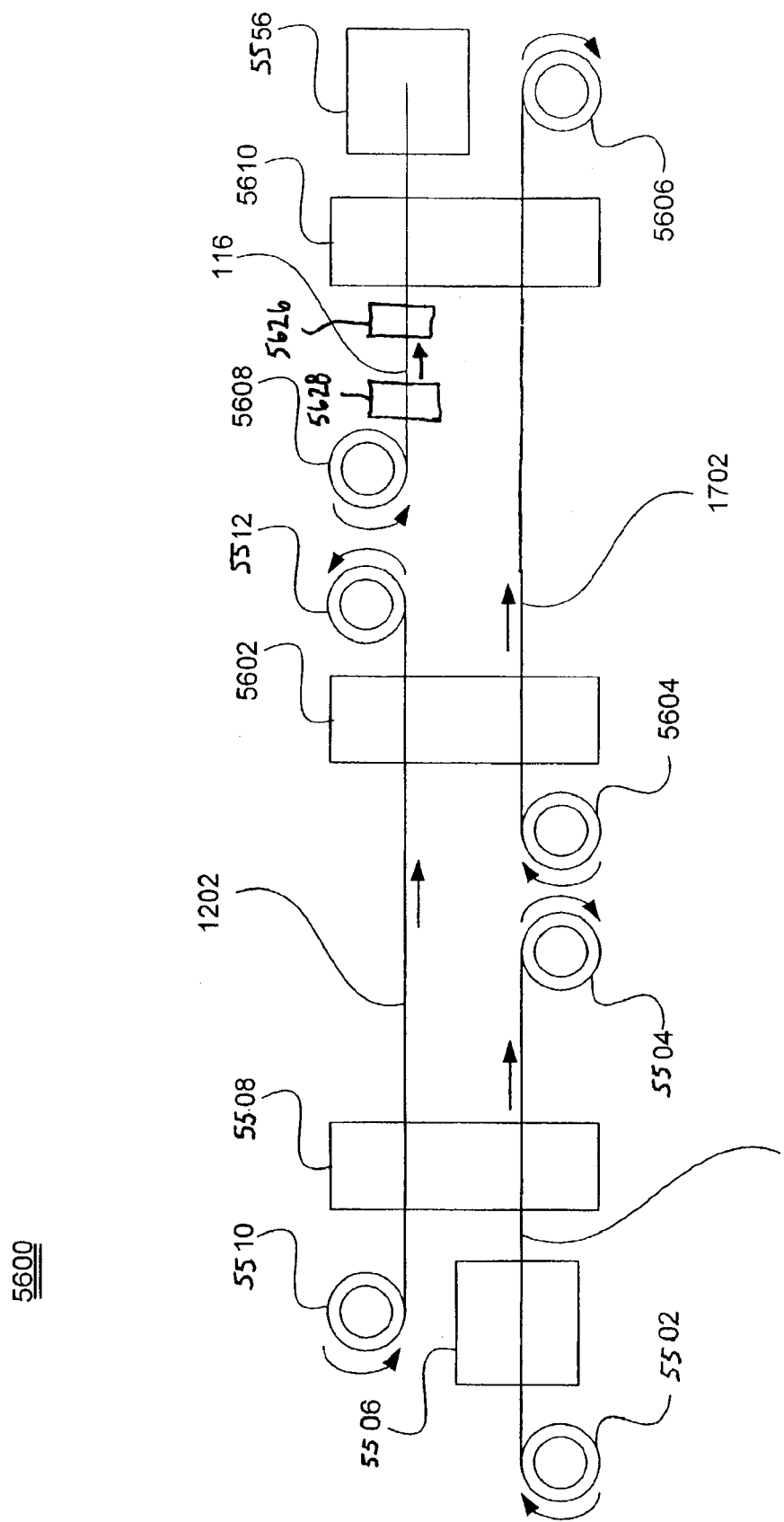

The present invention is also directed to a tag assembly apparatus. FIGS. 55 and 56 are block diagrams of two tag assembly apparatuses that employ the techniques described herein.

3.1 "Pads Up" Assembly Apparatus

FIG. 55 illustrates a "pads up" assembly apparatus 5500. Assembly apparatus 5500 assembles tags in a "pads up" manner, as described herein. Thus, assembly apparatus 5500 performs the steps as described herein with reference to FIGS. 3 and 11.

Assembly apparatus 5500 includes a support surface supplier 5502, a support surface collector 5504, a wafer preparation module 5506, a first die transfer module 5508, a transfer surface supplier 5510, a transfer surface collector 5512, a second die transfer module 5514, a tag substrate supplier 5516, a post processing module 5518, an adhesive application module 5520, and a printing module 5522.

Support surface supplier 5502 and support surface collector 5504 convey support surface 404 in a direction, as indicated by the arrows in FIG. 55. These elements are spools. However, other suitable means of conveyance can be used.

Wafer preparation module 5506 performs steps 304 and 306. Thus, wafer preparation module 5506 applies wafer 400 to support surface 404. In addition, wafer preparation module 5506 separates the plurality of dies 104 on wafer 400. Wafer preparation module 5506 is implemented with suitable mechanisms and scribing implements, such as laser (s).

First die transfer module 5508 transfers die(s) 104 from support surface 404 to transfer surface 1202. That is, first die transfer module 5508 performs step 1102. Accordingly, first die transfer module 5508 includes piston(s), roller(s), air jet(s), and/or punching devices. First die transfer module 5508 also includes element(s) for releasing die(s) 104 from support surface 404, such as heating components and/or radiation devices.

Transfer surface supplier 5510 and transfer surface collector 5512 convey transfer surface 1202 in a direction, as indicated by the arrows in FIG. 55. These elements are spools. However, other suitable means of conveyance can be used.

Second die transfer module 5514 transfers die(s) 104 from transfer surface 1202 to tag substrate 116. Thus, second die transfer module 5514 performs step 1106. Accordingly, second die transfer module 5514 includes piston(s), roller(s), air jet(s), and/or punching devices. Second die transfer module 5514 also includes element(s) for releasing die(s) 104 from support surface 404, such as heating components and/or radiation devices.

Tag substrate supplier 5516 conveys tag substrate 116 towards post processing module 5518, as indicated by the arrows in FIG. 55. Tag substrate supplier 5516 includes roller(s). However, other suitable means of conveyance can be used.

Post processing module 5518 performs the post processing operations described herein with reference to step 310.

Adhesive application module 5520 applies adhesive to tag substrate 116, pursuant to step 1104. To perform this step, adhesive application module 5520 includes a sprayer. However, adhesive application module 5520 can employ other suitable devices to perform this step.

Printing and overcoating module 5522 prints related electronics 106 and applies an overcoating onto tag substrate 116, pursuant to steps 1108 and 1110. Thus, printing and overcoating module 5522 includes screen printing component(s) and sprayer(s). However, printing and overcoating module 5522 can employ other suitable devices, such as an ink jets, thermal spray equipment, and/or oblation devices.

3.2 "Pads Down" Assembly Apparatus

FIG. 56 illustrates a "pads down" assembly apparatus 5600. Assembly apparatus 5600 assembles tags in a "pads down" manner, as described herein. Thus, assembly apparatus performs the steps as described herein with reference to FIGS. 3 and 16.

Assembly apparatus 5600 includes a support surface supplier 5502, a support surface collector 5504, a wafer preparation module 5506, a first die transfer module 5508, a first transfer surface supplier 5510, a first transfer surface collector 5512, a second die transfer module 5602, a second transfer surface supplier 5604, a second transfer surface collector 5606, a tag substrate supplier 5608, a third die transfer module 5610, a post processing module 5556, an adhesive application module 5626, and a printing module 5628.

Support surface supplier 5502 and support surface collector 5504 convey support surface 404 in a direction, as indicated by the arrows in FIG. 56. These elements are spools. However, other suitable means of conveyance can be used.

Wafer preparation module 5506 performs steps 304 and 306. Thus, wafer preparation module 5506 applies wafer 400 to support surface 404. In addition, wafer preparation module 5506 separates the plurality of dies 104 on wafer 400. Wafer preparation module 5506 is implemented with suitable mechanisms and scribing implements, such as laser(s).

First die transfer module 5508 transfers die(s) 104 from support surface 404 to transfer surface 1202. That is, first die transfer module 5508 performs step 1620. Accordingly, first die transfer module 5508 includes piston(s), roller(s), air jet(s), and/or punching devices. First die transfer module 5508 also includes element(s) for releasing die(s) 104 from support surface 404, such as heating components and/or radiation devices.

First transfer surface supplier 5510 and first transfer surface collector 5512 convey transfer surface 1202 in a direction, as indicated by the arrows in FIG. 56. These elements are spools. However, other suitable means of conveyance can be used.

Second die transfer module 5602 transfers die(s) 104 from transfer surface 1202 to secondary transfer surface 1702. Thus, second die transfer module 5602 performs step 1622. Accordingly, second die transfer module 5602 includes piston(s), roller(s), air jet(s), and/or punching devices. Second die transfer module 5602 also includes element(s) for releasing die(s) 104 from transfer surface 1202, such as heating components and/or radiation devices.

Second transfer surface supplier 5604 and second transfer surface collector 5606 convey secondary transfer surface 1702 in a direction, as indicated by the arrows in FIG. 56. These elements are spools. However, other suitable means of conveyance can be used.

Tag substrate supplier 5608 conveys tag substrate 116 towards post processing module 5556, as indicated by the arrows in FIG. 56. Tag substrate supplier 5608 includes roller(s). However, other suitable means of conveyance can be used.

Third die transfer module 5610 transfers die(s) 104 from secondary transfer surface 1702 to tag substrate 116. Thus, second die transfer module 5610 performs step 1608. Accordingly, second die transfer module 5610 includes piston(s), roller(s), air jet(s), and/or punching devices. Second die transfer module 5610 also includes element(s) for releasing die(s) 104 from secondary transfer surface 1702, such as heating components and/or radiation devices.

Post processing module 5556 performs the post processing operations described herein with reference to step 310.

Adhesive application module 5626 applies adhesive to tag substrate 116, pursuant to step 1606. To perform this step, adhesive application module 5626 includes a sprayer. However, adhesive application module 5626 can employ other suitable devices to perform this step.

Printing module 5628 prints related electronics 106, pursuant to step 1606. Thus, printing module 5628 includes screen printing component(s) and sprayer(s). However, printing and overcoating module 5628 can employ other suitable devices, such as an ink jets, thermal spray equipment, and/or oblation devices.

Note that "pads down" assembly apparatus 5600, and other assembly apparatuses described herein, may also be adapted to transfer dies directly from a support surface to a substrate, as would be understood by persons skilled in the relevant art(s) from the teachings herein.

4.0 Conclusion

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method for forming a die frame, comprising:
    (a) forming a ring shaped groove in a first surface of a wafer around a plurality of dies formed in the first surface of the wafer;

(b) scribing the first surface of the wafer to form a grid of grooves in the first surface of the wafer that separates the plurality of dies, wherein the grid intersects with the ring shaped groove;

(c) applying a solidifiable material to the first surface of the wafer to substantially fill the ring shaped groove and the grooves of the grid;

(d) causing the solidifiable material to harden into a ring shaped hardened material in the ring shaped groove and into a grid shaped hardened material in the grooves of the grid; and (e) thinning the wafer so that the grid shaped hardened material removably holds the plurality of dies such that the grid shaped hardened material remains substantially intact as the plurality of dies are removed.

2. The method of claim 1, further comprising:

(f) before step (b), applying a layer of a protective material on the first surface of the wafer.

3. The method of claim 2, further comprising:

(g) after step (d), removing the protective material from the first surface of the wafer to remove at least some excess solidifiable material.

4. The method of claim 3, wherein step (g) comprises: dissolving the protective material in a solvent.

5. The method of claim 2, wherein step (f) comprises: spin coating the layer of protective material on the first surface of the wafer.

6. The method of claim 2, wherein the protective material is a photo resist material, wherein step (f) comprises:

applying the photo-resist material on the first surface of the wafer.

7. The method of claim 2, wherein step (f) comprises: scribing the first surface of the wafer to a desired depth.

8. The method of claim 2, wherein the solidifiable material is a polymer, wherein step (c) comprises:

applying the polymer to the first surface of the wafer to substantially fill the ring shaped groove and the grooves of the grid.

9. The method of claim 2, wherein the solidifiable material is a curable material, wherein step (d) comprises:

curing the curable material.

10. A die frame formed according to the method of claim 1.

11. A method for assembling a plurality of radio frequency identification (RFID) tags, comprising:

(a) positioning a die frame closely adjacent to a surface of a substrate tape that includes a plurality of substrates such that a die of a plurality of dies removably held in the die frame is closely adjacent to a corresponding substrate of the plurality of substrates of the substrate tape, wherein the die frame comprises a grid shaped hardened material that removably holds the plurality of dies; and (b) transferring the die onto the closely adjacent corresponding substrate from the die frame in a manner such that the die frame remains substantially intact.

12. The method of claim 11, further comprising:

(c) incrementing the substrate tape;

(d) positioning the die frame closely adjacent to the surface of the substrate tape such that another die of a plurality of dies removably held in the die frame is closely adjacent to a next corresponding substrate of the plurality of substrates of the substrate tape; and (e) transferring the another die onto the closely adjacent next corresponding substrate from the die frame.

13. The method of claim 12, further comprising:

(f) repeating steps (c), (d), and (e).

14. The method of claim 12, further comprising:

(f) repeating steps (c), (d), and (e) until all dies of the plurality of dies removably held in the die frame have been transferred to a corresponding substrate of the substrate tape.

15. The method of claim 11, wherein step (b) comprises: punching the die onto the closely adjacent corresponding substrate from the die frame.

16. The method of claim 11, wherein step (a) comprises: positioning the die frame, wherein the die frame includes a grid having a plurality of rectangular openings, wherein each opening of the plurality of rectangular openings removably holds a die.

17. The method of claim 11, wherein step (b) comprises: applying gas pressure to move the die onto the closely adjacent corresponding substrate from the die frame.

18. A method for transferring a plurality of dies to a destination surface, comprising:

(a) forming a stack of die frames, each die frame including a grid having a plurality of rectangular openings, wherein each opening of the plurality of rectangular openings removably holds a die, wherein corresponding rectangular openings of the die frames in the stack are aligned in a column to form a plurality of columns of openings; and (b) transferring a die removably held in an opening from at least one column of the plurality of columns to the destination surface.

19. The method of claim 18, wherein step (b) comprises:

(1) applying a punching member to a first column of openings of the plurality of columns of openings of the stack of die frames; and (2) punching with the punching member so that a die removably held in a rectangular opening of the first column of openings is transferred to the destination surface.

20. The method of claim 19, wherein step (b) further comprises:

(3) repeating step (2) until the first column of openings is depleted of dies.

21. The method of claim 18, wherein step (b) comprises:

(1) applying each punching member of a plurality of punching members to a respective column of openings of the plurality of columns of openings of the stack of die frames; and (2) punching with each punching member of the plurality of punching members so that a die removably held in a rectangular opening of the respective column of openings is transferred to the destination surface.

22. The method of claim 21, wherein step (b) further comprises:

(3) repeating step (2) until the stack is substantially depleted of dies.

23. The method of claim 18, wherein step (b) comprises:

(1) applying a hollow barrel to a first column of openings of the plurality of columns of openings of the stack of die frames;

(2) causing dies removably held in the openings of the first column of openings to move into the hollow barrel;

(3) repeating steps (1) and (2) until the hollow barrel contains a stack of dies; and (4) depositing dies from the hollow barrel onto the destination surface until the stack of dies contained by the hollow barrel is depleted.

24. The method of claim 18, wherein step (b) comprises:
(1) applying in parallel each hollow barrel of a plurality of hollow barrels to a respective column of openings of the plurality of columns of openings of the stack of die frames;
(2) causing dies removably held in the openings of the respective column of openings to move into each hollow barrel in parallel;
(3) repeating steps (1) and (2) until each hollow barrel contains a stack of dies of a predetermined number; and
(4) depositing dies from each hollow barrel onto the destination surface until the stack of dies contained by each hollow barrel is substantially depleted.

25. The method of claim 18, wherein the destination surface is an intermediate surface, wherein step (b) comprises:
transferring a die removably held in an opening from at least one column of the plurality of columns to the intermediate surface.

26. The method of claim 18, wherein the destination surface is a substrate, wherein step (b) comprises:
transferring a die removably held in an opening from at least one column of the plurality of columns to the substrate.

27. The method of claim 26, wherein the substrate includes a plurality of antenna substrates, wherein step (b) comprises:
transferring a die removably held in an opening from at least one column of the plurality of columns onto a corresponding antenna substrate of the plurality of antenna substrates.

28. The method of claim 18, wherein each die has at least one contact pad located on a first surface of the die, wherein step (b) comprises:
transferring a die removably held in an opening from at least one column of the plurality of columns to the destination surface so that the at least one contact pad is in contact with the destination surface.

29. The method of claim 18, wherein each die has at least one contact pad located on a first surface of the die, wherein step (b) comprises:
transferring a die removably held in an opening from at least one column of the plurality of columns to the destination surface so that the at least one contact pad faces away from the destination surface.

30. The method of claim 18, further comprising:
(c) prior to step (b), inserting the stack of die frames in a die-deposition apparatus.

31. A die frame apparatus, comprising:
a grid having a plurality of rectangular openings therethrough; and
a plurality of dies, wherein each opening of the plurality of rectangular openings removably holds a corresponding die of said plurality of dies,
whereby the grid remains substantially intact as the plurality of dies are removed from the grid.

32. The apparatus of claim 31, further comprising:
a ring attached around said grid.

33. The apparatus of claim 32, further comprising:
a holding mechanism that holds said ring and allows for positioning of said grid during a transfer of said plurality of dies from said plurality of rectangular openings.

34. The apparatus of claim 33, wherein said grid is substantially planar, and wherein said grid has a thickness substantially equal to a thickness of a die of said plurality of dies.

35. The apparatus of claim 31, wherein said grid comprises a polymer.

36. The apparatus of claim 31, wherein said grid comprises at least one of an epoxy, a resin, a urethane, and a glass.

37. The apparatus of claim 31, wherein said grid is formed around said plurality of dies while said plurality of dies reside in a wafer.

38. A method for forming a die frame, comprising:
(a) scribing a wafer attached to an adhesive surface such that a resulting plurality of dies are separated by a grid of grooves that extend through the wafer to the adhesive surface;
(b) applying a solidifiable material to the scribed wafer to substantially fill the grooves of the grid;
(c) causing the solidifiable material to harden into a grid shaped hardened material in the grooves of the grid; and
(d) removing the adhesive surface so that the grid shaped hardened material removably holds the plurality of dies such that the arid shaved hardened material remains substantially intact as the plurality of dies are removed from the grid shaped hardened material.

39. The method of claim 38, further comprising:
(e) prior to step (b), holding the adhesive surface with a support structure.

40. The method of claim 39, wherein step (b) comprises:
substantially filling a space between an outer edge of the scribed wafer and an inner edge of the support structure with the solidifiable material.

41. The method of claim 40, wherein step (c) comprises:
causing the solidifiable material in the space to harden into a ring shaped hardened material that supports the grid shaped hardened material within.

42. A method for forming a die frame, comprising:
(a) applying a layer of a protective material on a first surface of a wafer;
(b) forming a ring shaped groove in the first surface of the wafer around a plurality of dies formed in the first surface of the wafer;
(c) scribing the first surface of the wafer to form a grid of grooves in the first surface of the wafer that separates the plurality of dies, wherein the grid intersects with the ring shaped groove;
(d) applying a solidifiable material to the first surface of the wafer to substantially fill the ring shaped groove and the grooves of the grid;
(e) causing the solidifiable material to harden into a ring shaped hardened material in the ring shaped groove and into a grid shaped hardened material in the grooves of the grid;
(f) removing the protective material from the first surface of the wafer to remove at least some excess solidifiable material; and
(g) thinning the wafer so that the grid shaped hardened material removably holds the plurality of dies.

43. The method of claim 42, wherein step (f) comprises:
dissolving the protective material in a solvent.

* * * * *

UNITED STATES PATENT AND TRADEMARK OFFICE
CERTIFICATE OF CORRECTION

| | |
|---|---|
| PATENT NO. | : 7,102,524 B2 |
| APPLICATION NO. | : 10/322701 |
| DATED | : September 5, 2006 |
| INVENTOR(S) | : Arneson et al. |

It is certified that error appears in the above-identified patent and that said Letters Patent is hereby corrected as shown below:

Column 1
In line 15 "Ser. No. 10/322,467;" should be replaced with --Ser. No. 10/322,467 filed on 19 December, 2002;--.

Column 1
In line 17 "Ser. No. 10/322,718;" should be replaced with --Ser. No. 10/322,718 filed on 19 December, 2002, now U.S. Patent No. 6,915,551;--.

Column 1
In line 19 "Ser. No. 10/322,702;" should be replaced with --Ser. No. 10/322,702 filed on 19 December, 2002, now U.S. Patent No. 6,848,162;--.

Column 36
In line 26, claim 38, "such that the arid shaved hardened" should be replaced with --such that the grid shaped hardened--.

Signed and Sealed this

Nineteenth Day of December, 2006

JON W. DUDAS
*Director of the United States Patent and Trademark Office*